(12) United States Patent
Yang et al.

(10) Patent No.: US 10,970,425 B2
(45) Date of Patent: Apr. 6, 2021

(54) OBJECT DETECTION AND TRACKING

(71) Applicant: SEIKO EPSON CORPORATION, Tokyo (JP)

(72) Inventors: Yang Yang, Richmond Hill (CA); Ivo Moravec, Richmond Hill (CA)

(73) Assignee: SEIKO EPSON CORPORATION, Tokyo (JP)

( * ) Notice: Subject to any disclaimer, the term of this patent is extended or adjusted under 35 U.S.C. 154(b) by 559 days.

(21) Appl. No.: 15/854,277

(22) Filed: Dec. 26, 2017

(65) Prior Publication Data

US 2019/0197196 A1 Jun. 27, 2019

(51) Int. Cl.
*G06K 9/00* (2006.01)
*G06F 30/00* (2020.01)
*G02B 27/01* (2006.01)
*G06T 17/05* (2011.01)
*H04N 13/332* (2018.01)
*G06T 7/73* (2017.01)
*G06T 17/00* (2006.01)
*G06F 3/0481* (2013.01)
*G06K 9/46* (2006.01)

(52) U.S. Cl.
CPC ........... *G06F 30/00* (2020.01); *G02B 27/017* (2013.01); *G06K 9/00214* (2013.01); *G06T 7/75* (2017.01); *G06T 17/05* (2013.01); *H04N 13/332* (2018.05); *G06F 3/04815* (2013.01); *G06K 9/00201* (2013.01); *G06K 9/4604* (2013.01); *G06T 17/00* (2013.01); *G06T 2207/30164* (2013.01)

(58) Field of Classification Search
None
See application file for complete search history.

(56) References Cited

U.S. PATENT DOCUMENTS

| 7,889,193 | B2 | 2/2011 | Platonov et al. |
| 8,860,760 | B2* | 10/2014 | Chen ............... G09G 5/397 345/633 |
| 9,013,617 | B2 | 4/2015 | Ramachandran et al. |
| 9,024,972 | B1* | 5/2015 | Bronder ............... G06T 19/006 345/633 |
| 9,111,347 | B2 | 8/2015 | Ben Himane |
| 9,652,031 | B1* | 5/2017 | Savastinuk ............ G06F 3/011 |

(Continued)

FOREIGN PATENT DOCUMENTS

JP 2013-050947 A 3/2013

OTHER PUBLICATIONS

Sep. 19, 2018 Office Action issued in U.S. Appl. No. 15/937,229.

(Continued)

*Primary Examiner* — Kibrom K Gebresilassie
(74) *Attorney, Agent, or Firm* — Oliff PLC

(57) ABSTRACT

A method may include the following steps: acquiring, from a camera, an image frame; acquiring, from an inertial sensor, a sensor data sequence; tracking a first pose of an object in a real scene based at least on the image frame; deriving a sensor pose of an inertial sensor based on the sensor data sequence; determining whether the first pose is lost; retrieving from one or more memories, or generating from a 3D model stored in one or more memories, a training template corresponding to a view that is based on the sensor pose obtained on or after the first pose is lost; and deriving a second pose of the object using the training template.

20 Claims, 34 Drawing Sheets

(56) References Cited

U.S. PATENT DOCUMENTS

| | | | |
|---|---|---|---|
| 9,888,235 B2* | 2/2018 | Meier | G06T 7/73 |
| 9,911,395 B1* | 3/2018 | Townsend | G06F 1/1686 |
| 10,417,781 B1* | 9/2019 | Konolige | G06T 7/60 |
| 2003/0035098 A1 | 2/2003 | Ishiyama | |
| 2007/0213128 A1 | 9/2007 | Ohta | |
| 2008/0310757 A1 | 12/2008 | Wolberg et al. | |
| 2009/0096790 A1 | 4/2009 | Wiedemann et al. | |
| 2009/0323121 A1* | 12/2009 | Valkenburg | G01C 15/002 358/1.18 |
| 2010/0158310 A1* | 6/2010 | McQueen | G06K 9/00 382/100 |
| 2010/0289797 A1 | 11/2010 | Tateno et al. | |
| 2012/0268567 A1 | 10/2012 | Nakazato et al. | |
| 2013/0051626 A1 | 2/2013 | Abadpour et al. | |
| 2014/0037140 A1* | 2/2014 | Benhimane | G06K 9/6211 382/103 |
| 2014/0267405 A1* | 9/2014 | Mullins | G06Q 30/02 345/633 |
| 2014/0300775 A1* | 10/2014 | Fan | H04N 1/32128 348/231.3 |
| 2015/0146926 A1* | 5/2015 | Ramachandran | G06K 9/00624 382/103 |
| 2015/0243031 A1 | 8/2015 | Narasimha et al. | |
| 2015/0317821 A1 | 11/2015 | Ding et al. | |
| 2016/0012593 A1* | 1/2016 | Chao | G06T 7/73 382/209 |
| 2016/0187970 A1 | 6/2016 | Ashforth et al. | |
| 2016/0282619 A1* | 9/2016 | Oto | G06F 3/012 |
| 2016/0292883 A1* | 10/2016 | Comport | G06T 7/74 |
| 2016/0292889 A1* | 10/2016 | Niwayama | G06T 7/75 |
| 2016/0371559 A1* | 12/2016 | Yang | G06T 7/73 |
| 2017/0018121 A1* | 1/2017 | Lawson | G06T 17/00 |
| 2017/0045736 A1* | 2/2017 | Fu | G02B 27/017 |
| 2017/0228940 A1* | 8/2017 | Kutliroff | G06T 7/12 |
| 2017/0337749 A1* | 11/2017 | Nerurkar | G06F 3/011 |
| 2018/0005034 A1 | 1/2018 | Kaehler et al. | |
| 2018/0113505 A1 | 4/2018 | Choi et al. | |
| 2018/0137651 A1* | 5/2018 | Levinshtein | G06T 7/75 |
| 2018/0144458 A1* | 5/2018 | Xu | G06T 7/70 |
| 2018/0157344 A1 | 6/2018 | Toff | |
| 2018/0314416 A1 | 11/2018 | Powderly et al. | |
| 2019/0155296 A1* | 5/2019 | Moore | G05D 1/0234 |
| 2019/0228263 A1* | 7/2019 | Szeto | G06K 9/00671 |
| 2019/0272670 A1* | 9/2019 | Tagliasacchi | G06K 9/00355 |
| 2019/0370997 A1* | 12/2019 | Hou | B60W 30/10 |

OTHER PUBLICATIONS

Mar. 4, 2019 Office Action issued in U.S. Appl. No. 15/451,062.

Hinterstoisser, Stefan et al. "Gradient Response Maps for Real-Time Detection of Texture-Less Objects". IEEE Transactions on Pattern Analysis and Machine Intelligence, pp. 1-14.

You et al; "Hybrid Inertial and Vision Tracking for Augmented Reality Registration;" Virtual Reality, 1999; Proceedings., IEEE, Date of Conference: Mar. 13-17, 1999; DOI: 10.1109/VR.1999.756960; 8 pp.

Azuma et al; "A Survey of Augmented Reality;" Presence: Teleoperators and Virtual Environments; vol. 6; No. 4; Aug. 1997; pp. 355-385.

Ligorio et al; "Extended Kalman Filter-Based Methods for Pose Estimation Using Visual, Inertial and Magnetic Sensors: Comparative Analysis and Performance Evaluation;" Sensors; 2013; vol. 13; DOI: 10.3390/s130201919; pp. 1919-1941.

U.S. Appl. No. 15/451,062, filed Mar. 6, 2017 in the name of Alex Levinshtein et al.

U.S. Appl. No. 15/625,174, filed Jun. 16, 2017 in the name of Yang Yang et al.

Aug. 30, 2017 Search Report issued in European Patent Application No. 17163433.0.

Ulrich et al; "CAD-Based Recognition of 3D Objects in Monocular Images;" 2009 IEEE Conference on Robotics and Automation; XP031509745; May 12, 2009; pp. 1191-1198.

U.S. Appl. No. 15/937,229, filed Mar. 27, 2018 in the name of Tong Qiu et al.

Jul. 25, 2019 Office Action issued in U.S. Appl. No. 15/625,174.

* cited by examiner

OBJECT DETECTION AND TRACKING

BACKGROUND

1. Technical Field

Embodiments of the present invention relate to a technique of an information processing device which processes information regarding a three-dimensional model of a target object using a camera and a motion sensor (e.g., an inertial sensor).

2. Related Art

Method of estimating a pose of an object imaged by a camera are disclosed in JP-A-2013-50947, which discloses a technique in which a binary mask of an input image including an image of an object is created, singlets as points in inner and outer contours of the object are extracted from the binary mask, and sets of the singlets are connected to each other so as to form a mesh represented as a duplex matrix so that a pose of the object is estimated.

However, the prior art, such as JP-A-2013-50947, only use a camera to estimate the pose. However, a camera has latency, which increases as the motion or velocity of the user's head increases.

Moreover, accurate and quick object detection is useful in a variety of engineering and scientific disciplines such as computer vision, artificial intelligence, and biometrics. For example, in the many industrial settings today, robots are used for parts assembly and manufacturing. These robots are equipped with one or more cameras, e.g., CCD or CMOS, which give them vision. Often, objects (i.e., parts) are contained in a bin. The robot must recognize the object/part in the bin so it can pick it up to assemble the product.

SUMMARY

Once an object is detected, it may be tracked and the object can be in any number of poses (position, orientation, rotation). Sometimes, while tracking an object at a different poses and views, the object can become lost to the camera and thus, the system would then need to reinitialize object detection so that tracking of the object can continue. However, it may take considerable processing time for current systems to initialize/re-initialize the object detection especially when the tracking gets lost in other views, since the systems need to search for the closest limited views from among all views of the trained data. This is not convenient to the user, and it degrades the user experience.

Embodiments of the present application disclose systems with a camera, and systems with a camera. In order to improve the user experience, embodiments of the present disclosure are directed to re-initializing the object in any view when tracking fails by a combination of an inertial sensor (IMU) and object detection and pose estimation (ODPE) vision module.

An advantage of some aspects of the invention is to solve at least a part of the problems described above, and aspects of the invention can be implemented as the following aspects.

(1) According to an aspect of the invention, a non-transitory computer readable medium is provided that embodies instructions that cause one or more processors to perform a method. The method may include the following steps: acquiring, from a camera, an image frame; acquiring, from an inertial sensor, a sensor data sequence; tracking a first pose of an object in a real scene based at least on the image frame; deriving a sensor pose of an inertial sensor based on the sensor data sequence; determining whether the first pose is lost; retrieving from one or more memories, or generating from a 3D model stored in one or more memories, a training template corresponding to a view that is based on the sensor pose obtained on or after the first pose is lost; and deriving a second pose of the object using the training template.

(2) According to another aspect of the invention, a method may include the following steps: acquiring, from a camera, an image frame; acquiring, from an inertial sensor, a sensor data sequence; tracking a first pose of an object in a real scene based at least on the image frame; deriving a sensor pose of an inertial sensor based on the sensor data sequence; determining whether the first pose is lost; retrieving from one or more memories, or generating from a 3D model stored in one or more memories, a training template corresponding to a view that is based on the sensor pose obtained on or after the first pose is lost; and deriving a second pose of the object using the training template.

(3) According to another aspect of the invention, a head-mounted display device may include a camera (which may include a depth sensor), an inertial sensor fixed or adjustably fixed with respect to the camera with a first spatial relationship; and a processor. The processor may be configured for: acquiring, from the camera, an image frame; acquiring, from the inertial sensor, a sensor data sequence; tracking a first pose of an object in a real scene based at least on the image frame; deriving a sensor pose of an inertial sensor based on the sensor data sequence; determining whether the first pose is lost; retrieving from one or more memories, or generating from a 3D model stored in one or more memories, a training template corresponding to a view that is based on the sensor pose obtained on or after the first pose is lost; and deriving a second pose of the object using the training template.

The invention may be implemented in ways/systems other than the method, head mounted display, and non-transitory computer readable medium. For example, the invention may be implemented in forms such as an information processing device, a display device, an information processing system, a computer program for realizing functions of the head mounted display, and data signals which include the computer program and are embodied in carrier waves.

BRIEF DESCRIPTION OF THE DRAWINGS

Aspects of the invention will be described with reference to the accompanying drawings, wherein like numbers reference like elements.

DESCRIPTION OF EXEMPLARY EMBODIMENTS

In the present specification, description will be made in order according to the following items.

A. First Embodiment
A-1. Configuration of information processing device
A-2. Creation of template (training)
A-2-1. Selection of 2D model point
A-2-2. Determination of 3D model point and creation of template
A-2-3. In-plane rotation optimization for training
A-2-4. Super-template
A-3. Configuration of head mounted display (HMD)
A-4. Execution of estimation of target object pose
A-4-1. Edge detection
A-4-2. Selection of template
A-4-3. 2D model point correspondences
A-4-4. Optimization of pose
A-4-5. Subpixel correspondences
B. Second Embodiment
C. Third Embodiment
D. Modification Examples
D-1. Modification Example 1
E. 3D Tracking Objects Using Fusing of Inertial Motion Sensor (IMU) and Camera Sensor
E-1. Introduction
E-2-1. Overview
E-2-1-1. System
E-2-1-2. Overview of Method of Sensor Fusion
E-2-2. Tracker Fusing IMU
E-2-2-1. Method of Fusing IMU with 3D Object Tracker
E-2-2-2. Initialize IMU Fusion
E-2-2-2-1 Detect Static Motion
E-2-2-3. IMU Pose Predication
E-2-2-4. IMU Divergence Determination
E-2-2-5. IMU Object Tracker
E-2-2-5-1. Detect static motion
E-2-2-5-2. Predict feature point location using IMU predicted pose/KLT matching using predicted feature location
E-2-2-5-3. Pose estimation using KLT matching results & IMU predicted pose
E-2-2-5-4. Pose refinement by edge alignment & IMU predicted pose
E-2-2-5-5. Outlier removal
E-2-2-6. Reinitialize IMU Fusion
E-2-2-7. Fuse IMU and Vision
E-2-2-8. Handle Vision Loss
E-2-3. Get Jitter Reduced IMU Pose
E-2-3-1. Detect static motion
E-2-3-2. Detect Motion Jitter
E-3. Experiment Results
E-3-1. Latency improvement E-3-2. Reduce Tracking Drift
E-3-3. Tolerate faster user motion
F. IMU Guided 360 Degree Object Detection and Pose Estimation
    F-1-1 Brief Overview
    F-1-2 Introduction/Background
    F-1-3 Overview of Method
    F-2 Offline Training
    F-3 Online Training

A. FIRST EMBODIMENT

A-1. Configuration of Information Processing Device

Figure 1:
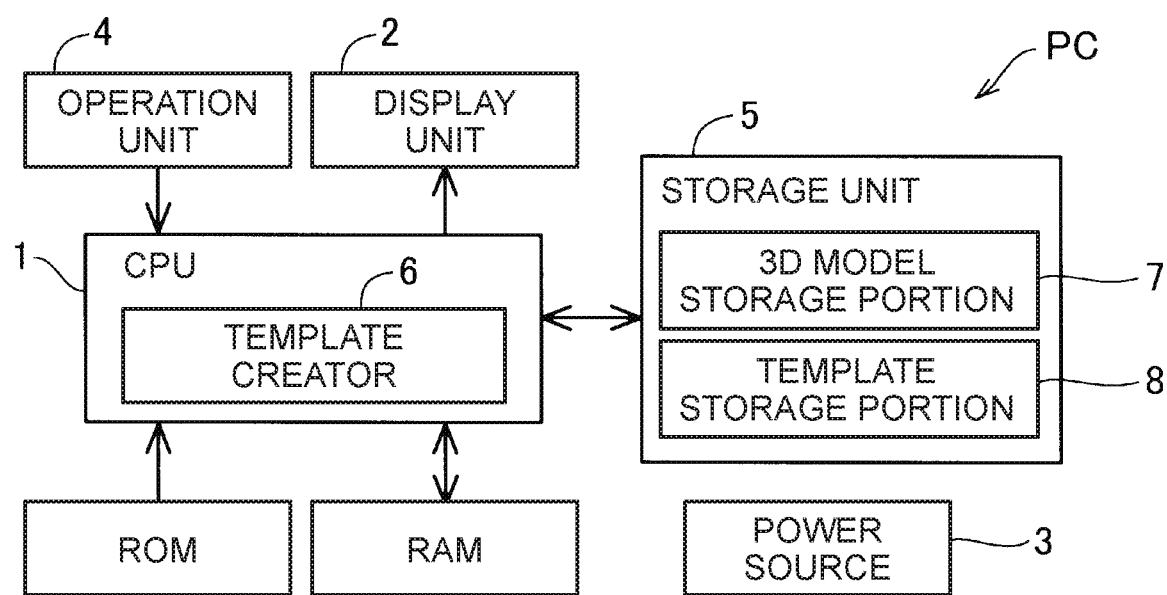
FIG. 1 is a block diagram illustrating a functional configuration of a personal computer as an information processing device in the present embodiment.

FIG. 1 is a block diagram illustrating a functional configuration of a personal computer PC as an information processing device in the present embodiment. The personal computer PC includes a CPU 1, a display unit 2, a power source 3, an operation unit 4, a storage unit 5, a ROM, and a RAM. The power source 3 supplies power to each unit of the personal computer PC. As the power source 3, for example, a secondary battery may be used. The operation unit 4 is a user interface (UI) for receiving an operation from a user. The operation unit 4 is constituted of a keyboard and a mouse.

The storage unit 5 stores various items of data, and is constituted of a hard disk drive and the like. The storage unit 5 includes a 3D model storage portion 7 and a template storage portion 8. The 3D model storage portion 7 stores a three-dimensional model of a target object, created by using computer-aided design (CAD) or through other 3D model reconstruction techniques. The template storage portion 8 stores a template created by a template creator 6. Details of the template created by the template creator 6 will be described later.

The CPU 1 reads various programs from the ROM and develops the programs in the RAM, so as to execute the various programs. The CPU 1 includes the template creator 6 which executes a program for creating a template. The template is defined as data in which, with respect to a single three-dimensional model (3D CAD in the present embodiment) stored in the 3D model storage portion 7, coordinate values of points (2D model points) included in a contour line (hereinafter, also simply referred to as a "contour") representing an exterior of a 2D model obtained by projecting the 3D model onto a virtual plane on the basis of a virtual specific viewpoint (hereinafter, also simply referred to as a "view"), 3D model points obtained by converting the 2D model points into points in an object coordinate system on the basis of the specific view, and the specific view are correlated with each other. The virtual viewpoint of the present embodiment is represented by a rigid body transformation matrix used for transformation from the object coordinate system into a virtual camera coordinate system and represented in the camera coordinate system, and a perspective projection transformation matrix for projecting three-dimensional coordinates onto coordinates on a virtual plane. The rigid body transformation matrix is expressed by a rotation matrix representing rotations around three axes which are orthogonal to each other, and a translation vector representing translations along the three axes. The perspective projection transformation matrix is appropriately adjusted so that the virtual plane corresponds to a display surface of a display device or an imaging surface of the camera. A CAD model may be used as the 3D model as described later. Hereinafter, performing rigid body transformation and perspective projection transformation on the basis of a view will be simply referred to as "projecting".

A-2. Creation of Template (Training)

Figure 2:
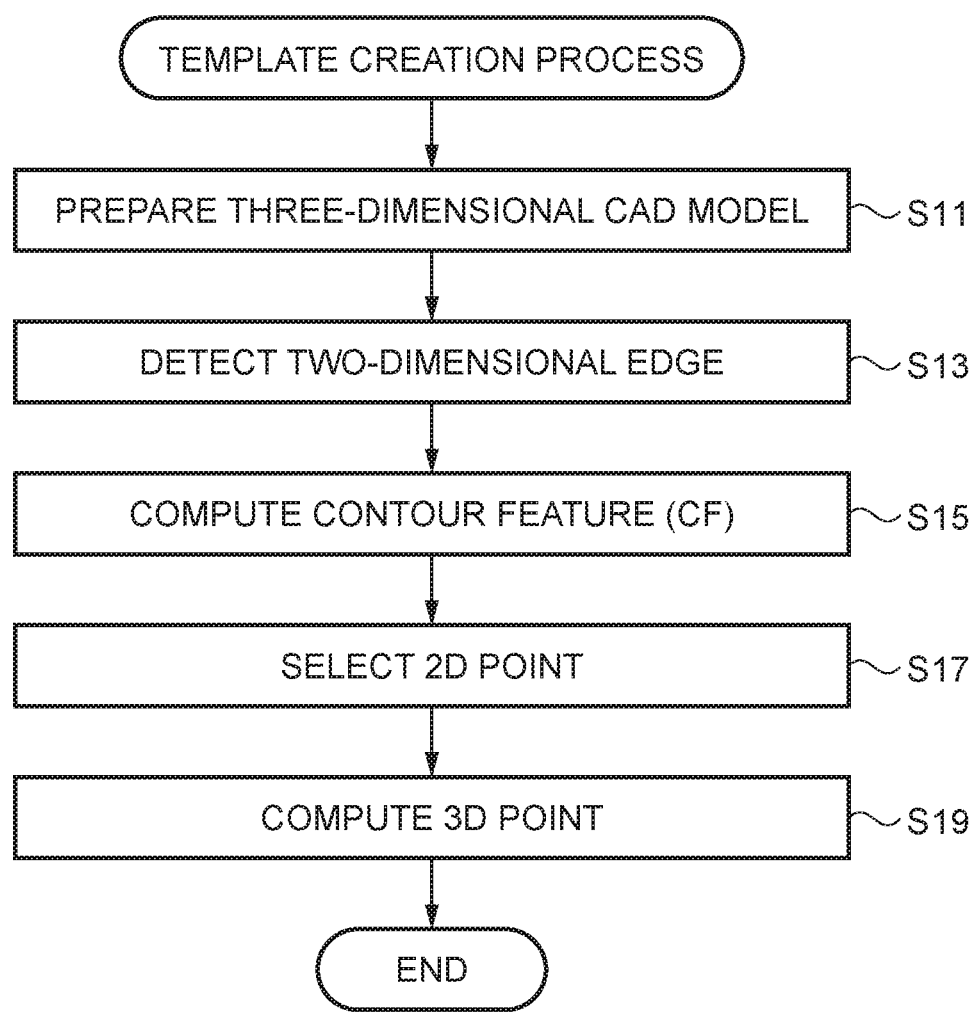
FIG. 2 is a flowchart illustrating a template creation process performed by a template creator, according to an embodiment.

FIG. 2 is a flowchart illustrating a template creation process performed by the template creator 6. The template creator 6 creates T templates obtained when a three-dimensional model for a target object stored in the 3D model storage portion 7 is viewed from T views. In the present embodiment, creation of a template will also be referred to as "training".

In the template creation process, first, the template creator 6 prepares a three-dimensional model stored in the 3D model storage portion 7 (step S11). Next, the template creator 6 renders CAD models by using all possible in-plane rotations (1, . . . , and P) for each of different t views, so as to obtain respective 2D models thereof. Each of the views is an example of a specific viewpoint in the SUMMARY. The template creator 6 performs edge detection on the respective 2D models so as to acquire edge features (step S13).

The template creator 6 computes contour features (CF) indicating a contour of the 2D model on the basis of the edge features for each of T (P×t) views (step S15). If a set of views which are sufficiently densely sampled is provided, a view having contour features that match image points which will be described later can be obtained. The 2D model points are points representing a contour of the 2D model on the virtual plane or points included in the contour. The template creator 6 selects representative 2D model points from among the 2D model points in the 2D contour with respect to each sample view as will be described in the next section, and computes descriptors of the selected features. The contour feature or the edge feature may also be referred to as a feature descriptor.

If computation of the contour features in the two dimensions is completed, the template creator 6 selects 2D contour features (step S17). Next, the template creator 6 computes 3D points having 3D coordinates in the object coordinate system corresponding to respective descriptors of the features (step S19).

A-2-1. Selection of 2D Model Points (Step S17)

The template creator 6 selects N points which are located at locations where the points have high luminance gradient values (hereinafter, also referred to as "the magnitude of gradient") in a scalar field and which are sufficiently separated from each other from among points disposed in the contour with respect to each sample view. Specifically, the template creator 6 selects a plurality of points which maximize a score expressed by the following Equation (1) from among all points having sufficient large magnitudes of gradient.

$$\sum_{i=1}^{N}\left[E_i \min_{j \neq i}\{D_{ij}^2\}\right] \quad (1)$$

In Equation (1), $E_i$ indicates a magnitude of gradient of a point i, and $D_{ij}$ indicates a distance between the point i and a point j. In the present embodiment, in order to maximize a score shown in Equation (1), first, the template creator 6 selects a point having the maximum magnitude of gradient as a first point. Next, the template creator 6 selects a second point which maximizes $E_2 D_{21}^2$. Next, the template creator 6 selects a third point which maximizes the following Equation (2). Then, the template creator 6 selects a fourth point, a fifth point, ..., and an N-th point.

$$E_3 \min_{j=\{1,2\}} \{D_{3,j}^2\} \tag{2}$$

Figure 3:
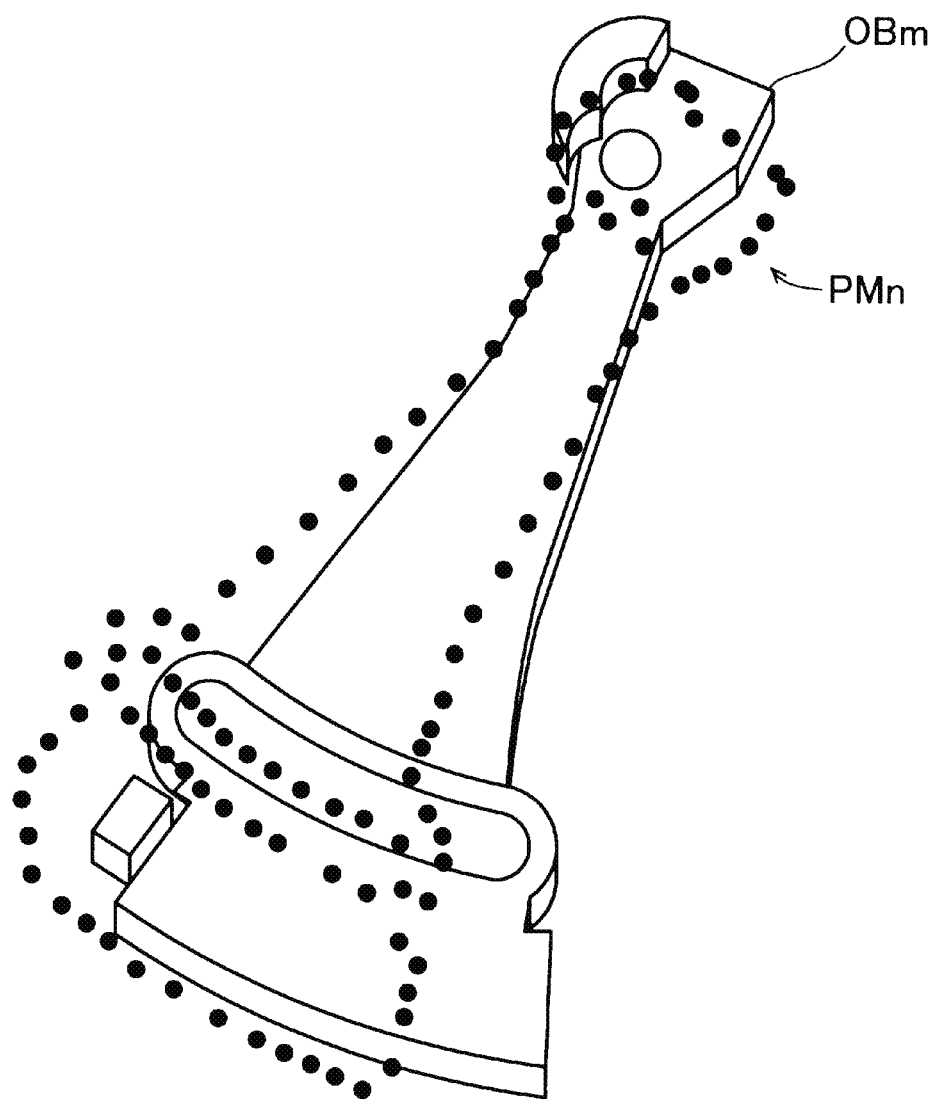
FIG. 3 is a diagram for explaining a set of N points in two dimensions representing a target object for a three-dimensional model, calculated by using Equation (1), according to an embodiment.

FIG. 3 is a diagram illustrating a set PMn of N 2D model points calculated by using Equation (1). In FIG. 3, the set PMn of 2D model points is displayed to overlap a captured image of a target object OBm. In order to differentiate the captured image of the target object OBm from the 2D model set PMn, a position of the target object OBm is deviated relative to the set PMn. As illustrated in FIG. 3, the set PMn of 2D model points which is a set of dots calculated by using Equation (1) is distributed so as to substantially match a contour of the captured image of the target object OBm. If the set PMn of 2D model points is calculated, the template creator 6 correlates a position, or location, of the 2D model point with gradient (vector) of luminance at the position, and stores the correlation result as a contour feature at the position.

A-2-2. Determination of 3D Model Point and Creation of Template (Steps S19)

The template creator 6 calculates 3D model points corresponding to the calculated set PMn of 2D model points. The combination of the 3D model points and contour features depends on views.

If a 2D model point and a view V are provided, the template creator 6 computes a 3D model point $P_{OBJ}$ by the following three steps.

1. A depth map of a 3D CAD model in the view V is drawn (rendered) on the virtual plane.
2. If a depth value of a 2D model point p is obtained, 3D model coordinates $P_{CAM}$ represented in the camera coordinate system are computed.
3. Inverse 3D transformation is performed on the view V, and coordinates $P_{OBJ}$ of a 3D model point in the object coordinate system (a coordinate system whose origin is fixed to the 3D model) are computed.

As a result of executing the above three steps, the template creator 6 creates, into a single template, a view matrix $V_t$ for each view t expressed by the following Expression (3), 3D model points in the object coordinate system associated with respective views expressed by the following Expression (4), and descriptors of 2D features (hereinafter, also referred to as contour features) corresponding to the 3D model points in the object coordinate system and associated with the respective views, expressed by the following Expression (5).

$$t \in \{1, \ldots, T\} \tag{3}$$

$$\{P_1, \ldots, P_N\}_t \tag{4}$$

$$\{CF_1, \ldots, CF_N\}_t \tag{5}$$

Figure 4:
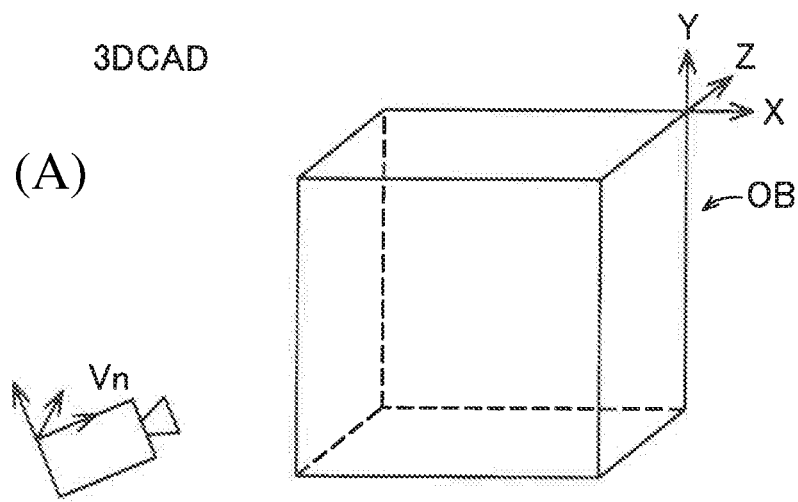
FIGS. 4A-4C are a schematic diagram illustrating a relationship among 3D CAD, a 2D model, and a 3D model created on the basis of the 2D model, according to an embodiment.
Figure 4:
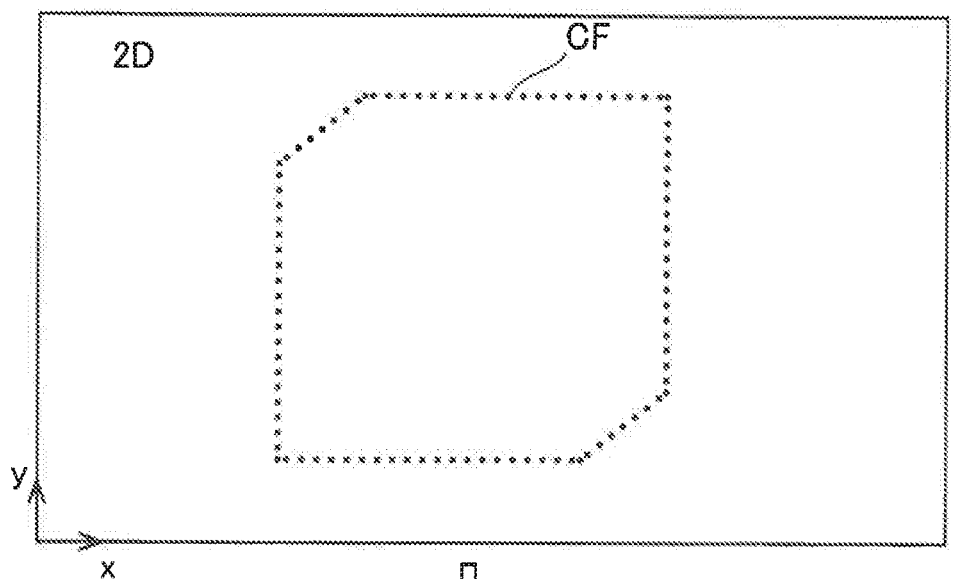
Figure 4:
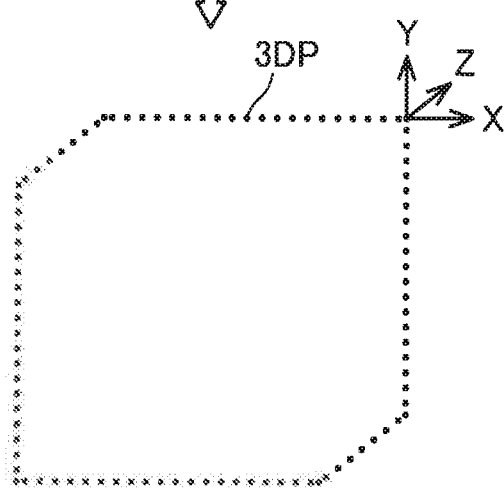

FIGS. 4A-4C are a schematic diagram illustrating a relationship among 3D CAD, a 2D model obtained by projecting the 3D CAD, and a 3D model created on the basis of the 2D model. As illustrated in FIGS. 4A-4C as an image diagram illustrating the template creation process described above, the template creator 6 renders the 2D model on the virtual plane on the basis of a view $V_n$ of the 3D CAD as a 3D model. The template creator 6 detects edges of an image obtained through the rendering, further extracts a contour, and selects a plurality of 2D model points included in the contour on the basis of the method described with reference to Equations (1) and (2). Hereinafter, a position of a selected 2D model point and gradient (a gradient vector of luminance) at the position of the 2D model point are represented by a contour feature CF. The template creator 6 performs inverse transformation on a 2D model point $p_i$ represented by a contour feature $CF_i$ in the two dimensional space so as to obtain a 3D model point $P_i$ in the three dimensional space corresponding to the contour feature $CF_i$. Here, the 3D model point $P_i$ is represented in the object coordinate system. The template in the view $V_n$ includes elements expressed by the following Expression (6).

$$(CF_{1n}, CF_{2n}, \ldots, 3DP_{1n}, 3DP_{2n}, \ldots, V_n) \tag{6}$$

In Expression (6), a contour feature and a 3D model point (for example, $CF_{1n}$ and $3DP_{1n}$) with the same suffix are correlated with each other. A 3D model point which is not detected in the view $V_n$ may be detected in a view $V_m$ or the like which is different from the view $V_n$.

In the present embodiment, if a 2D model point p is provided, the template creator 6 treats the coordinates of the 2D model point p as integers representing a corner of a pixel. Therefore, a depth value of the 2D model point p corresponds to coordinates of (p+0.5). As a result, the template creator 6 uses the coordinates of (p+0.5) for inversely projecting the 2D point p. When a recovered 3D model point is projected, the template creator 6 truncates floating-point coordinates so as to obtain integer coordinates.

A-2-3. In-Plane Rotation Optimization for Training

If a single view is provided, substantially the same features can be visually recognized from the single view, and thus the template creator 6 creates a plurality of templates by performing in-plane rotation on the single view. The template creator 6 can create a plurality of templates with less processing by creating the templates having undergone the in-plane rotation. Specifically, the template creator 6 defines 3D points and CF descriptors for in-plane rotation of 0 degrees in the view t according to the following Expressions (7) and (8), respectively, on the basis of Expressions (4) and (5).

$$\{P_1, \ldots, P_N\}_{t,0} \tag{7}$$

$$\{CF_1, \ldots, CF_N\}_{t,0} \tag{8}$$

The template creator 6 computes 3D model points and contour feature descriptors with respect to a template at in-plane rotation of a degrees by using Expressions (7) and (8). The visibility does not change regardless of in-plane rotation, and the 3D model points in Expression (7) are represented in the object coordinate system. From this fact, the 3D model points at in-plane rotation of a degrees are obtained by only copying point coordinates of the 3D model points at in-plane rotation of 0 degrees, and are thus expressed as in the following Equation (9).

$$\{P_1, \ldots, P_N\}_{t,\alpha} = \{P_1, \ldots, P_N\}_{t,0} \tag{9}$$

The contour features at in-plane rotation of a degrees are stored in the 2D coordinate system, and thus rotating the contour features at in-plane rotation of 0 degrees by a degrees is sufficient. This rotation is performed by applying a rotation matrix of 2×2 to each vector $CF_i$, and is expressed as in the following Equation (10).

$$CF_i^{t,a} = \begin{bmatrix} \cos\alpha & \sin\alpha \\ -\sin\alpha & \cos\alpha \end{bmatrix} CF_i^{t,0} \tag{10}$$

The rotation in Equation (10) is clockwise rotation, and corresponds to the present view sampling method for training. The view t corresponds to a specific viewpoint in the SUMMARY. The set PMn of 2D model points corresponds to positions of a plurality of feature points in the two dimensions, and the 3D model points correspond to the positions of a plurality of feature points in the three dimensions, represented in the object coordinate system.

A-2-4. Super-Template

The template creator 6 selects K (for example, four) templates in different views t, and merges the selected K templates into a single super-template. The template creator 6 selects templates whose views t are closest to each other as the K templates. Thus, there is a high probability that the super-template may include all edges of a target object which can be visually recognized on an object. Consequently, in a case where a detected pose of the target object is optimized, there is a high probability of convergence on an accurate pose.

As described above, in the personal computer PC of the present embodiment, the template creator 6 detects a plurality of edges in the two dimensions in a case where a three-dimensional CAD model representing a target object is viewed from a specific view. The template creator 6 computes 3D model points obtained by transforming contour features of the plurality of edges. The template creator 6 creates a template in which the plurality of edges in the two dimensions, the 3D model points obtained through transformation, and the specific view are correlated with each other. Thus, in the present embodiment, due to the templates created by, for example, the personal computer PC, the pose of the imaged target object is estimated with high accuracy and/or within a short period of time, when the target object is imaged by a camera or the like and a template representing a pose closest to the pose of the target object in the captured image is selected.

A-3. Configuration of Head Mounted Display (HMD)

Figure 5:
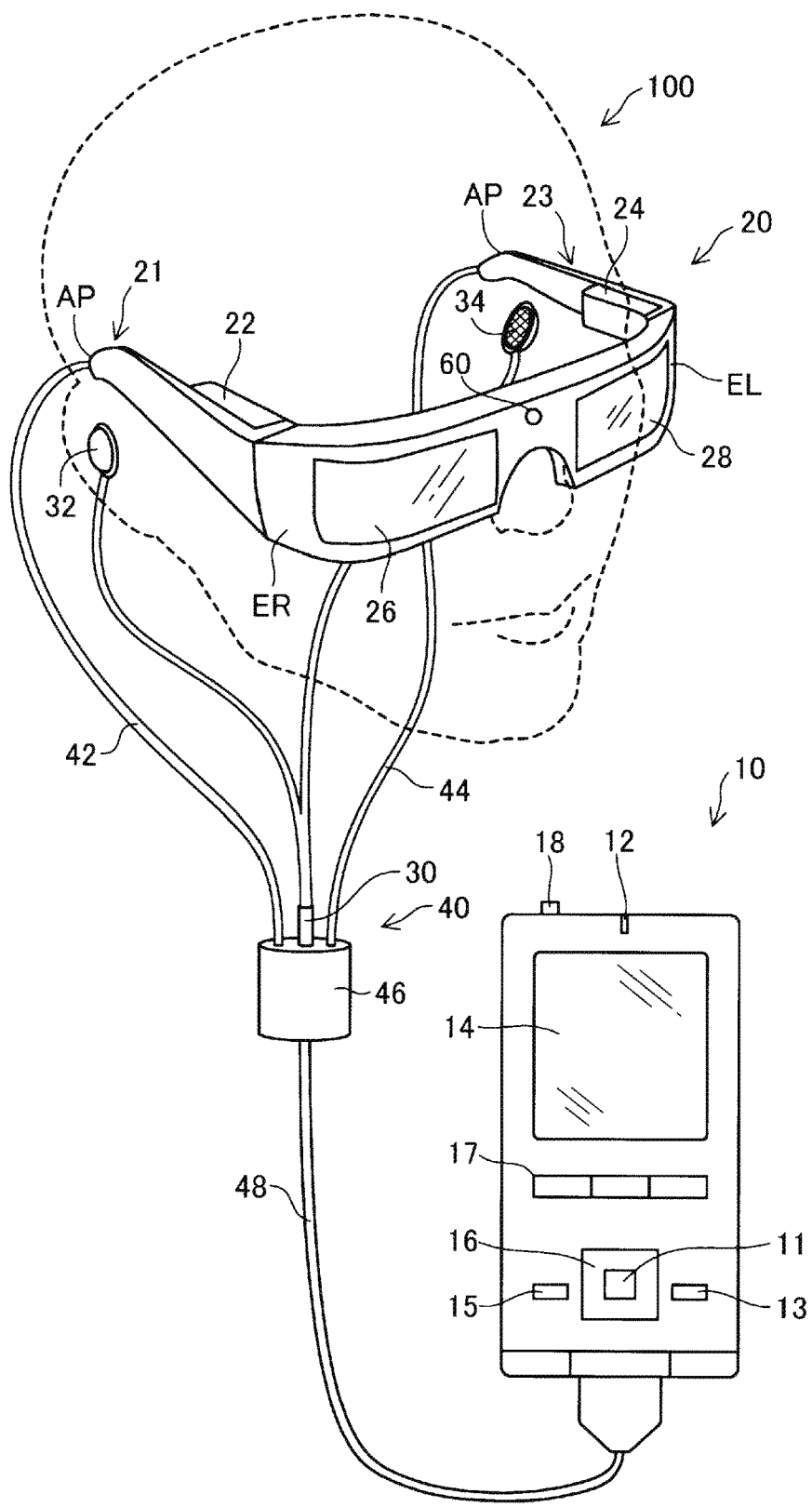
FIG. 5 is a diagram illustrating an exterior configuration of a head mounted display (HMD) which optimizes a pose of an imaged target object by using a template, according to an embodiment.

FIG. 5 is a diagram illustrating an exterior configuration of a head mounted display 100 (HMD 100) which optimizes a pose of an imaged target object by using a template. If a camera 60 which will be described later captures an image of a target object, the HMD 100 optimizes and/or estimates a position and a pose of the imaged target object by using preferably a super-template and the captured image of the target object.

The HMD 100 is a display device mounted on the head, and is also referred to as a head mounted display (HMD). The HMD 100 of the present embodiment is an optical transmission, or optical see-through, type head mounted display which allows a user to visually recognize a virtual image and also to directly visually recognize external scenery. In the present specification, for convenience, a virtual image which the HMD 100 allows the user to visually recognize is also referred to as a "display image".

The HMD 100 includes the image display section 20 which enables a user to visually recognize a virtual image in a state of being mounted on the head of the user, and a control section 10 (a controller 10) which controls the image display section 20.

The image display section 20 is a mounting body which is to be mounted on the head of the user, and has a spectacle shape in the present embodiment. The image display section 20 includes a right holding unit 21, a right display driving unit 22, a left holding unit 23, a left display driving unit 24, a right optical image display unit 26, a left optical image display unit 28, and the camera 60. The right optical image display unit 26 and the left optical image display unit 28 are disposed so as to be located in front of the right and left eyes of the user when the user wears the image display section 20. One end of the right optical image display unit 26 and one end of the left optical image display unit 28 are connected to each other at the position corresponding to the glabella of the user when the user wears the image display section 20.

The right holding unit 21 is a member which is provided so as to extend over a position corresponding to the temporal region of the user from an end part ER which is the other end of the right optical image display unit 26 when the user wears the image display section 20. Similarly, the left holding unit 23 is a member which is provided so as to extend over a position corresponding to the temporal region of the user from an end part EL which is the other end of the left optical image display unit 28 when the user wears the image display section 20. The right holding unit 21 and the left holding unit 23 hold the image display section 20 on the head of the user in the same manner as temples of spectacles.

The right display driving unit 22 and the left display driving unit 24 are disposed on a side opposing the head of the user when the user wears the image display section 20. Hereinafter, the right holding unit 21 and the left holding unit 23 are collectively simply referred to as "holding units", the right display driving unit 22 and the left display driving unit 24 are collectively simply referred to as "display driving units", and the right optical image display unit 26 and the left optical image display unit 28 are collectively simply referred to as "optical image display units".

The display driving units 22 and 24 respectively include liquid crystal displays 241 and 242 (hereinafter, referred to as an "LCDs 241 and 242"), projection optical systems 251 and 252, and the like (refer to FIG. 6). Details of configurations of the display driving units 22 and 24 will be described later. The optical image display units 26 and 28 as optical members include light guide plates 261 and 262 (refer to FIG. 6) and dimming plates. The light guide plates 261 and 262 are made of light transmissive resin material or the like and guide image light which is output from the display driving units 22 and 24 to the eyes of the user. The dimming plate is a thin plate-shaped optical element, and is disposed to cover a surface side of the image display section 20 which is an opposite side to the user's eye side. The dimming plate protects the light guide plates 261 and 262 so as to prevent the light guide plates 261 and 262 from being damaged, polluted, or the like. In addition, light transmittance of the dimming plates is adjusted so as to adjust an amount of external light entering the eyes of the user, thereby controlling an extent of visually recognizing a virtual image. The dimming plate may be omitted.

The camera 60 images external scenery. The camera 60 is disposed at a position where one end of the right optical image display unit 26 and one end of the left optical image display unit 28 are connected to each other. As will be described later in detail, a pose of a target object included in the external scenery is estimated by using an image of the target object included in the external scenery imaged by the camera 60 and preferably a super-template stored in a storage unit 120. The camera 60 corresponds to an imaging section in the SUMMARY.

The image display section 20 further includes a connection unit 40 which connects the image display section 20 to the control section 10. The connection unit 40 includes a main body cord 48 connected to the control section 10, a right cord 42, a left cord 44, and a connection member 46.

The right cord 42 and the left cord 44 are two cords into which the main body cord 48 branches out. The right cord 42 is inserted into a casing of the right holding unit 21 from an apex AP in the extending direction of the right holding unit 21, and is connected to the right display driving unit 22. Similarly, the left cord 44 is inserted into a casing of the left holding unit 23 from an apex AP in the extending direction of the left holding unit 23, and is connected to the left display driving unit 24. The connection member 46 is provided at a branch point of the main body cord 48, the right cord 42, and the left cord 44, and has a jack for connection of an earphone plug 30. A right earphone 32 and a left earphone 34 extend from the earphone plug 30.

The image display section 20 and the control section 10 transmit various signals via the connection unit 40. An end part of the main body cord 48 on an opposite side to the connection member 46, and the control section 10 are respectively provided with connectors (not illustrated) fitted to each other. The connector of the main body cord 48 and the connector of the control section 10 are fitted into or released from each other, and thus the control section 10 is connected to or disconnected from the image display section 20. For example, a metal cable or an optical fiber may be used as the right cord 42, the left cord 44, and the main body cord 48.

The control section 10 is a device used to control the HMD 100. The control section 10 includes a determination key 11, a lighting unit 12, a display changing key 13, a track pad 14, a luminance changing key 15, a direction key 16, a menu key 17, and a power switch 18. The determination key 11 detects a pushing operation, so as to output a signal for determining content operated in the control section 10. The lighting unit 12 indicates an operation state of the HMD 100 by using a light emitting state thereof. The operation state of the HMD 100 includes, for example, ON and OFF of power, or the like. For example, an LED is used as the lighting unit 12. The display changing key 13 detects a pushing operation so as to output a signal for changing a content moving image display mode between 3D and 2D. The track pad 14 detects an operation of the finger of the user on an operation surface of the track pad 14 so as to output a signal based on detected content. Various track pads of a capacitance type, a pressure detection type, and an optical type may be employed as the track pad 14. The luminance changing key 15 detects a pushing operation so as to output a signal for increasing or decreasing a luminance of the image display section 20. The direction key 16 detects a pushing operation on keys corresponding to vertical and horizontal directions so as to output a signal based on detected content. The power switch 18 detects a sliding operation of the switch so as to change a power supply state of the HMD 100.

Figure 6:
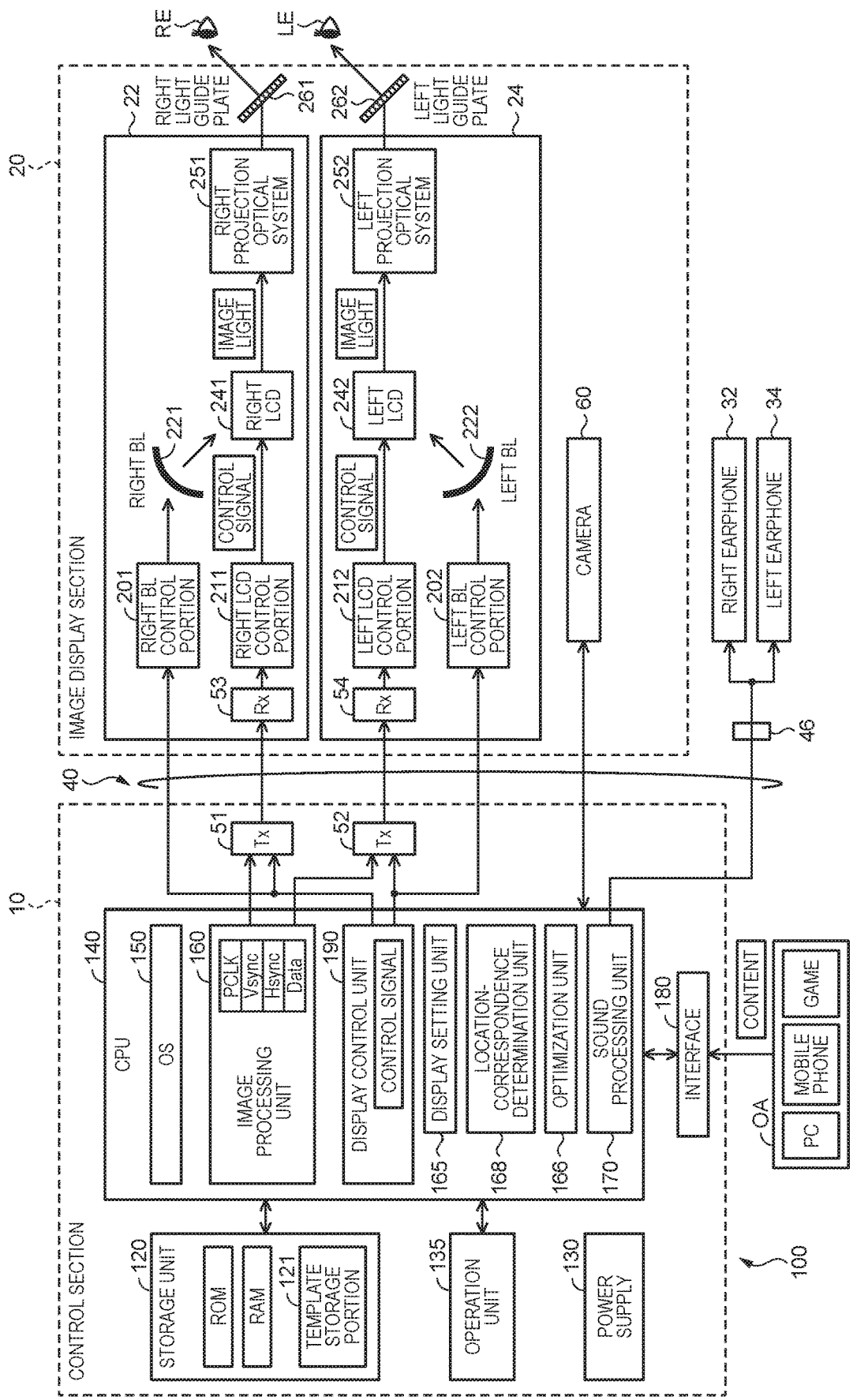
FIG. 6 is a block diagram functionally illustrating a configuration of the HMD in the present embodiment, according to an embodiment.

FIG. 6 is a functional block diagram illustrating a configuration of the HMD 100 of the present embodiment. As illustrated in FIG. 6, the control section 10 includes the storage unit 120, a power supply 130, an operation unit 135, a CPU 140, an interface 180, a transmission unit 51 (Tx 51), and a transmission unit 52 (Tx 52). The operation unit 135 is constituted of the determination key 11, the display changing key 13, the track pad 14, the luminance changing key 15, the direction key 16, and the menu key 17, and the power switch 18, which receive operations from the user. The power supply 130 supplies power to the respective units of the HMD 100. For example, a secondary battery may be used as the power supply 130.

The storage unit 120 includes a ROM storing a computer program, a RAM which is used for the CPU 140 to perform writing and reading of various computer programs, and a template storage portion 121. The template storage portion 121 stores a super-template created by the template creator 6 of the personal computer PC. The template storage portion 121 acquires the super-template via a USB memory connected to the interface 180. The template storage portion 121 corresponds to a template acquisition section in the appended claims.

The CPU 140 reads the computer programs stored in the ROM of the storage unit 120, and writes and reads the computer programs to and from the RAM of the storage unit 120, so as to function as an operating system 150 (OS 150), a display control unit 190, a sound processing unit 170, an image processing unit 160, an image setting unit 165, a location-correspondence determination unit 168, and an optimization unit 166.

The display control unit 190 generates control signals for control of the right display driving unit 22 and the left display driving unit 24. Specifically, the display control unit 190 individually controls the right LCD control portion 211 to turn on and off driving of the right LCD 241, controls the right backlight control portion 201 to turn on and off driving of the right backlight 221, controls the left LCD control portion 212 to turn on and off driving of the left LCD 242, and controls the left backlight control portion 202 to turn on and off driving of the left backlight 222, by using the control signals. Consequently, the display control unit 190 controls each of the right display driving unit 22 and the left display driving unit 24 to generate and emit image light. For example, the display control unit 190 causes both of the right display driving unit 22 and the left display driving unit 24 to generate image light, causes either of the two units to generate image light, or causes neither of the two units to generate image light. Generating image light is also referred to as "displaying an image".

The display control unit 190 transmits the control signals for the right LCD control portion 211 and the left LCD control portion 212 thereto via the transmission units 51 and 52. The display control unit 190 transmits control signals for the right backlight control portion 201 and the left backlight control portion 202 thereto.

The image processing unit 160 acquires an image signal included in content. The image processing unit 160 separates synchronization signals such as a vertical synchronization signal VSync and a horizontal synchronization signal HSync from the acquired image signal. The image processing unit 160 generates a clock signal PCLK by using a phase locked loop (PLL) circuit or the like (not illustrated) on the basis of a cycle of the separated vertical synchronization signal VSync or horizontal synchronization signal HSync. The image processing unit 160 converts an analog image signal from which the synchronization signals are separated into a digital image signal by using an A/D conversion circuit or the like (not illustrated). Next, the image processing unit 160 stores the converted digital image signal in a DRAM of the storage unit 120 for each frame as image dat (RGB data) of a target image. The image processing unit 160 may perform, on the image data, image processes including a resolution conversion process, various color tone correction processes such as adjustment of luminance and color saturation, a keystone correction process, and the like, as necessary.

The image processing unit 160 transmits each of the generated clock signal PCLK, vertical synchronization signal VSync and horizontal synchronization signal HSync, and the image data stored in the DRAM of the storage unit 120, via the transmission units 51 and 52. Here, the image data which is transmitted via the transmission unit 51 is referred to as "right eye image data", and the image data Data which is transmitted via the transmission unit 52 is referred to as "left eye image data". The transmission units 51 and 52 function as a transceiver for serial transmission between the control section 10 and the image display section 20.

The sound processing unit 170 acquires an audio signal included in the content so as to amplify the acquired audio signal, and supplies the amplified audio signal to a speaker (not illustrated) of the right earphone 32 connected to the connection member 46 and a speaker (not illustrated) of the left earphone 34 connected thereto. In addition, for example, in a case where a Dolby (registered trademark) system is employed, the audio signal is processed, and thus different sounds of which frequencies are changed are respectively output from the right earphone 32 and the left earphone 34.

In a case where an image of external scenery including a target object is captured by the camera 60, the location-correspondence determination unit 168 detects edges of the target object in the captured image. Then, the location-correspondence determination unit 168 determines correspondences between the edges (edge feature elements) of the target object and the contour feature elements of the 2D model stored in the template storage portion 121. In the present embodiment, a plurality of templates are created and stored in advance with a specific target object (for example, a specific part) as a preset target object. Therefore, if a preset target object is included in a captured image, the location-correspondence determination unit 168 determines correspondences between 2D locations of edges of the target object and 2D locations of 2D model points of the target object included in a template selected among from a plurality of the templates in different views. A specific process of determining or establishing the correspondences between the edge feature elements of the target object in the captured image and the contour feature elements of the 2D model in the template will be described later.

The optimization unit 166 outputs 3D model points, which include respective 3D locations, corresponding to 2D model points having the correspondences to the image points from the template of the target object, and minimizes a cost function in Equation (14) on the basis of the image points, the 3D model points, and the view represented by at least one transformation matrix, so as to estimate a location and a pose in the three dimensions of the target object included in the external scenery imaged by the camera 60. Estimation and/or optimization of a position and a pose of the imaged target object will be described later.

The image setting unit 165 performs various settings on an image (display image) displayed on the image display section 20. For example, the image setting unit 165 sets a display position of the display image, a size of the display image, luminance of the display image, and the like, or sets right eye image data and left eye image data so that binocular parallax (hereinafter, also referred to as "parallax") is formed in order for a user to stereoscopically (3D) visually recognize the display image as a three-dimensional image. The image setting unit 165 detects a determination target image set in advance from a captured image by applying pattern matching or the like to the captured image.

The image setting unit 165 displays (renders) a 3D model corresponding to the target object on the optical image display units 26 and 28 in a pose of target object which is derived and/or optimized by the optimization unit 166 in a case where the location-correspondence determination unit 168 and the optimization unit 166 are performing various processes and have performed the processes. The operation unit 135 receives an operation from the user, and the user can determine whether or not the estimated pose of the target object matches a pose of the target object included in the external scenery transmitted through the optical image display units 26 and 28.

The interface 180 is an interface which connects the control section 10 to various external apparatuses OA which are content supply sources. As the external apparatuses OA, for example, a personal computer (PC), a mobile phone terminal, and a gaming terminal may be used. As the interface 180, for example, a USB interface, a microUSB interface, and a memory card interface may be used.

The image display section 20 includes the right display driving unit 22, the left display driving unit 24, the right light guide plate 261 as the right optical image display unit 26, the left light guide plate 262 as the left optical image display unit 28, and the camera 60.

The right display driving unit 22 includes a reception portion 53 (Rx 53), the right backlight control portion 201 (right BL control portion 201) and the right backlight 221 (right BL 221) functioning as a light source, the right LCD control portion 211 and the right LCD 241 functioning as a display element, and a right projection optical system 251. As mentioned above, the right backlight control portion 201 and the right backlight 221 function as a light source. As mentioned above, the right LCD control portion 211 and the right LCD 241 function as a display element. The right backlight control portion 201, the right LCD control portion 211, the right backlight 221, and the right LCD 241 are collectively referred to as an "image light generation unit".

The reception portion 53 functions as a receiver for serial transmission between the control section 10 and the image display section 20. The right backlight control portion 201 drives the right backlight 221 on the basis of an input control signal. The right backlight 221 is a light emitting body such as an LED or an electroluminescent element (EL). The right LCD control portion 211 drives the right LCD 241 on the basis of the clock signal PCLK, the vertical synchronization signal VSync, the horizontal synchronization signal HSync, and the right eye image data which are input via the reception portion 53. The right LCD 241 is a transmissive liquid crystal panel in which a plurality of pixels are disposed in a matrix.

The right projection optical system 251 is constituted of a collimator lens which converts image light emitted from the right LCD 241 into parallel beams of light flux. The right light guide plate 261 as the right optical image display unit 26 reflects image light output from the right projection optical system 251 along a predetermined light path, so as to guide the image light to the right eye RE of the user. The right projection optical system 251 and the right light guide plate 261 are collectively referred to as a "light guide portion".

The left display driving unit 24 has the same configuration as that of the right display driving unit 22. The left display driving unit 24 includes a reception portion 54 (Rx 54), the left backlight control portion 202 (left BL control portion 202) and the left backlight 222 (left BL 222) functioning as a light source, the left LCD control portion 212 and the left LCD 242 functioning as a display element, and a left projection optical system 252. As mentioned above, the left backlight control portion 202 and the left backlight 222 function as a light source. As mentioned above, the left LCD control portion 212 and the left LCD 242 function as a display element. In addition, the left backlight control portion 202, the left LCD control portion 212, the left backlight 222, and the left LCD 242 are collectively referred to as an "image light generation unit". The left projection optical system 252 is constituted of a collimator lens which converts image light emitted from the left LCD 242 into parallel beams of light flux. The left light guide plate 262 as the left optical image display unit 28 reflects image light output from the left projection optical system 252 along a predetermined light path, so as to guide the image light to the left eye LE of the user. The left projection optical system 252 and the left light guide plate 262 are collectively referred to as a "light guide portion".

A-4. EXECUTION (RUN-TIME) OF ESTIMATION OF TARGET OBJECT POSE

Figure 7:
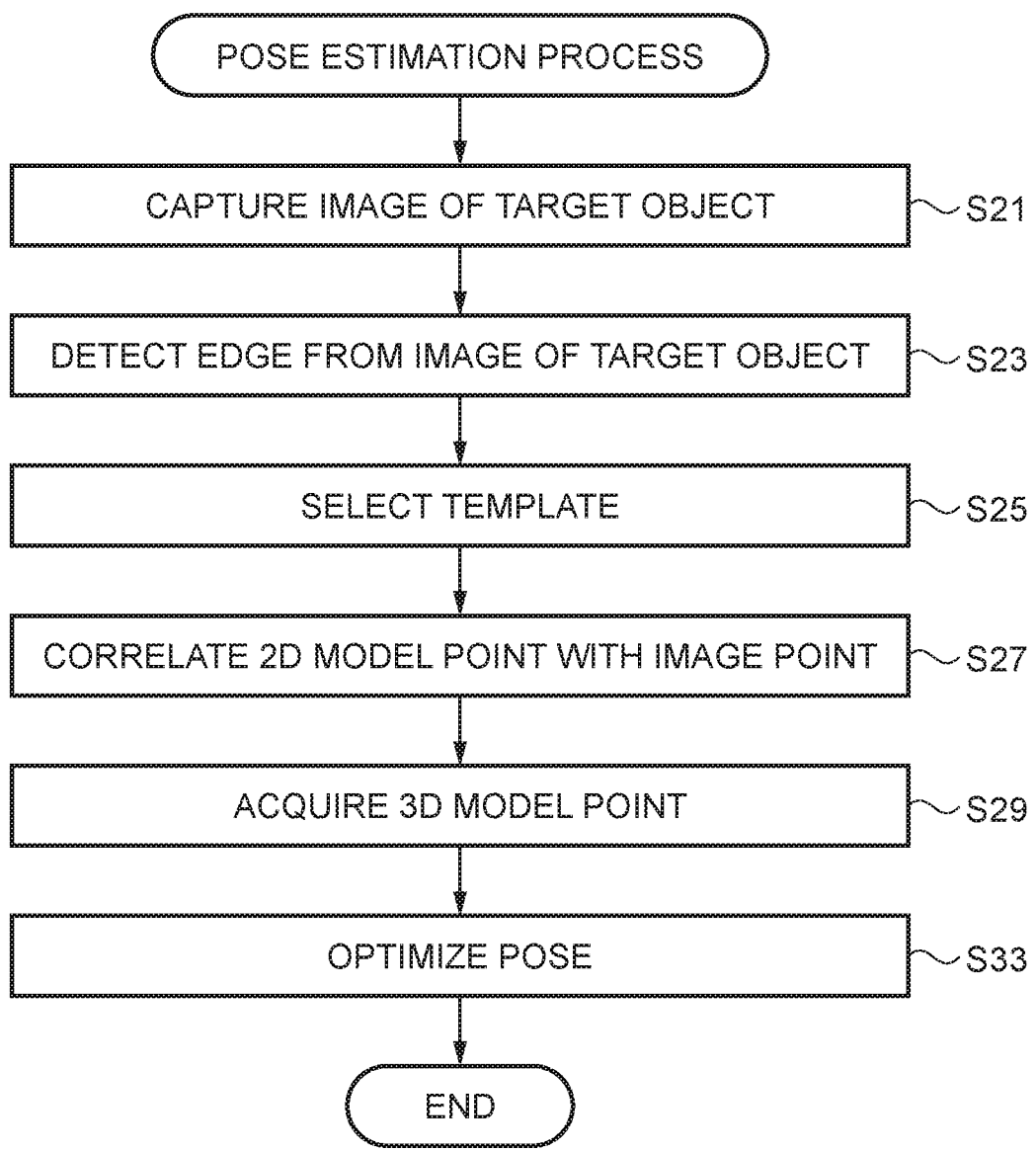
FIG. 7 is a flowchart illustrating a process of estimating a pose of a target object, according to an embodiment.

FIG. 7 is a flowchart illustrating a target object pose estimation process. In the pose estimation process, first, the location-correspondence determination unit 168 images external scenery including a target object with the camera 60 (step S21). The location-correspondence determination unit 168 performs edge detection described below on a captured image of the target object (step S23).

A-4-1. Edge Detection (Step S23)

The location-correspondence determination unit 168 detects an edge of the image of the target object in order to correlate the imaged target object with a template corresponding to the target object. The location-correspondence determination unit 168 computes features serving as the edge on the basis of pixels of the captured image. In the present embodiment, the location-correspondence determination unit 168 computes gradient of luminance of the pixels of the captured image of the target object so as to determine the features. When the edge is detected from the captured image, objects other than the target object in the external scenery, different shadows, different illumination, and different materials of objects included in the external scenery may influence the detected edge. Thus, it may be relatively difficult to detect the edge from the captured image may than to detect an edge from a 3D CAD model. In the present embodiment, in order to more easily detect an edge, the location-correspondence determination unit 168 only compares an edge with a threshold value and suppresses non-maxima, in the same manner as in procedures performed in a simple edge detection method.

A-4-2. Selection of Template (Step S25)

If the edge is detected from the image of the target object, the location-correspondence determination unit 168 selects a template having a view closest to the pose of the target object in a captured image thereof from among templates stored in the template storage portion 121 (step S25). For this selection, an existing three-dimensional pose estimation algorithm for estimating a rough pose of a target object may be used separately. The location-correspondence determination unit 168 may find a new training view closer to the pose of the target object in the image than the selected training view when highly accurately deriving a 3D pose. In a case of finding a new training view, the location-correspondence determination unit 168 highly accurately derives a 3D pose in the new training view. In the present embodiment, if views are different from each other, contour features as a set of visually recognizable edges including the 2D outline of the 3D model are also different from each other, and thus a new training view may be found. The location-correspondence determination unit 168 uses a super-template for a problem that sets of visually recognizable edges are different from each other, and thus extracts as many visually recognizable edges as possible. In another embodiment, instead of using a template created in advance, the location-correspondence determination unit 168 may image a target object, and may create a template by using 3D CAD data while reflecting an imaging environment such as illumination in rendering on the fly and as necessary, so as to extract as many visually recognizable edges as possible.

A-4-3. 2D Point Correspondences (Step S27)

If the process in step S25 is completed, the location-correspondence determination unit 168 correlates the edge of the image of the target object with 2D model points included in the template (step S27).

Figure 8:
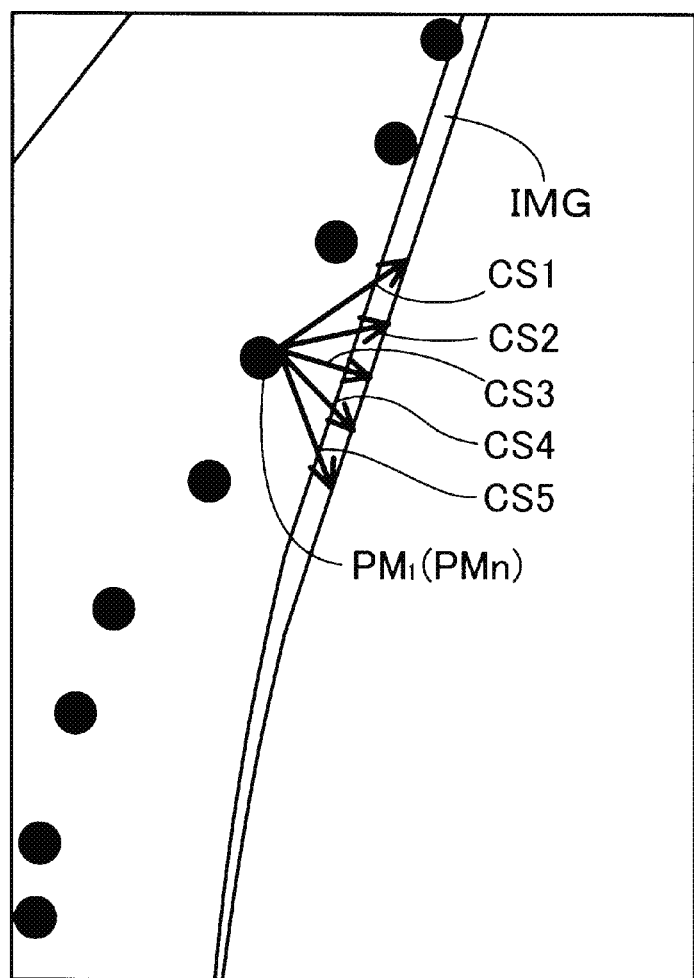
FIG. 8 is a diagram illustrating that a single model point can be combined with a plurality of image points, according to an embodiment.
Figure 9:
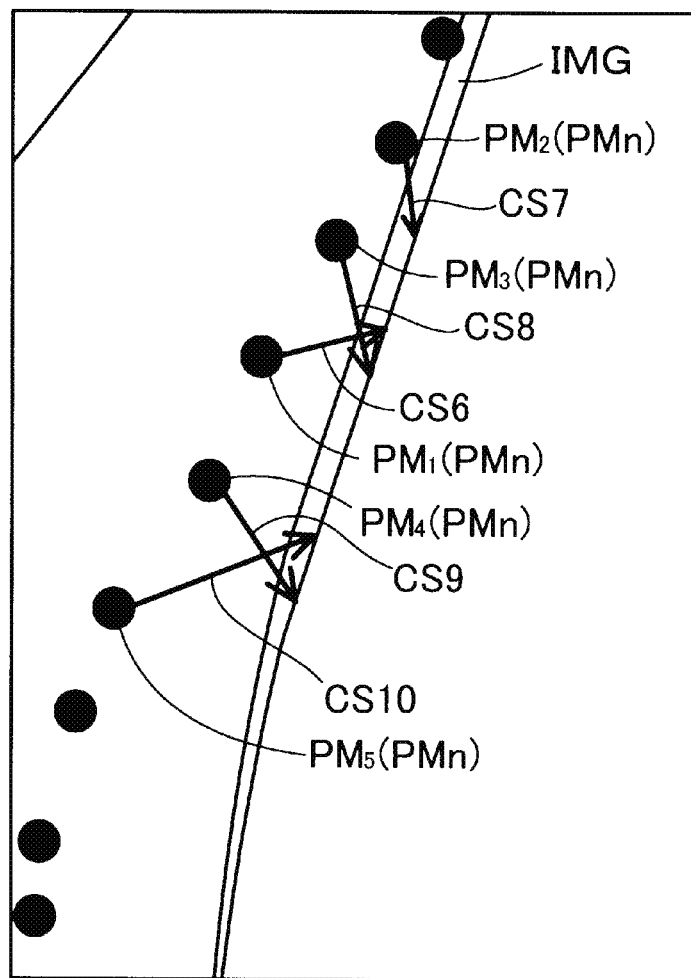
FIG. 9 is a diagram illustrating an example in which a model point is combined with wrong image points, according to an embodiment.

FIG. 8 is a diagram illustrating that a single 2D model point is combined with a plurality of image points included in a certain edge. FIG. 9 is a diagram illustrating an example in which a 2D model point is combined with wrong image points. FIGS. 8 and 9 illustrate a captured image IMG of the target object OBm, a partial enlarged view of the 2D model point set PMn, and a plurality of arrows CS in a case where the target object OBm corresponding to the 3D model illustrated in FIG. 3 is imaged by the camera 60. As illustrated in FIG. 8, a portion of an edge detected from the image IMG of the target object OBm which is correlated with a 2D model point $PM_1$ which is one of the 2D model points included in a template includes a plurality of options as in the arrows CS1 to CS5. FIG. 9 illustrates an example in which 2D model points $PM_1$ to $PM_5$ included in the template and arranged are wrongly combined with an edge (image points included therein) detected from the image IMG of the target object OBm. In this case, for example, in FIG. 9, despite the 2D model points $PM_2$, $PM_3$, $PM_1$, $PM_4$ and $PM_5$ being arranged from the top, the arrows CS7, CS6, CS8, CS10 and CS9 are arranged in this order in the edge of the image IMG of the target object OBm. Thus, the arrow CS8 and the arrow CS6, and the arrow CS9 and the arrow CS10 are changed. As described above, the location-correspondence determination unit 168 is required to accurately correlate 2D model points included in a template with image points included in an edge of the image IMG of the target object OBm to accurately estimate or derive a pose of the imaged target object OBm.

In the present embodiment, the location-correspondence determination unit 168 computes similarity scores by using the following Equation (11) with respect to all image points included in a local vicinity of each projected 2D model point.

$$SIM(p, p') = \left| \vec{\frac{1}{E_p}} \cdot \vec{\nabla} I_{P'} \right| / \max_{q \in N(p)} \left\| \vec{\nabla} I_p \right\| \tag{11}$$

The measure of similarity scores indicated in Equation (11) is based on matching between a gradient vector (hereinafter, simply referred to as gradient) of luminance of a 2D model point included in a template and a gradient vector of an image point, but is based on an inner product of the two vectors in Equation (11) as an example. The vector of Ep in Equation (11) is a unit length gradient vector of a 2D model point (edge point) p. The location-correspondence determination unit 168 uses gradient ∇I of a test image (input image) in order to compute features of an image point p' when obtaining the similarity scores. The normalization by the local maximum of the gradient magnitude in the denominator in Expression (11) ensures that the priority is reliably given to an edge with a locally high intensity. This normalization prevents an edge which is weak and thus becomes noise from being collated. The location-correspondence determination unit 168 enhances a size N(p) of a nearest neighborhood region in which a correspondence is searched for when the similarity scores are obtained. For example, in a case where an average of position displacement of a projected 2D model point is reduced in consecutive iterative computations, N(p) may be reduced. Hereinafter, a specific method for establishing correspondences using Equation (11) will be described.

Figure 10:
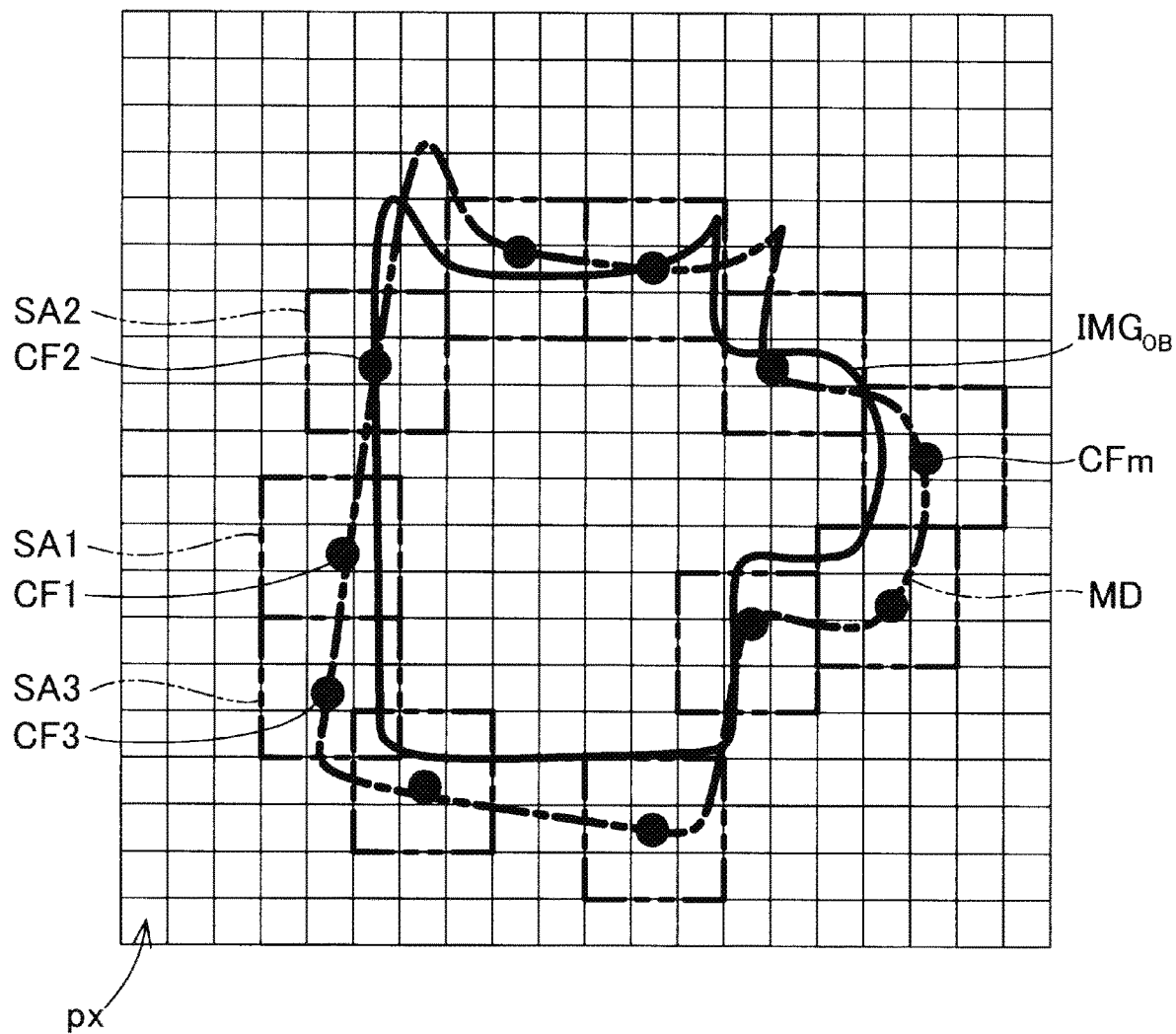
FIG. 10 is a diagram illustrating an example of computation of CF similarity, according to an embodiment.
Figure 11:
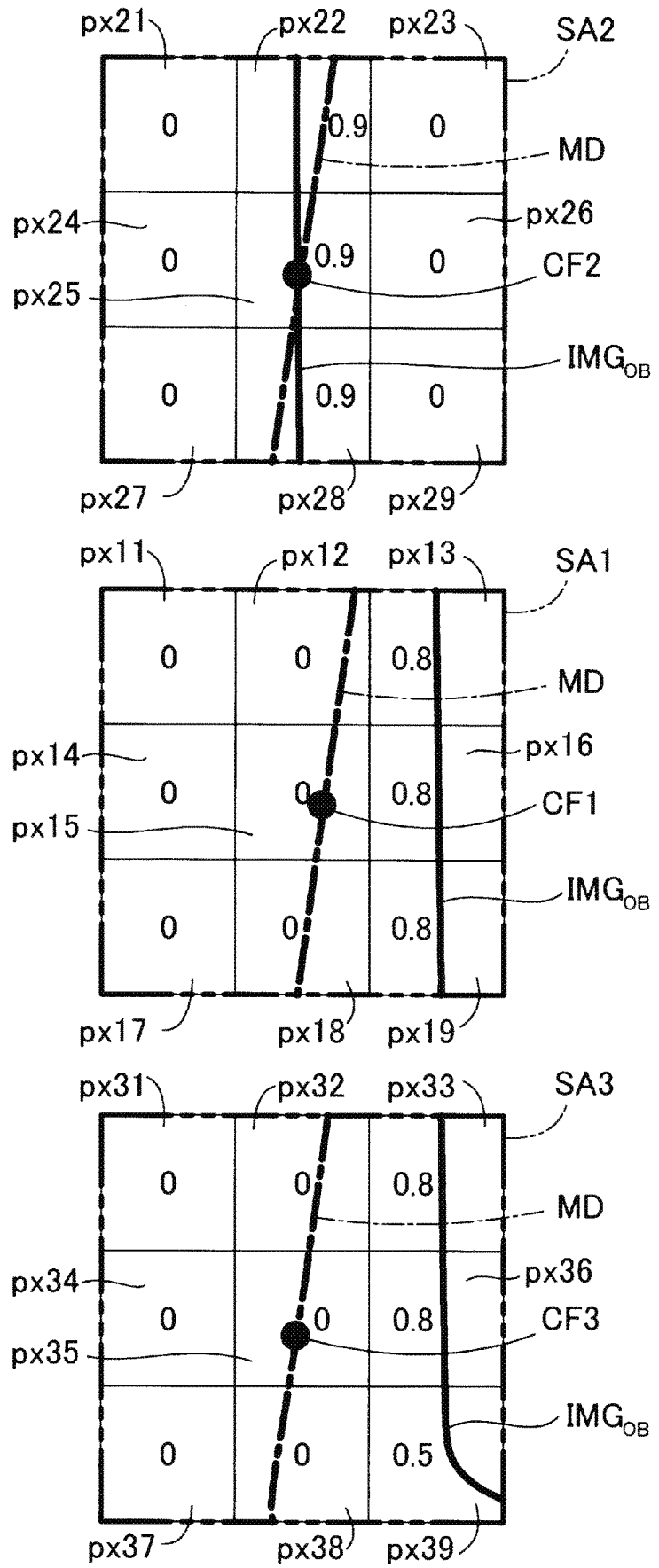
FIG. 11 is a diagram illustrating an example of computation of CF similarity, according to an embodiment.
Figure 12:
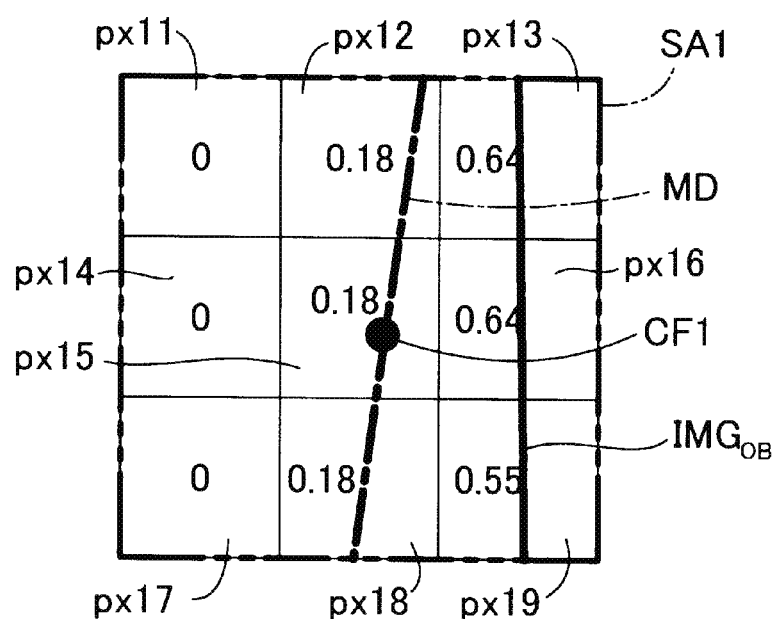
FIG. 12 is a diagram illustrating an example of computation of CF similarity, according to an embodiment.

FIGS. 10 to 12 are diagrams illustrating an example of computation of similarity scores. FIG. 10 illustrates an image $IMG_{OB}$ (solid line) of a target object captured by the camera 60, a 2D model MD (dot chain line) based on a template similar to the image $IMG_{OB}$ of the target object, and 2D model points as a plurality of contour features CFm in the 2D model MD. FIG. 10 illustrates a plurality of pixels px arranged in a lattice form, and a region (for example, a region SA1) formed of 3 pixels×3 pixels centering on each of the contour features CFm. FIG. 10 illustrates the region SA1 centering on the contour feature CF1 which will be described later, a region SA2 centering on a contour feature CF2, and a region SA3 centering on a contour feature CF3. The contour feature CF1 and the contour feature CF2 are adjacent to each other, and the contour feature CF1 and the contour feature CF3 are also adjacent to each other. In other words, the contour features are arranged in order of the contour feature CF2, the contour feature CF1, and the contour feature CF3 in FIG. 10.

As illustrated in FIG. 10, since the image $IMG_{OB}$ of the target object does not match the 2D model MD, the location-correspondence determination unit 168 correlates image points included in an edge of the image $IMG_{OB}$ of the target object with 2D model points represented by the plurality of contour features CFm of the 2D model MD, respectively, by using Equation (11). First, the location-correspondence determination unit 168 selects the contour feature CF1 as one of the plurality of contour features CFm, and extracts the region SA1 of 3 pixels×3 pixels centering on a pixel px including the contour feature CF1. Next, the location-correspondence determination unit 168 extracts the region SA2 and the region SA3 of 3 pixels x 3 pixels respectively centering on the two contour features such as the contour feature CF2 and the contour feature CF3 which are adjacent to the contour feature CF1. The location-correspondence determination unit 168 calculates a score by using Equation (11) for each pixel px forming each of the regions SA1, SA2 and SA3. In this stage, the regions SA1, SA2 and SA3 are matrices having the same shape and the same size.

FIG. 11 illustrates enlarged views of the respective regions SA1, SA2 and SA3, and similarity scores calculated for the respective pixels forming the regions SA1, SA2 and SA3. The location-correspondence determination unit 168 calculates similarity scores between the 2D model point as the contour feature and the nine image points. For example, in the region SA3 illustrated on the lower part of FIG. 11, the location-correspondence determination unit 168 calculates, as scores, 0.8 for pixels px33 and px36, 0.5 for a pixel px39, and 0 for the remaining six pixels. The reason why the score of 0.8 for the pixels px33 and px36 is different from the score of 0.5 for the pixel px39 is that the image $IMG_{OB}$ of the target object in the pixel px39 is bent and thus gradient differs. As described above, the location-correspondence determination unit 168 calculates similarity scores of each pixel (image point) forming the extracted regions SA1, SA2 and SA3 in the same manner.

Hereinafter, a description will be made focusing on the contour feature CF1. The location-correspondence determination unit 168 calculates a corrected score of each pixel forming the region SA1. Specifically, the similarity scores are averaged with weighting factors by using pixels located at the same matrix positions of the regions SA2 and SA3 as the respective pixels forming the region SA1. The location-correspondence determination unit 168 performs this correction of the similarity scores not only on the contour feature CF1 but also on the other contour features CF2 and CF3. In the above-described way, it is possible to achieve an effect in which a correspondence between a 2D model point and an image point is smoothed. In the example illustrated in FIG. 11, the location-correspondence determination unit 168 calculates corrected scores by setting a weighting factor of a score of each pixel px of the region SA1 to 0.5, setting a weighting factor of a score of each pixel px of the region SA2 to 0.2, and setting a weighting factor of a score of each pixel px of the region SA3 to 0.3. For example, 0.55 as a corrected score of the pixel px19 illustrated in FIG. 12 is a value obtained by adding together three values such as a value obtained by multiplying the score of 0.8 for the pixel px19 of the region SA1 by the weighting factor of 0.5, a value obtained by multiplying the score of 0 for the pixel px29 of the region SA2 by the weighting factor of 0.2, and a value obtained by multiplying the score of 0.5 for the pixel px39 of the region SA3 by the weighting factor of 0.3. The weighting factors are inversely proportional to distances between the processing target contour feature CF1 and the other contour features CF2 and CF3. The location-correspondence determination unit 168 determines an image point having the maximum score among the corrected scores of the pixels forming the region SA1, as an image point correlated with the contour feature CF1. In the example illustrated in FIG. 12, the maximum value of the corrected scores is 0.64 of the pixels px13 and px16. In a case where a plurality of pixels have the same corrected score, the location-correspondence determination unit 168 selects the pixel px16 whose distance from the contour feature CF1 is shortest, and the location-correspondence determination unit 168 correlates the contour feature CF1 with an image point of the pixel px16. The location-correspondence determination unit 168 compares edges detected in a plurality of images of the target object captured by the camera 60 with 2D model points in a template in a view close to the images of the target object, so as to determine image points of the target object corresponding to the 2D model points (contour features CF).

If the location-correspondence determination unit 168 completes the process in step S27 in FIG. 7, the optimization unit 166 acquires 3D model points corresponding to the 2D model points correlated with the image points and information regarding the view which is used for creating the 2D model points, from the template of the target object stored in the template storage portion 121 (step S29). The optimization unit 166 derives a pose of the target object imaged by the camera 60 on the basis of the extracted 3D model points and information regarding the view, and the image points (step S33). Details of the derivation are as follows.

A-4-4. Optimization of Pose (Step S33)

In the present embodiment, the optimization unit 166 highly accurately derives or refines a 3D pose of the target object by using contour features included in a template corresponding to a selected training view, and 3D model points corresponding to 2D model points included in the contour features. In the derivation, the optimization unit 166 derives a pose of the target object by performing optimization computation for minimizing Equation (14).

If the location-correspondence determination unit 168 completes establishing the correspondences between 2D model points and the image points in a predetermined view, the location-correspondence determination unit 168 reads 3D model points $P_i$ corresponding to the 2D model points (or the contour features $CF_i$) from a template corresponding to the view. In the present embodiment, as described above, the 3D model points $P_i$ corresponding to the 2D model points are stored in the template. However, the 3D model points $P_i$ are not necessarily stored in the template, and the location-correspondence determination unit 168 may inversely convert the 2D model points whose correspondences to the image points is completed, every time on the basis of the view, so as to obtain the 3D model points $P_i$.

The optimization unit 166 reprojects locations of the obtained 3D model points $P_i$ onto a 2D virtual plane on the basis of Equation (12).

$$\pi(P_i) = (u_i, v_i)^T \quad (12)$$

Here, $\pi$ in Equation (12) includes a rigid body transformation matrix and a perspective projecting transformation matrix included in the view. In the present embodiment, three parameters indicating three rotations about three axes included in the rigid body transformation matrix and three parameters indicating three translations along the three axes are treated as variables for minimizing Equation (14). The rotation may be represented by a quaternion. The image points $p_i$ corresponding to the 3D model points $P_i$ are expressed as in Equation (13).

$$p_i = (p_{ix}, p_{iy})^T \quad (13)$$

The optimization unit 166 derives a 3D pose by using the cost function expressed by the following Equation (14) in order to minimize errors between the 3D model points $P_i$ and the image points $p_i$.

$$E_{match} = \sum_{i=1}^{N} w_i * \|\pi(P_i) - p_i\| = \sum_{i=1}^{N} w_i * ((u_i - p_{ix})^2 + (v_i - p_{iy})^2) \quad (14)$$

Here, $w_i$ in Equation (14) is a weighting factor for controlling the contribution of each model point to the cost function. A point which is projected onto the outside of an image boundary or a point having low reliability of the correspondence is given a weighting factor of a small value. In the present embodiment, in order to present specific adjustment of a 3D pose, the optimization unit 166 determines minimization of the cost function expressed by Equation (14) as a function of 3D pose parameters using the Gauss-Newton method, if one of the following three items is reached:

1. An initial 3D pose diverges much more than a preset pose. In this case, it is determined that minimization of the cost function fails.
2. The number of times of approximation using the Gauss-Newton method exceeds a defined number of times set in advance.
3. A relative pose change in the Gauss-Newton method is equal to or less than a preset threshold value. In this case, it is determined that the cost function is minimized.

When a 3D pose is derived, the optimization unit 166 may attenuate refinement of a pose of the target object. Time required to process estimation of a pose of the target object directly depends on the number of iterative computations which are performed so as to achieve high accuracy (refinement) of the pose. From a viewpoint of enhancing the system speed, it may be beneficial to employ an approach that derives a pose through as small a number of iterative computations as possible without compromising the accuracy of the pose. According to the present embodiment, each iterative computation is performed independently from its previous iterative computation, and thus no constraint is imposed, the constraint ensuring that the correspondences of 2D model points are kept consistent, or that the same 2D model points are correlated with the same image structure or image points between two consecutive iterative computations. As a result, particularly, in a case where there is a noise edge structure caused by a messy state in which other objects which are different from a target object are mixed in an image captured by the camera 60 or a state in which shadows are present, correspondences of points are unstable. As a result, more iterative computations may be required for convergence. According to the method of the present embodiment, this problem can be handled by multiplying the similarity scores in Equation (11) by an attenuation weighting factor shown in the following Equation (15).

$$w(\vec{\Delta p}) = e^{-(\|\Delta p\|^2)/\sigma^2} \quad (15)$$

Equation (15) expresses a Gaussian function, and $\sigma$ has a function of controlling the strength (effect) of attenuation. In a case where a value of $\sigma$ is great, attenuation does not greatly occur, but in a case where a value of $\sigma$ is small, strong attenuation occurs, and thus it is possible to prevent a point from becoming distant from the present location. In order to ensure consistency in correspondences of points in different iterative computations, in the present embodiment, $\sigma$ is a function of a reprojecting error obtained through the latest several iterative computations. In a case where a reprojecting error (which may be expressed by Equation (14)) is considerable, in the method of the present embodiment, convergence does not occur. In an algorithm according to the present embodiment, $\sigma$ is set to a great value, and thus a correspondence with a distant point is ensured so that attenuation is not almost or greatly performed. In a case where a reprojecting error is slight, there is a high probability that a computation state using the algorithm according to the present embodiment may lead to an accurate solution. Therefore, the optimization unit 166 sets $\sigma$ to a small value so as to increase attenuation, thereby stabilizing the correspondences of points.

A-4-5. Subpixel Correspondences

The correspondences of points of the present embodiment takes into consideration only an image point at a pixel location of an integer, and thus there is a probability that accuracy of a 3D pose may be deteriorated. A method according to the present embodiment includes two techniques in order to cope with this problem. First, an image point p' whose similarity score is the maximum is found, and then the accuracy at this location is increased through interpolation. A final location is represented by a weighted linear combination of four connected adjacent image points p'. The weight here is a similarity score. Second, the method according to the present embodiment uses two threshold values for a reprojecting error in order to make a pose converge with high accuracy. In a case where great threshold values are achieved, a pose converges with high accuracy, and thus a slightly highly accurate solution has only to be obtained. Therefore, the length of vectors for the correspondences of points is artificially reduced to ½ through respective iterative computations after the threshold values are achieved. In this process, subsequent several computations are iteratively performed until the reprojecting error is less than a smaller second threshold value.

As a final step of deriving a pose with high accuracy, the location-correspondence determination unit 168 computes matching scores which is to be used to remove a wrong result. These scores have the same form as that of the cost function in Equation (14), and are expressed by the following Equation (16).

$$S_{match} = \frac{1}{N}\sum_{i=1}^{N} SIM_i \cdot e^{-\|\pi(P_i)-p_i\|/\sigma^2} \qquad (16)$$

In Equation (16), SIM, indicates a similarity score between a contour feature i (a 2D model point) and an image point which most match the contour feature. The exponential part is a norm (the square of a distance between two points in the present embodiment) between the 2D model point reprojected by using the pose and the image point corresponding thereto, and N indicates the number of sets of the 2D model points and the image points. The optimization unit 166 continuously performs optimization in a case where a value of Equation (16) is smaller than a threshold value without employing the pose, and employs the pose in a case where the value of Equation (16) is equal to or greater than the threshold value. As described above, if the optimization unit 166 completes the process in step S33 in FIG. 7, the location-correspondence determination unit 168 and the optimization unit 166 finishes the pose estimation process.

As described above, in the HMD 100 of the present embodiment, the location-correspondence determination unit 168 detects an edge from an image of a target object captured by the camera 60. The location-correspondence determination unit 168 establishes the correspondences between the image points included in an image and the 2D model points included in a template stored in the template storage portion 121. The optimization unit 166 estimates or derives a pose of the imaged target object by using the 2D model points and 3D points obtained by converting the 2D model points included in the template. Specifically, the optimization unit 166 optimizes a pose of the imaged target object by using the cost function. Thus, in the HMD 100 of the present embodiment, if an edge representing a contour of the target object imaged by the camera 60 can be detected, a pose of the imaged target object can be estimated with high accuracy. Since the pose of the target object is estimated with high accuracy, the accuracy of overlapping display of an AR image on the target object is improved, and the accuracy of an operation performed by a robot is improved.

B. SECOND EMBODIMENT

A second embodiment is the same as the first embodiment except for a computation method of similarity scores in establishing the correspondences of 2D points performed by the location-correspondence determination unit 168 of the HMD 100. Therefore, in the second embodiment, computation of similarity scores, which is different from the first embodiment, will be described, and description of other processes will be omitted.

Figure 13:
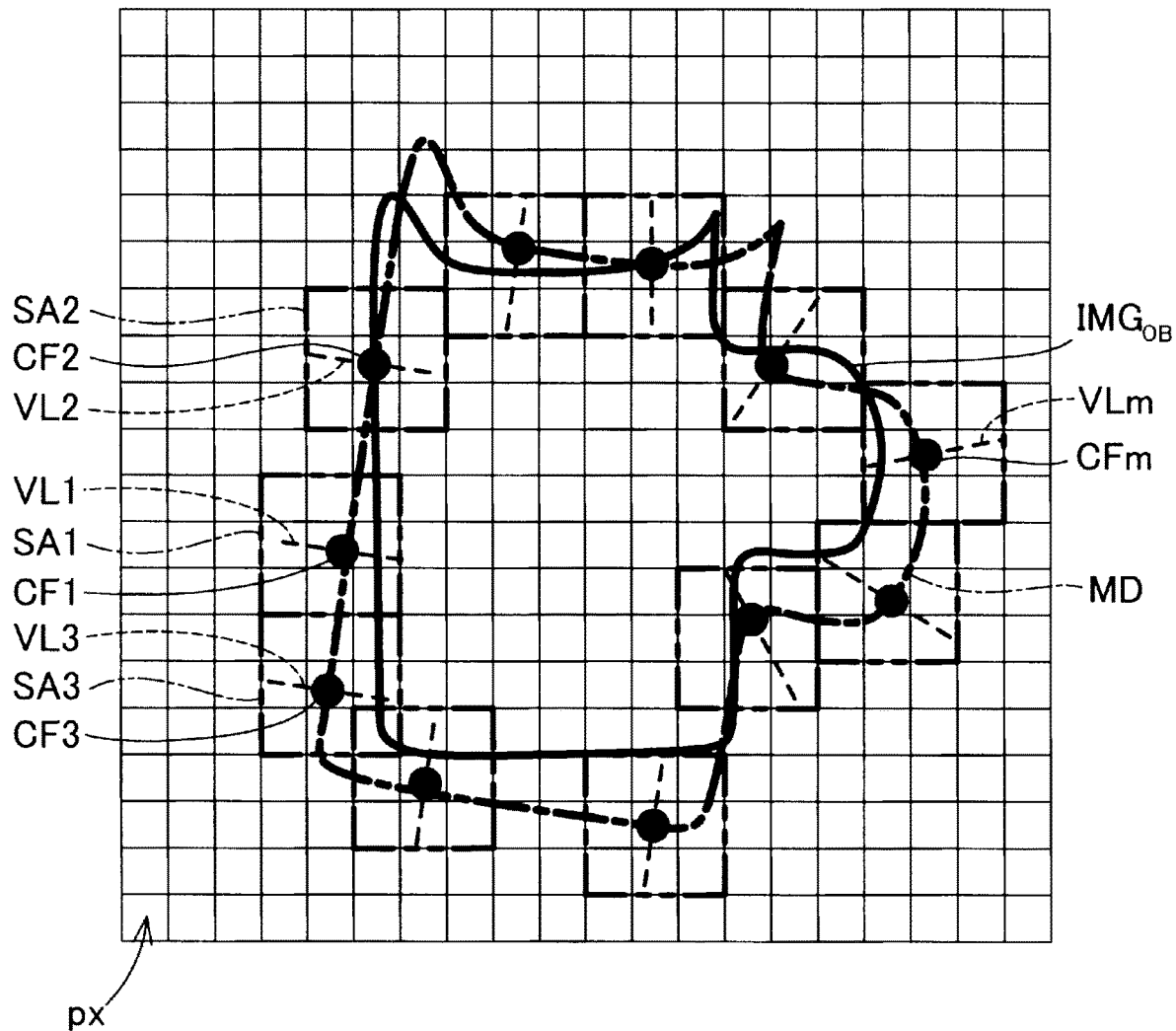
FIG. 13 is a diagram illustrating an example of computation of CF similarity in a second embodiment.
Figure 14:
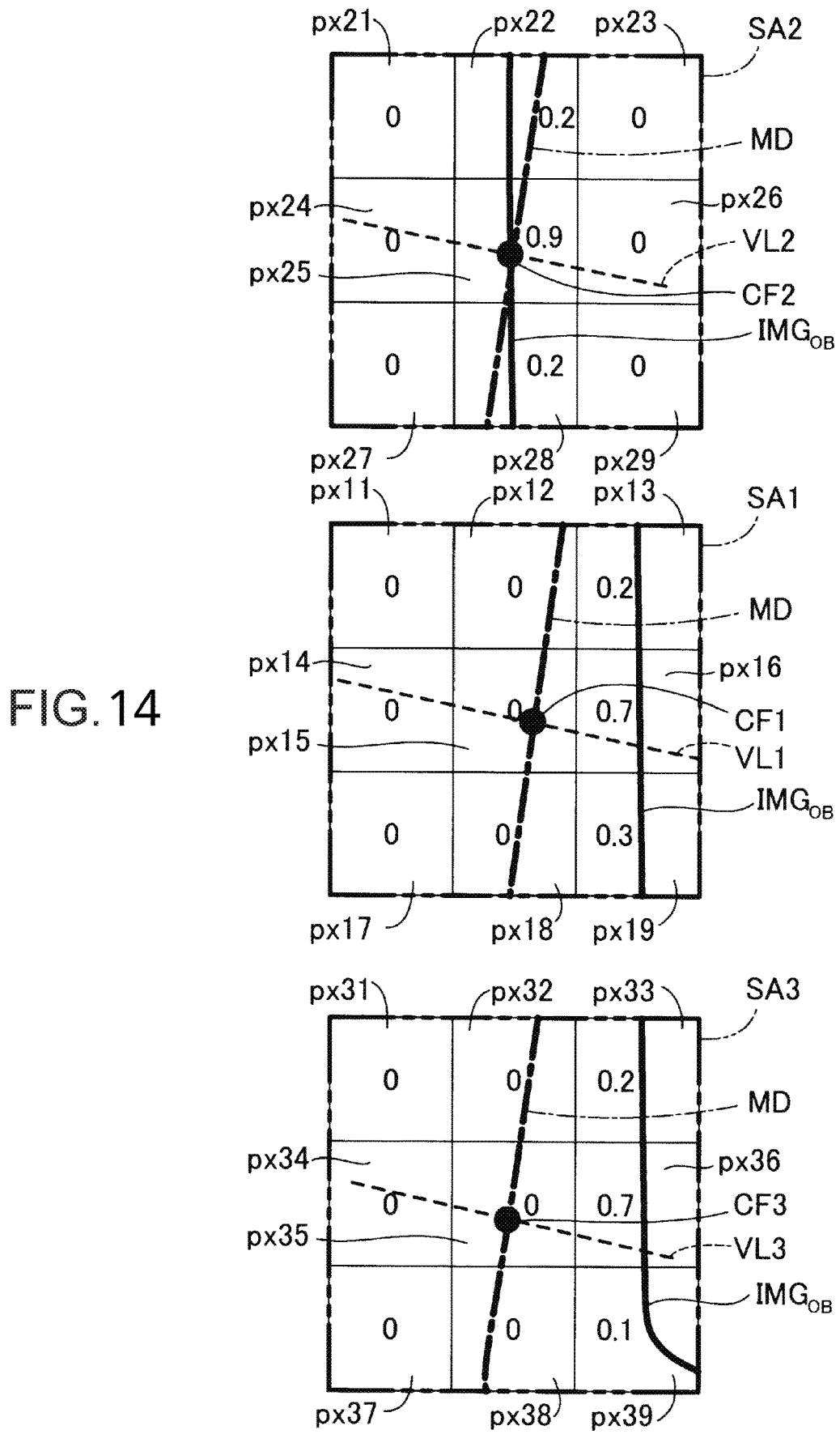
FIG. 14 is a diagram illustrating an example of computation of CF similarity in the second embodiment.
Figure 15:
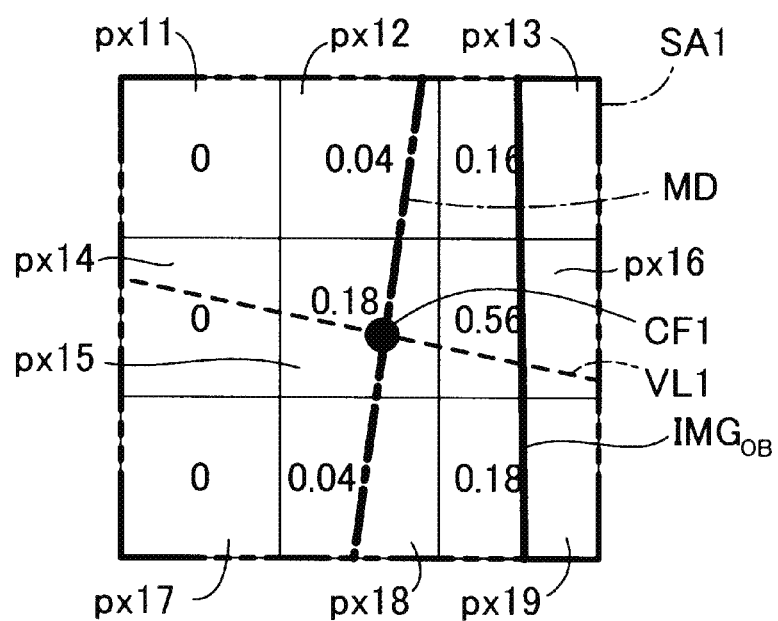
FIG. 15 is a diagram illustrating an example of computation of CF similarity in the second embodiment.

FIGS. 13 to 15 are diagrams illustrating an example of computation of CF similarity in the second embodiment. FIG. 13 further illustrates perpendicular lines VLm which are perpendicular to a contour of a 2D model MD at respective contour features CFm compared with FIG. 10. For example, the perpendicular line VL1 illustrated in FIG. 13 is perpendicular to the contour of the 2D model MD at the contour feature CF1. The perpendicular line VL2 is perpendicular to the contour of the 2D model MD at the contour feature CF2. The perpendicular line VL3 is perpendicular to the contour of the 2D model MD at the contour feature CF3.

In the same manner as in the first embodiment, the location-correspondence determination unit 168 selects the contour feature CF1 as one of the plurality of contour features CFm, and extracts the region SA1 of 3 pixels×3 pixels centering on a pixel px including the contour feature CF1. Next, the location-correspondence determination unit 168 extracts the region SA2 and the region SA3 of 3 pixels×3 pixels respectively centering on the two contour features such as the contour feature CF2 and the contour feature CF3 which are adjacent to the contour feature CF1. The location-correspondence determination unit 168 allocates a score to each pixel px forming each of the regions SA1, SA2 and SA3. In the second embodiment, as described above, a method of the location-correspondence determination unit 168 allocating scores to the regions SA1, SA2 and SA3 is different from the first embodiment.

Hereinafter, a description will be made focusing on a region SA1. The location-correspondence determination unit 168 assumes the perpendicular line VL1 which is perpendicular to a model contour at a 2D model point through the 2D model point represented by the contour feature CF1 in the region SA. The location-correspondence determination unit 168 sets a score of each pixel px (each image point) for the contour feature CF1 by using a plurality of Gaussian functions each of which has the center on the perpendicular line VL1 and which are distributed in a direction (also referred to as a main axis) perpendicular to the line segment VL1. Coordinates the pixel px are represented by integers (m,n), but, in the present embodiment, the center of the pixel px overlapping the perpendicular line VLm is represented by (m+0.5,n+0.5), and a second perpendicular line drawn from the center thereof to the perpendicular line VLm is used as the main axis. Similarity scores of a pixel px overlapping the perpendicular line VL1 and a pixel px overlapping the main axis are computed as follows. First, with respect to the pixel px on the perpendicular line VL1, a value of the central portion of a Gaussian function obtained as a result of being multiplied by a weighting factor which is proportional to a similarity score of the pixel px is used as a new similarity score. Here, the variance of the Gaussian function is selected so as to be proportional to a distance from the contour feature CF1. On the other hand, with respect to the pixel px on the main axis of each Gaussian function, a value of each Gaussian function having a distance from an intersection (the center) between the perpendicular line VL1 and the main axis as a variable, is used as a new similarity score. As a result, for example, the location-correspondence determination unit 168 allocates respective scores of 0.2, 0.7, and 0.3 to the pixels px13, px16 and pixel 19 included in an image $IMG_{OB}$ of the target object although the pixels have almost the same gradient, as illustrated in FIG. 14. This is because distances from the perpendicular line VL1 to the respective pixels px are different from each other.

Next, the location-correspondence determination unit 168 locally smooths the similarity scores in the same manner as in the first embodiment. The regions SA1, SA2 and SA3 are multiplied by the same weighting factors as in the first embodiment, and thus a corrected score of each pixel forming the region SA1 is calculated. The location-correspondence determination unit 168 determines the maximum score among corrected scores of the pixels forming the region SA1, obtained as a result of the calculation, as the score indicating the correspondence with the contour feature CF1. In the example illustrated in FIG. 15, the location-correspondence determination unit 168 determines 0.56 of the pixel px16 as the score.

C. THIRD EMBODIMENT

In the present embodiment, the location-correspondence determination unit 168 modifies Equation (11) regarding similarity scores into an equation for imposing a penalty on an image point separated from a perpendicular line which is perpendicular to a model contour. The location-correspondence determination unit 168 defines a model point p and an image point p', a unit length vector which is perpendicular to an edge orientation (contour) of a 2D model as a vector $E_p$, and defines the following Equation (17).

$$\vec{\Delta p} = p' - p \quad (17)$$

If the following Equation (18) is defined by using a weighting factor indicated by w, similarity scores between model points and image points may be expressed as in Equation (19).

$$w(\vec{\Delta p}) = e^{-\left(\|\Delta p\|^2 - \vec{\Delta p} \cdot \vec{E_p}\right)/\sigma^2} \quad (18)$$

$$SIM(p, p') = w(\vec{\Delta p}) \left| \vec{E_p} \cdot \vec{\nabla} I_{p'} \right| / \max_{q \in N(p)} \left\| \vec{\nabla} I_p \right\| \quad (19)$$

Next, the location-correspondence determination unit 168 locally smooths a similarity score of each pixel px in the regions SA1, SA2 and SA3, obtained by using Equation (19), according to the same method as in the first embodiment, and then establishes correspondences between the image points and the contour features CF in each of the regions SA1, SA2 and SA3.

D. MODIFICATION EXAMPLES

The invention is not limited to the above-described embodiments, and may be implemented in various aspects within the scope without departing from the spirit thereof. For example, the following modification examples may also occur.

D-1. Modification Example 1

In the above-described first and second embodiments, the location-correspondence determination unit 168 computes scores within a region of 3 pixels×3 pixels centering on the contour feature CFm so as to establish a correspondence to a 2D point, but various modifications may occur in a method of computing scores in establishing the correspondences. For example, the location-correspondence determination unit 168 may compute scores within a region of 4 pixels×4 pixels. The location-correspondence determination unit 168 may establish the correspondences between 2D points by using evaluation functions other than that in Equation (11).

In the above-described first embodiment, the location-correspondence determination unit 168 and the optimization unit 166 estimates a pose of an imaged target object by using the CF method, but may estimate a pose of the target object in combination of the CF method and the MA method of the comparative example. The MA method works in a case where the two-color base is established in a target object and a background. Therefore, the location-correspondence determination unit 168 and the optimization unit 166 may select either the CF method or the MA method in order to estimate a pose of a target object according to a captured image. In this case, for example, the location-correspondence determination unit 168 first estimates a pose of a target object according to the MA method. In a case where estimation of a pose of the target object using the MA method does not converge, the location-correspondence determination unit 168 may perform pose estimation again on the basis of an initial pose of the target object by using an algorithm of the CF method. The location-correspondence determination unit 168 can estimate a pose of a target object with higher accuracy by using the method in which the MA method and the CF method are combined, than in a case where an algorithm of only the MA method is used or a case where an algorithm of only the CF method is used.

In the above-described embodiments, one or more processors, such as the CPU 140, may derive and/or track respective poses of two or more target objects within an image frame of a scene captured by the camera 60, using templates (template data) created based on respective 3D models corresponding to the target objects. According to the embodiments, even when the target objects moves relative to each other in the scene, these poses may be derived and/or tracked at less than or equal to the frame rate of the camera 60 or the display frame rate of the right/left optical image display unit 26/28.

The template may include information associated with the target object such as the name and/or geometrical specifications of the target object, so that the one or more processors display the information on the right/left optical display unit 26/28 or present to external apparatus OA through the interface 180 once the one or more processors have derived the pose of the target object.

The invention is not limited to the above-described embodiments or modification examples, and may be implemented using various configurations within the scope without departing from the spirit thereof. For example, the embodiments corresponding to technical features of the respective aspects described in embodiments and in the modification examples may be exchanged or combined as appropriate in order to solve some or all of the above-described problems, or in order to achieve some or all of the above-described effects. In addition, if the technical feature is not described as an essential feature in the present specification, the technical feature may be deleted as appropriate.

The entire disclosure of Japanese Patent Application No. 2016-065733, filed on Mar. 29, 2016, is expressly incorporated by reference herein.

E. 3D TRACKING OBJECTS USING INERTIAL SENSOR (IMU) AND CAMERA SENSOR

The invention is not limited to the above-described embodiments, and the below-described embodiments are also within the scope without departing from the spirit thereof.

The embodiments discussed above via section headers A-E relate to FIGS. 1-15 which relate to a HMD 100 including (but not limited to) a camera 60 for estimating a pose, and the below embodiments to FIGS. 16-28 which relate to a HMD 100' which includes (but is not limited to) a camera 60 and an inertial sensor 71 for estimating a pose in a new and improved manner. The below embodiments improve accuracy and speed of object tracking by using multiple sensors and fusing data of the sensors together. Various embodiments are discussed below.

E-1. Introduction

Augmented reality (AR) integrates digital information from live video and a user's environment in real time. The three requirements in AR applications has been summarized as follows:

(1) It is interactive in real time,
(2) It is three dimensional ("3D"), and
(3) It combines real elements with virtual elements.

A great number of technologies on computer vision and image processing have been studied in order to meet these requirements. Some AR applications do not require accurate 3D object pose so rendering augmented information in video overlay mode does not cause any issues, such as "hovering" augmented information over a book for educational applications.

However, many AR applications require low latency (e.g., less than 15 mm/s) and accurate 3D object pose, such as industrial, military and medical AR applications. Latency relates to the speed of the pose, when movement occurs of an object from an initial position to a second position, to move the pose from the initial location to the second location.

Figure 16A:
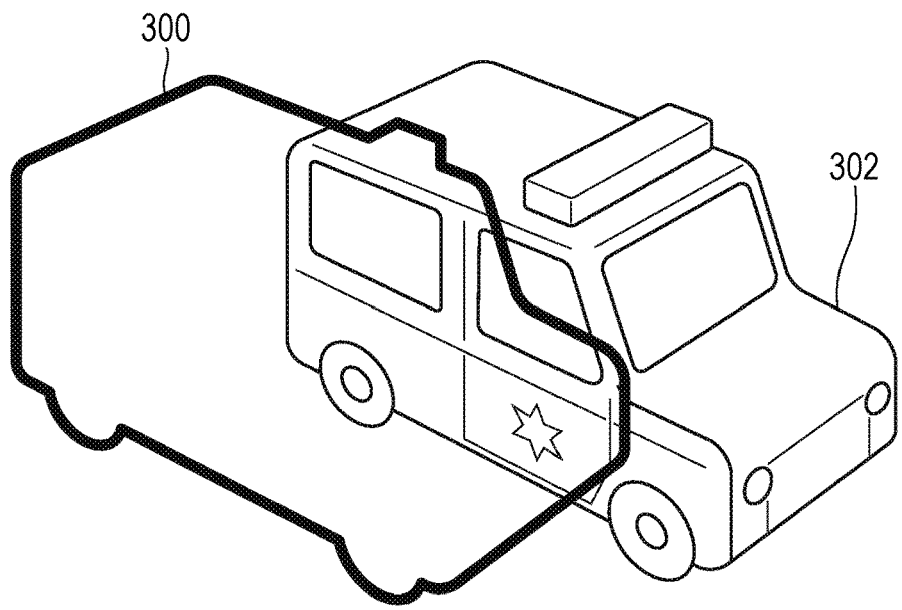
FIG. 16A is a diagram illustrating high latency between a pose and an object in an AR application, according to an embodiment.

In the below-described embodiments, a 3D object tracking system is described which may be implemented in head-mounted displays for AR applications. However, the latency of the 3D object tracking may be too high for some AR applications as shown in FIG. 16A, which shows that, when an object 302 has initially moved relative to the viewpoint of the user, the pose 300 is delayed from continuing to overlay on the object 302. Instead the pose is temporarily out of place (i.e., not overlaying over the object 302). In addition, the 3D object tracking is easy to get lost when user moves faster or when user moves to the object views where less feature points exist. High latency, user moving speed limitations, and losing tracking frequently greatly impacts the user experience of using head-mounted displays for optical see-through AR applications.

Figure 16B:
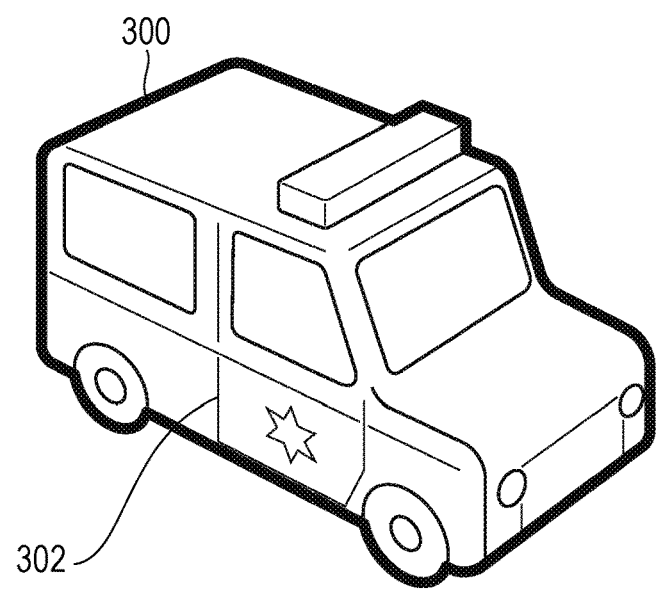
FIG. 16B is a diagram illustrating low or no latency between a pose and an object in an AR application, according to an embodiment.

FIG. 16(b) shows when latency is reduced so that when the object 302 has initially moved relative to the viewpoint of the user, the pose 300 is not delayed and thus is perceived by the user's eyesight to be continually overlaying the object 302.

According to various aspects of the present disclosure, to avoid the above-described issues and reduce latency, a head-mounted display may be equipped an inertial motion unit ("IMU") sensor with a gyro sensor and an accelerometer. In order to reduce latency and therefore improve the 3D object tracking performance, the IMU sensors and camera sensor are "fused" or the data of the IMU sensors and camera sensor are combined together. An IMU sensor may be used because it operates at a much higher frequency (e.g., 125 Hz, 250 Hz, 1 MHz, etc.) than a camera, and the latency of a human eye is around 15 ms. As such, ideally, it is preferred to reduce the latency of the system to less than 15 ms.

It should be understood that the each term of "IMU sensor," "gyro sensor" and/or "accelerometer" corresponds to "inertial sensor" throughout this disclosure.

In one embodiment, the head-mounted display is equipped with an IMU sensor (3-axis accelerometer and 3-axis gyroscope) as the motion sensor, as discussed above and throughout this application. However, in another embodiment, the head-mounted display may be equipped a 3-axis magnetic sensor besides or in addition to the accelerometer and gyroscope. In this regard, the IMU sensor may include an accelerometer, a gyro sensor and/or a magnetic sensor. In one embodiment, only the accelerometer and gyro sensor are used in the algorithm. However, in another embodiment, a magnetic sensor can be used to further improve the fusion accuracy, and so the magnetic sensor could be added (and the algorithm is corresponding changed) to the accelerometer and gyro sensor.

It should be understood, however, that the present invention should not be limited to the above embodiments of using an IMU sensor including accelerometer, gyroscope and/or a magnetic sensor in detecting motion, and may employ any other type of motion sensor or motion sensing system(s) which is capable of detecting motion along 3-axis.

Also, one or more of the motion sensors or motion sensing systems may be used in a single HMD device to further reduce the latency. For example, these motion sensors or motion sensing systems could be staggered to output a pose at different times. In this regard, each sensor/system provides a pose at a time when the other sensors are not outputting a pose, to thereby reduce the overall latency.

The motion sensors or motion sensing systems herein may operate at 125 Hz according to one embodiment. However, in other embodiments, the motion sensors or motion sensing systems may operate at lower or higher frequencies than 125 Hz.

E-2. IMU and 3D Object Tracking Fusion

In this disclosure, one or more non-linear filters, such as an Extended Kalman Filter (EKF), a particle filter, an unscented Kalman filter (UKF), a maximum likelihood nonlinear system estimation or the like, may be used to fuse data from an IMU sensor and an camera sensor in a single HMD system. An example of using EKF for sensor fusion is provided in Gabriele Ligorio and Angelo Maria Sabatini, "Extended Kalman Filter-Based Methods for Pose Estimation Using Visual, Inertial and Magnetic Sensors: Comparative Analysis and Performance Evaluation", Sensor 2013, 13, 1919-1941, which is incorporated herein in its entirety. While Ligorio et al. discuss a basic concept of using EKF for sensor fusion, sensor quality varies between sensors, and thus, the methods for fusing data from different types of sensors used by vision with different sensors may be different, and fusing data of different sensors encounters different challenges and issues. It is disclosed herein how to fuse an IMU sensor and a camera sensor using the 3D vision tracking technology to improve 3D object tracking performance and efficiency. In this disclosure, the details of such a fusion framework are presented, problems and solutions are discussed, and finally performance evaluation results are shown.

It is noted that the terms "fuse" or "fusion" when used in relation to deriving a pose of an object, whether in motion or static, relates to a process of using data from at least one sensor and a camera (or other imaging device) in deriving the pose, such as deriving a pose by analysis and/or combining of data from an IMU sensor and a camera relates to fusion of the IMU sensor and the camera.

E-2-1. Overview

E-2-1-1. System

Figure 17:
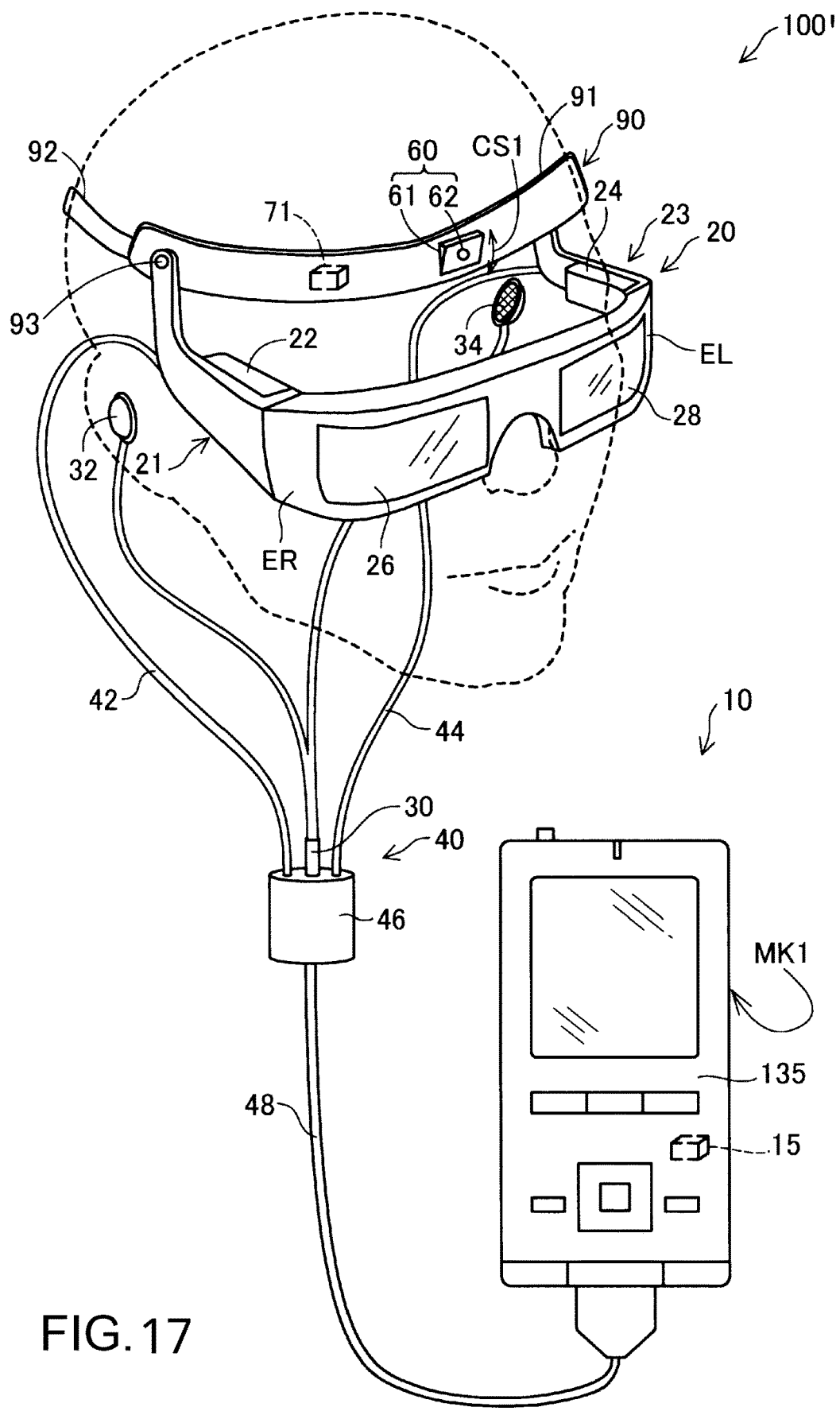
FIG. 17 is a diagram illustrating a schematic configuration of an HMD with an inertial sensor and a camera sensor, according to an embodiment.

FIG. 17 is a diagram illustrating a schematic configuration of an HMD 100' according to various embodiments. It is noted that FIG. 17 is similar to FIG. 5 but is a different embodiment and, while many of the features of FIG. 5 may be similar or duplicative of FIG. 17, all of the features of FIG. 17 are described below.

The HMD 100' is a head mounted display according to the illustrative embodiments (but the embodiments of the invention should not be limited to a head mounted display and can be embodied in other devices, such as a mobile phone). Similar to HMD 100 of FIG. 5, the HMD 100' is also an optical transmission type head mounted display which enables a user to view a virtual image and to simultaneously view outside scenery directly. The HMD 100' includes a camera 60 that collects image data from the outside scenery so that the HMD 100' can display relevant virtual images.

In this embodiment, the HMD 100' includes a fitting band 90 that is fitted on the head of a user, a display portion 20 that displays images, and a controller 10 that controls the display portion 20. The display portion 20 enables the user to view a virtual image when the display portion 20 is fitted on the head of the user.

The fitting band 90 includes a fitting base portion 91 formed, in this embodiment, of a resin, a fabric belt portion 92 connected to the fitting base portion 91, a camera 60, and an inertial sensor (Inertial Measurement Unit; IMU) 71. The fitting base portion 91 has a curved shape matched to a person's forehead. The belt portion 92 is a belt that is fitted around the head of the user. In other embodiments, the camera 60 and IMU 71 are directly integrated with a frame of display portion 20.

While FIG. 17 illustrates the fitting band 90, it should be understood that the present invention is not limited to requiring the fitting band 90. Indeed, in such embodiments, the elements in the fitting band 90, including camera 60 and IMU 71 may be integrated in or disposed onto a frame of display portion 20, the display portion 20 itself, and/or any other portion of the HMD 100'. As such, in som e embodiments, the fitting band 90 may not be included in HMD 100', but for ease of illustration and discussion, the below embodiments describe the fitting band 90 as part of the HMD 100'.

The camera 60 can image outside scenery and is disposed in a middle portion of the fitting base portion 91 in the illustrated embodiment of FIG. 17. In other words, the camera 60 is disposed at a position corresponding to the middle of the forehead of the user in a state in which the fitting band 90 is fitted on the head of the user. Therefore, in the state in which the user fits the fitting band 90 on the head of the user, the camera 60 images outside scenery which is external scenery in a visual line direction of the user and acquires a captured image by imaging.

In this embodiment, the camera 60 includes a camera base portion 61 that is rotated with respect to the fitting base portion 91 and a lens portion 62 of which a relative position to the camera base portion 61 is fixed. When the fitting band 90 is fitted on the head of the user, the camera base portion 61 is disposed to be rotatable along an arrow CS1 which is a predetermined range of an axis included in a plane including a central axis of the user. Therefore, the direction of an optical axis of the lens portion 62 which is an optical axis of the camera 60 can be changed within the range of the arrow CS1. The lens portion 62 images a range which is changed by zoom about the optical axis.

The IMU 71 is an inertial sensor that detects acceleration. In some embodiments, the IMU 71 can detect an angular velocity and geomagnetism using a gyro sensor and a magnetic sensor in addition to acceleration. In this embodiment, the IMU 71 is contained in the fitting base portion 91, but, in other embodiments, as discussed above, the IMU 71 may be disposed at any other portion of the HMD 100' such as the display portion frame. Therefore, in the embodiment where the IMU 71 is contained in the fitting base portion 91, the IMU 71 detects acceleration, angular velocities, and geomagnetism of the fitting band 90 and the camera base portion 61. Therefore, in the embodiment where the IMU 71 is disposed in a portion of the display portion frame of the HMD 100', the IMU 71 detects acceleration, angular velocities, and geomagnetism of the display portion frame and the camera base portion 61. In either event, the IMU 71 detects acceleration, angular velocities, and geomagnetism of the user's head.

Since a relative position of the IMU 71 to the fitting base portion 91 is fixed, the camera 60 is movable with respect to the IMU 71. Thus, IMU 71 has an adjustably fixed spatial relationship with camera 60. In another embodiment, IMU 71 may have a fixed spatial relationship with camera 60. Further, since a relative position of the display portion 20 to the fitting base portion 91 is fixed, a relative position of the camera 60 to the display portion 20 is movable.

The display portion 20 is connected to the fitting base portion 91 of the fitting band 90 and has a glasses shape in this embodiment. The display portion 20 includes a right holder 21, a right display driver 22, a left holder 23, a left display driver 24, a right optical image display 26, and a left optical image display 28. The right optical image display 26 and the left optical image display 28 are located in front of the right and left eyes of the user when the display portion 20 is fitted on the user. One end of right optical image display 26 and one end of left optical image display 28 are connected to each other at a position corresponding to the middle of the forehead of the user when the display portion 20 is fitted on the user.

The right holder 21 has a shape which extends from an end portion ER which is the other end of the right optical image display 26 in a substantially horizontal direction and is inclined upward obliquely from the middle of the shape and connects the end portion ER to a right connector 93 of the fitting base portion 91. Similarly, the left holder 23 has a shape which extends from an end portion EL which is the other end of the left optical image display 28 in a substantially horizontal direction and is inclined upward obliquely from the middle of the shape and connects the end portion EL to a left connector (not illustrated) of the fitting base portion 91. The right holder 21 and the left holder 23 are connected to the fitting base portion 91 by the right and left connectors 93, and thus the right optical image display 26 and the left optical image display 28 are located in front of the eyes of the user. The connectors 93 connect the right holder 21 and the left holder 23 to be rotatable and fixable at any rotation positions. As a result, the display portion 20 is installed to be rotatable with respect to the fitting base portion 91 in this embodiment.

The right holder 21 is a member installed to extend from the end portion ER which is the other end of the right optical image display 26 to a position corresponding to a temporal region of the user when the display portion 20 is fitted on the user. Similarly, the left holder 23 is a member installed to extend from the end portion EL which is the other end of the left optical image display 28 to a position corresponding to a temporal region of the user when the display portion 20 is fitted on the user. In this embodiment, the right display driver 22 and the left display driver 24 are disposed on sides facing the head of the user when the display portion 20 is fitted on the user.

The display drivers 22 and 24 include liquid crystal displays 241 and 242 (hereinafter also referred to as "LCDs 241 and 242") and projection optical systems 251 and 252 to be described below with respect to FIG. 18. The details of the configurations of the display drivers 22 and 24 will be described below.

The optical image displays 26 and 28 include light-guiding plates 261 and 262 (see FIG. 18) and light adjustment plates to be described below. The light-guiding plates 261 and 262 are formed of a light transmission resin material or the like and guide image light output from the display drivers 22 and 24 to the eyes of the user. In some embodiments, image displays 26 and 28 include prisms in addition to or substituting light guiding plates 261 and 262. The light adjustment plates are optical elements with a thin plate shape and are disposed to cover the front side of the display portion 20 which is an opposite side to the side of the eyes of the user. By adjusting light transmittance of the light adjustment plates, it is possible to adjust the amount of external light entering the eyes of the user and adjust easiness of view of a virtual image. This may be useful to adjust for varying lighting conditions (e.g. indoor v. outdoor lighting levels) while maintaining visibility of the virtual image.

The display portion 20 further includes a connection portion 40 connecting the display portion 20 to the controller 10. The connection portion 40 includes a body cord 48 connected to the controller 10, a right cord 42, a left cord 44, and a connection member 46. The right cord 42 and the left cord 44 are two branched cords of the body cord 48. The display portion 20 and the controller 10 transmit various signals via the connection portion 40. In the right cord 42, the left cord 44, and the body cord 48, for example, a metal cable or an optical fiber can be used.

Figure 18:
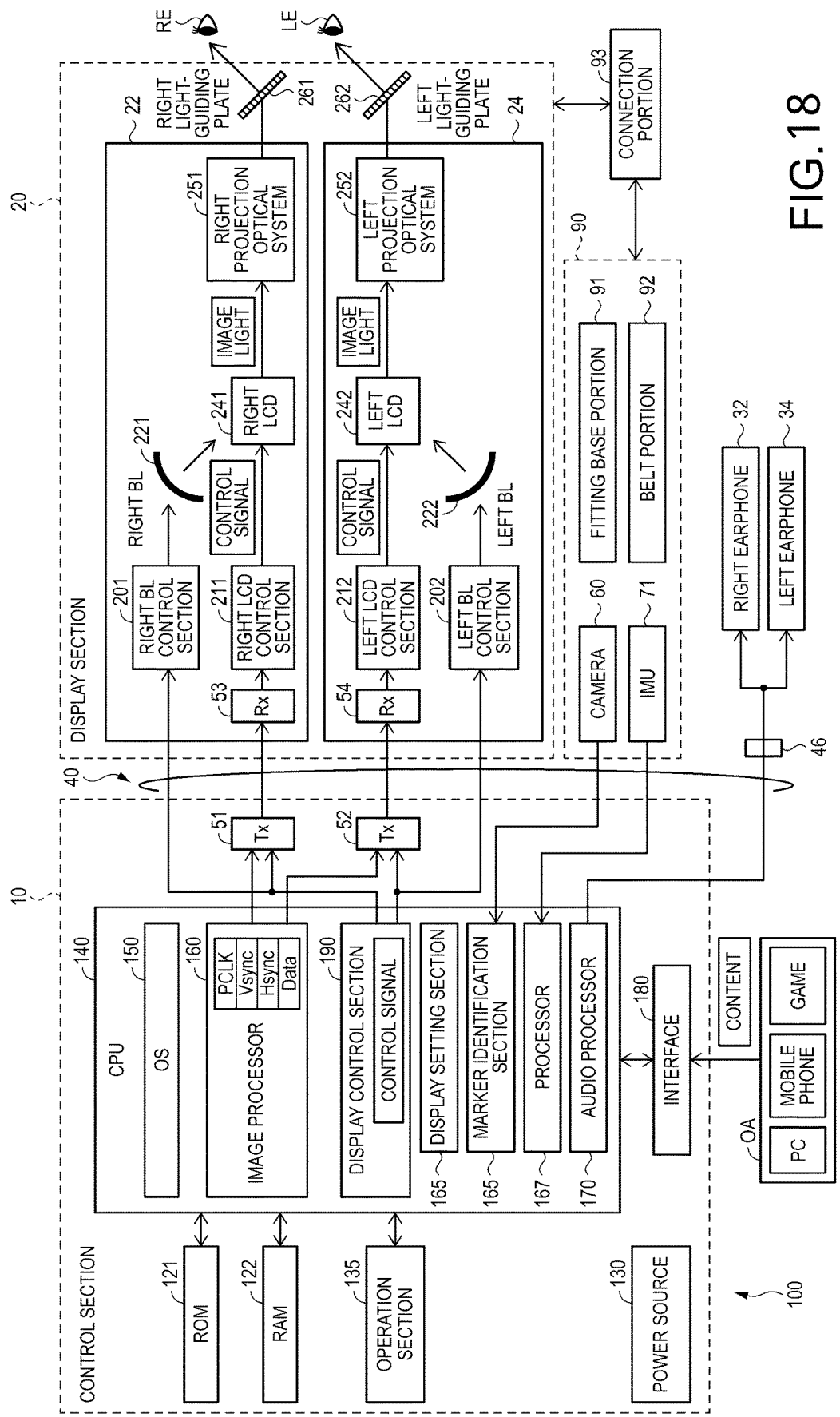
FIG. 18 is a block diagram illustrating a functional configuration of the HMD of FIG. 17, according to an embodiment.

FIG. 18 is a block diagram illustrating a functional configuration of the HMD 100'. As illustrated in FIG. 18, the controller 10 includes a ROM 121, a RAM 122, a power source 130, the operation section 135, an identification target storage section 139, a CPU 140, an interface 180, a transmission section 51 (Tx 51), and a transmission section 52 (Tx 52).

The power source 130 feeds power to each section of the HMD 100'. The ROM 121 stores various programs. The CPU 140 executes various programs by loading the various programs stored in the ROM 121 on the RAM 122.

The interface 180 is an input and output interface that connects various external devices OA which are content supply sources to the controller 10. Examples of the external devices OA include a storage device storing an AR scenario, a personal computer (PC), a mobile phone terminal, and a game terminal. Examples of the interface 180 include a USB interface, a micro USB interface, a memory card interface, and a video interface (e.g. DisplayPort, HDMI, etc. . . . ).

The CPU 140 loads programs stored in the ROM 121 on the RAM 122 to function as an operating system 150 (OS 150), a display controller 190, an audio processor 170, an image processor 160, a marker identification section 165, and a processor 167.

The display controller 190 generates control signals to control the right display driver 22 and the left display driver 24. The display controller 190 controls generation and emission of image light in accordance with each of the right display driver 22 and the left display driver 24. The display controller 190 transmits control signals for the right LCD controller 211 and the left LCD controller 212 via the transmission sections 51 and 52, respectively. The display controller 190 transmits control signals for a right backlight controller 201 and a left backlight controller 202.

As illustrated in FIG. 18, the display portion 20 includes the right display driver 22, the left display driver 24, the right light-guiding plate 261 serving as the right optical image display 26, and the left light-guiding plate 262 serving as the left optical image display 28.

The right display driver 22 includes the reception section 53 (Rx 53), a right backlight controller 201, a right backlight 221, a right LCD controller 211, the right LCD 241, and the right projection optical system 251. The right backlight controller 201 and the right backlight 221 function as a light source. The right LCD controller 211 and the right LCD 241 function as a display element. In another embodiment, instead of the foregoing configuration, the right display driver 22 may include a spontaneous emission type display element such as an organic EL display element or may include a scan type display element that scans an optical beam from a laser diode on a retina. The same also applies to the left display driver 24.

The reception section 53 functions as a receiver that performs serial transmission between the controller 10 and the display portion 20. The right backlight controller 201 drives the right backlight 221 based on an input control signal. The right backlight 221 is, for example, an emitter such as an LED or an electroluminescence (EL). The right LCD controller 211 drives the right LCD 241 based on control signals transmitted from the image processor 160 and the display controller 190. The right LCD 241 is a transmission type liquid crystal panel in which a plurality of pixels is arrayed in a matrix form.

The right projection optical system 251 is configured to include a collimating lens that forms image light emitted from the right LCD 241 as a light flux in a parallel state. The right light-guiding plate 261 serving as the right optical image display 26 guides the image light output from the right projection optical system 251 to the right eye RE of the user while reflecting the image light along a predetermined light path. The left display driver 24 has the same configuration as the right display driver 22 and corresponds to the left eye LE of the user, and thus the description thereof will be omitted.

The image processor 160 acquires an image signal included in content and transmits the acquired image signal to reception sections 53 and 54 of the display portion 20 via the transmission sections 51 and 52. The audio processor 170 acquires an audio signal included in the content, amplifies the acquired audio signal, and supplies the amplified audio signal to a speaker (not illustrated) inside the right earphone 32 and a speaker (not illustrated) inside the left earphone 34 connected to the connection member 46.

The controller 10 is a device that controls the HMD 100'. In some embodiments, controller 10 is integrated into the display portion 20 and/or the fitting band 90. In other embodiments, controller 10 is implemented on a separate computer. The controller 10 includes an operation section 135 that includes an electrostatic track pad or a plurality of buttons which can be pressed and can be used for calibration in imaging. The operation section 135 is disposed on the front surface of the controller 10. In other embodiments, a portion of operation section 135, or the entirety thereof, is disposed on a frame of display portion 20 and/or fitting band 90.

After the calibration of each sensors included in the IMU 71 is performed, detected values (measured outputs) of the acceleration, the angular velocity, and the geomagnetism of the sensors in the IMU 71 are fused, and thus high precise IMU orientation can be obtained. This fusion means that measured movement values from the sensors are merged with predicted values in order to provide a smoother and more accurate final sensor output.

E-2-1-2. Overview of Method of Sensor Fusion

Figure 19:
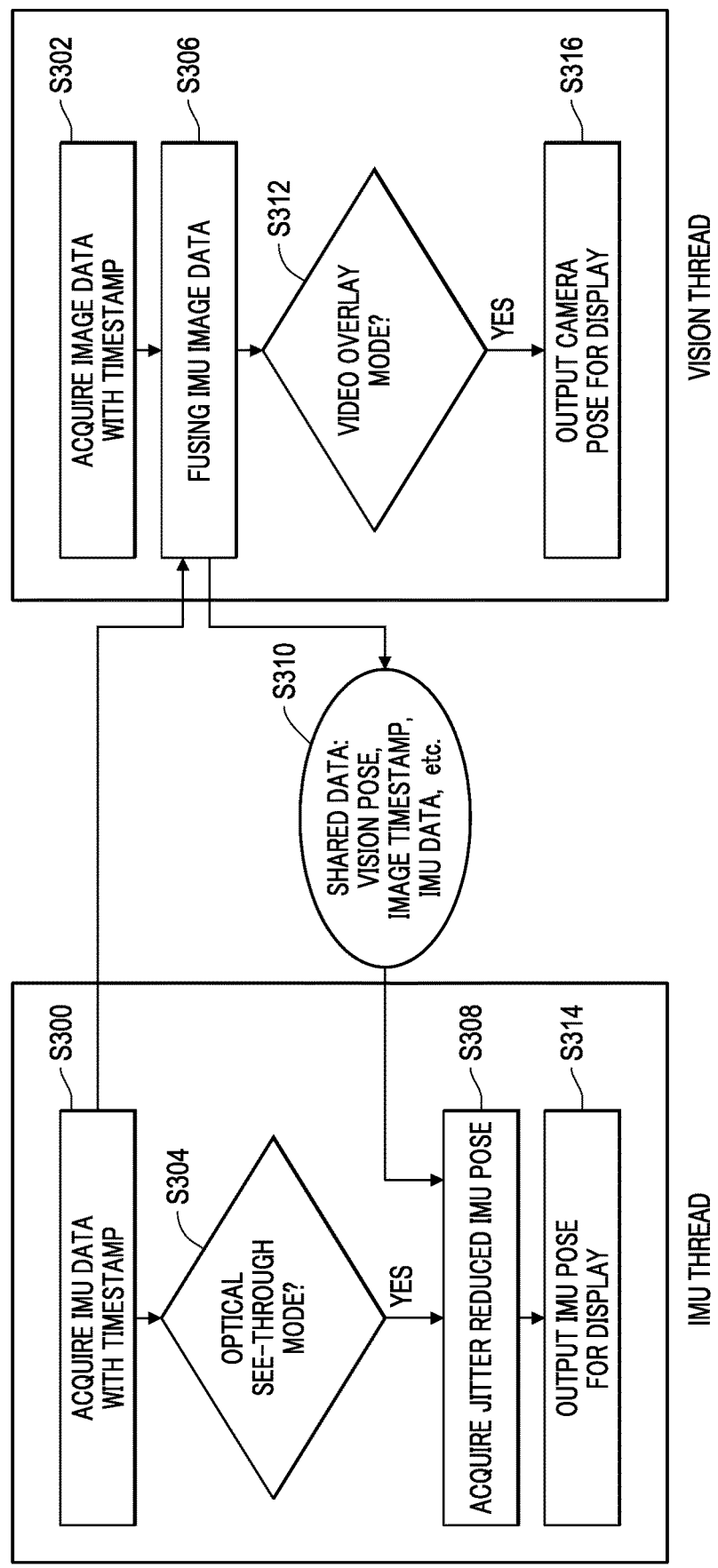
FIG. 19 is a flow chart fusion illustrating fusing of sensor data with image data, according to an embodiment.

According to the embodiment in FIG. 19, the CPU 140 operates two separate threads, one processing data from the IMU 71 and one processing data from the camera 60. Information is exchanged between the two threads in order to fuse the camera data and the IMU data. The fusion of the camera data and the IMU data allows for more accurate object location tracking because the IMU data can be processed much more quickly (e.g. at 125 Hz) than the image data (e.g. 30 fps or 30 Hz). Thus, there will be less latency in the object tracking.

It should be understood that the term "camera data" may refer to data taken by a camera 60, but should not be limited to camera and can be taken by any other imaging device. As such the term "camera data" should not be limited to data taken only by a camera. As such, the term "camera data" may be referred to herein as "image data."

Similarly, it should be understood that the term "IMU data" may refer to data taken by an IMU 71, but should not be limited to an IMU and can be obtained by other motion sensing devices. As such, the term "IMU data" should not be limited to data obtained only by an IMU. Accordingly, the term "IMU data" may be referred to herein as "sensor data."

Referring still to FIG. 19, fusion is accomplished by placing timestamps on both the sensor data and the image data. This way, a precise timing of both the sensor data and the image data is known and they can be matched to each other, resulting in fusion of data from the same time. Thus, in steps S300 and S302, IMU data and image data are acquired with timestamps. Subsequently image data and IMU data are fused in the vision thread in step S306. Step S306 is discussed in more detail in FIG. 20 later.

In the IMU thread, S304 confirms that the HMD is in see-through mode. See-through mode is a mode in which the user simultaneously views the external environment and virtual image data. In some embodiments, the HMD 100' is capable of operating in a non-see-through mode, in which the display area is covered by a virtual image and the user is intended to focus solely on the virtual image. Once see-through mode is confirmed, the fused data from S306 is transmitted from the vision thread to the IMU thread in S310.

One downside of using the sensor data to track movement (as compared to image data) is that it can include jitter. This jitter may be caused by limited precision of the IMU 71 and normally occurring outliers in measured movement. For example, the IMU 71 may be coincidentally measuring acceleration during a fraction of a second when the user's head jerks. This could be logged as a sudden and extreme movement by the IMU 71. This problem is solved by steps S306, S310, and S308. By fusing the sensor data with the image data and reintroducing the fused data in the IMU thread, these jitters are reduced in amplitude or eliminated, resulting in much smoother movement tracking. With this smoothed sensor data, the IMU thread finally outputs the IMU pose, or predicted object location, in step S314. In other words, if the HMD 100' is tracking a moving real-world object with, e.g., an "information bubble," the information bubble will be moved in the image display (and in the user's view) to follow the moving real-world object by an amount based on the prediction that is output in S314.

E-2-2. Tracker Fusing IMU

E-2-2-1. Method of Fusing IMU with 3D Object Tracker

Figure 20:
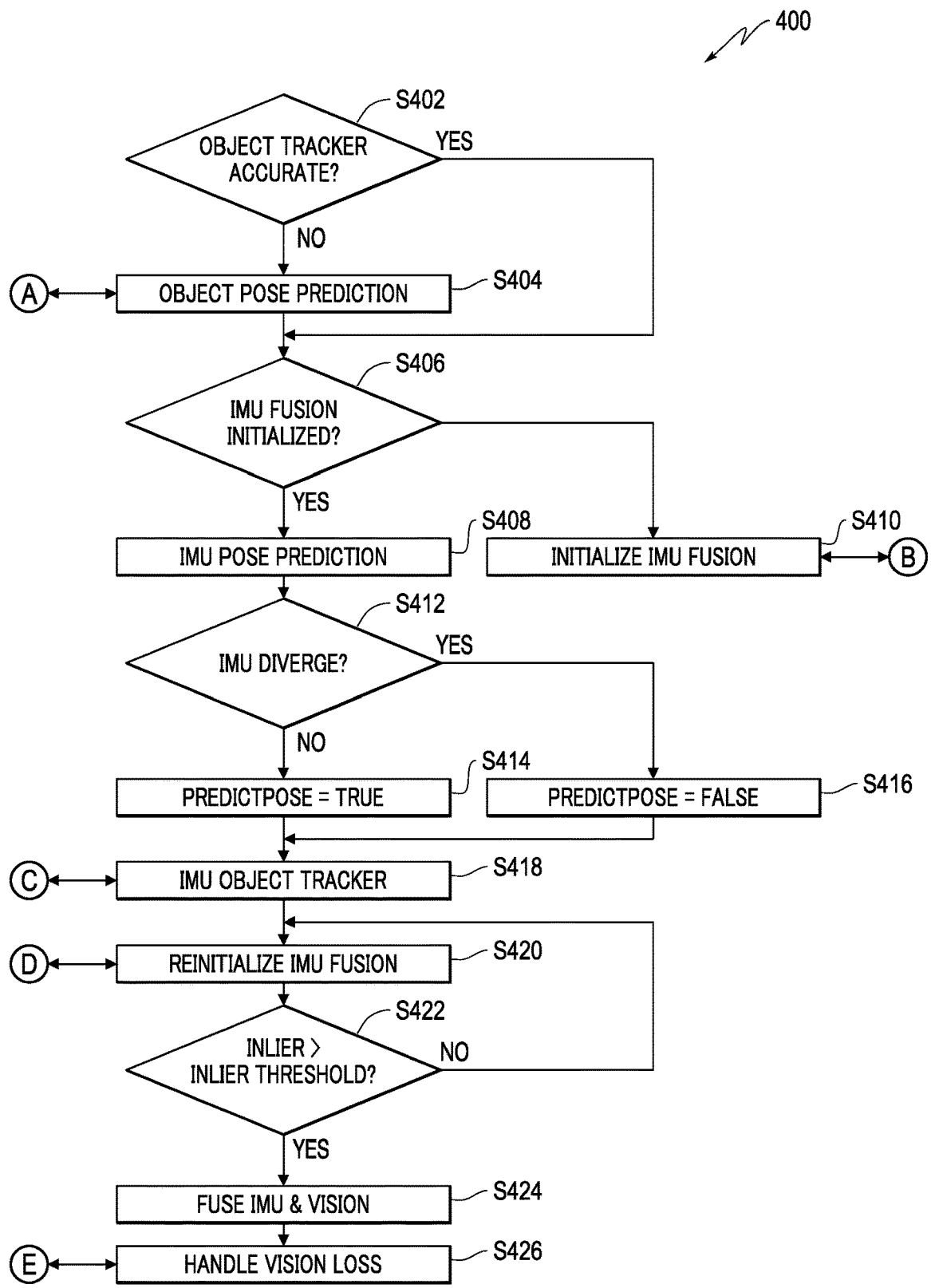
FIG. 20 is a flowchart showing fusion of fused sensor data with image data, according to an embodiment.

FIG. 20 is a flow chart illustrating a method 400 of fusion of an IMU sensor and 3D Object tracker of step S306 of FIG. 19, in accordance with an embodiment.

FIG. 20 is used as herein the foundational flowchart herein and will refer to each of FIGS. 22-28 which are each referenced in FIG. 20 using reference letters A-E (each surrounded by a circle) in the Figure. Accordingly, while FIG. 20 will be discussed throughout the following points, FIGS. 22-28 will be discussed throughout these portions as well and then revert back to the discussion of FIG. 20.

It will be noted that various terms may be used to refer to the camera data such as "3D object tracker."

Starting first with step S402 of FIG. 20, the CPU 140 determines whether the 3D object tracker using the camera 60 has accurately determined an initial 3D pose of an object, as previously discussed herein. If so, the CPU 140 may set a value of "tracker state" to be true which allows method 400 to proceed to step S406.

Figure 21:
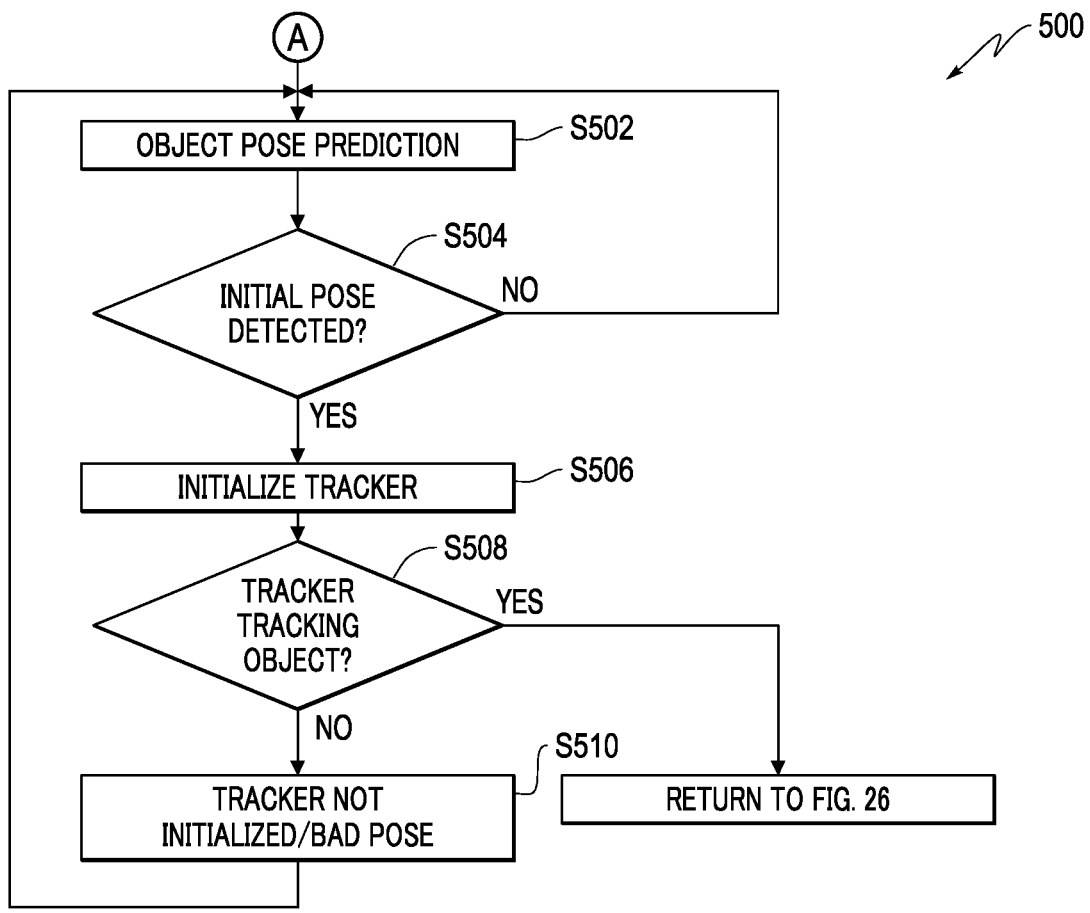
FIG. 21 is a flowchart showing object pose prediction, according to an embodiment.
Figure 22:
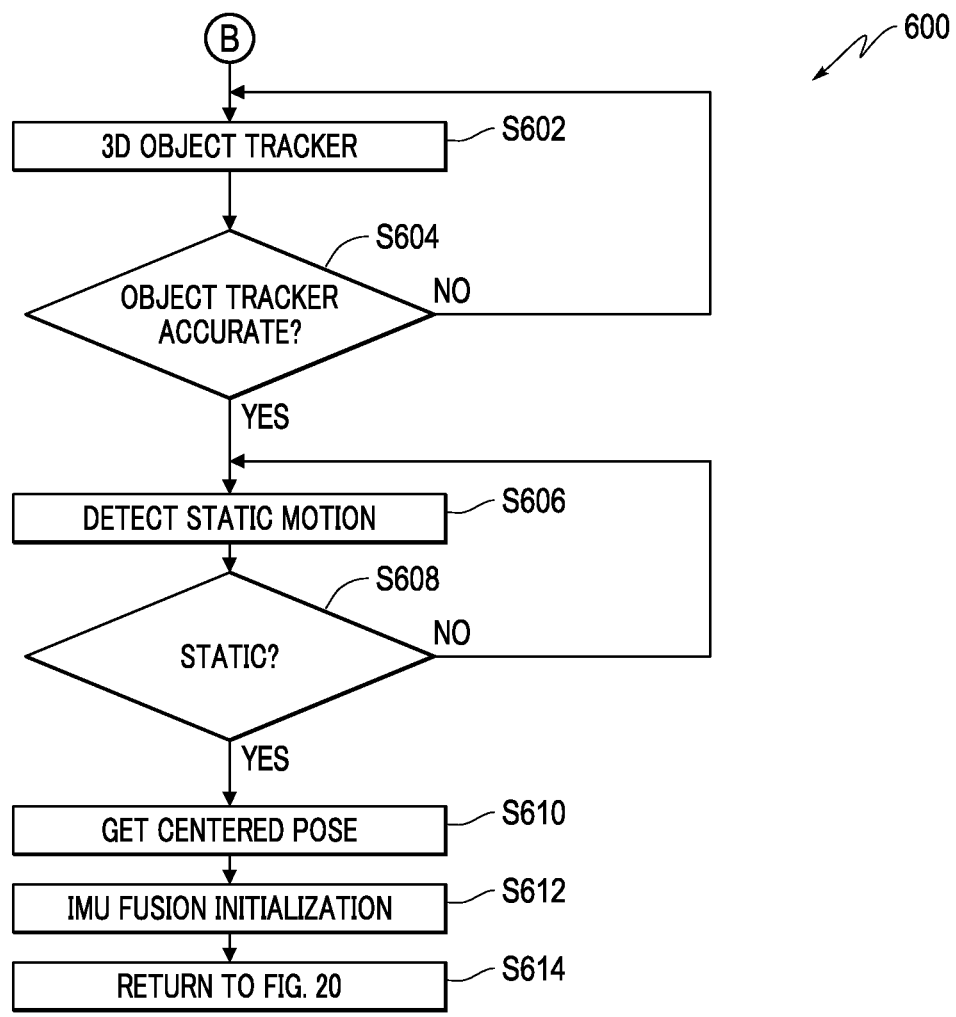
FIG. 22 is a flowchart showing initializing sensor fusion, according to an embodiment.

On the other hand, if, in step S402, the CPU 140 determines the 3D object tracker has not accurately determined an initial 3D pose of an object, an object pose estimation module is executed step S404, which is shown in FIG. 21. In FIG. 21 (step S502), before tracking is started (i.e., before step S506), an initial object pose is detected and the location-correspondence determination unit 168 may perform object pose estimation on the basis of the initial pose of the target object by using an algorithm, for example, discussed in section A-4 above. If the initial pose is not detected or the object pose is not successfully estimated (step S504), the method 500 may proceed to step S506 where the object tracker is initialized to set the initial values of all tracking parameters. At step S508, the method 500 determines if the tracker is properly tracking the object and if so, a state parameter (e.g., "trackerInit") is set to true and the method returns to FIG. 20; otherwise, the method 500 may proceed to step S510 where the state parameter (e.g., "trackerInit") is set to false indicating a bad pose and/or the tracker is not initialized.

E-2-2-2. Initialize IMU Fusion

Returning to FIG. 20, the method 400 determines if the IMU fusion is initialized. In this regard, if the tracker is initialized (as discussed above in step S506), the next step is to initialize IMU fusion module, which is discussed in FIG. 22. The first step in method 600 is to run the 3D object tracker in step S602, and if the CPU 140 determines that the 3D object tracker is providing accurate output (S604), the CPU 140 executes instructions to determine whether the user is static or not (S606) and when the user's head, for example, is determined to be static in step S608 (which is discussed later), then the CPU 140 obtains a centered pose in step S610. In this regard, if tracking is successful, the fusion initialization function is then executed in step S612, which is described in depth below.

To initialize the IMU fusion, the main parameter to initialize is the transformation matrix between the object coordinate system and the global coordinate system, $T_{O2G}$. The following is an automatic way to calculate the transformation matrix.

$$T_{O2G} = T_{S2G} * T_{C2S} * T_{O2C}$$

Where $T_{C2S}$ is the transformation matrix from camera to IMU, and is pre-known through calibration. An assumption is that the object is static, so $T_{O2G}$ is fixed and needs to be calculated only once in the system initialization phase. $T_{S2G}$ is the IMU pose in the global coordinate system. $T_{O2C}$ is the object pose in the camera coordinate system, and output by the object tracker.

In the initialization phase, the user is recommended to keep his/her head static. When IMU is static, $T_{S2G}$ can be calculated as follows (ax, ay, az are the accelerometer reading), $$\tan(\text{roll}) = \tan\left(\frac{ay}{az}\right)$$

$$\tan(\text{pitch}) = \tan\left(\frac{-ax}{ay*\sin(\text{roll}) + az*\cos(\text{roll})}\right)$$

$$yaw = 0$$

$$R_x(\text{roll}) = \begin{bmatrix} 1 & 0 & 0 \\ 0 & \cos(\text{roll}) & \sin(\text{roll}) \\ 0 & -\sin(\text{roll}) & \cos(\text{roll}) \end{bmatrix}$$

$$R_y(\text{pitch}) = \begin{bmatrix} \cos(\text{pitch}) & 0 & -\sin(\text{pitch}) \\ 0 & 1 & 0 \\ \sin(\text{pitch}) & 0 & \cos(\text{pitch}) \end{bmatrix}$$

$$R_z(yaw) = \begin{bmatrix} \cos(yaw) & \sin(yaw) & 0 \\ -\sin(yaw) & \cos(yaw) & 0 \\ 0 & 0 & 1 \end{bmatrix}$$

$$R_{S2G} = (R_x * R_y * R_z)$$

$$T_{S2G} = \begin{bmatrix} R_{S2G} & 0_3 \\ 0 & 0 & 0 & 1 \end{bmatrix}$$

Since $T_{S2G}$ may not be accurate if user is not static, and this error will make the fusion accuracy become not reliable, before initializing IMU fusion, there is another function to check if user is static. Only when user is static, the IMU fusion initialization function will be called. Therefore, before initializing IMU fusion, the CPU executes instructions to detect that the user is static under step S606, as mentioned above.

E-2-2-2-1 Detect Static Motion

When user is static, IMU readings can be modeled as a Gaussian distribution, and the probability density function of each dimensional reading is:

$$p(x) = \frac{1}{\sigma\sqrt{2\pi}} e^{-\frac{(x-\mu)^2}{2\sigma^2}} \quad (3)$$

Where $\mu$ represents the mean value and $\sigma$ the standard deviation. $\mu$ and $\sigma$ can be estimated from IMU data collected when user is static. For a real time IMU reading x, when $p(x) > th$ (where "th" is an experimental threshold), the user is determined to be static.

If the user is detected being static according to the above-discussed model, IMU fusion initialization is executed under step S612. After IMU fusion is initialized, a state flag is set to true to indicate that the fusion is initialized successfully; otherwise the flag is set to false.

E-2-2-3. IMU Pose Predication

Returning back to FIG. 20, in step S408, if IMU fusion is initialized (discussed above), the IMU pose is predicted before tracking, and the IMU predicted pose is then utilized in the tracking. Specifically, the CPU 140 predicts in sequence a sensor pose of the inertial sensor with respect to the global coordinate system by a non-linear estimation algorithm based at least on the sensor data sequence acquired from the IMU sensor. This is described in more detail below.

According to one embodiment of the present disclosure, the state vector $x_k = \{p_k, v_k, q_k\}$ includes the IMU position $p_k$, IMU velocity $v_k$ and IMU orientation $q_k$, all in the global coordinate system; and the control input $u_k$ includes the accelerometer input and gyro input. The state transition and measurement models are, $$x_k = f(x_{k-1}, u_{k-1}, w_{k-1}) \text{ and } z_k = h(x_k, n_k)$$

Where $w_k$ and $n_k$ are the process and measurement noises which are assumed to be zero mean Gaussian noises with covariance $Q_k$ and $R_k$ respectively.

The equations to predict IMU pose are, $$\hat{x}_k = f(x_{k-1}, u_{k-1}) \quad (4)$$

$$\hat{P}_k = F_{k-1} P_{k-1} F_{k-1}^T + L_{k-1} Q_{k-1} L_{k-1}^T \quad (5)$$

where F is the Jacobian matrix of $f$ with respect to x, and L is the Jacobian matrix of f with respect to the process noise w. $\hat{x}_k = f(x_{k-1}, u_{k-1}) \hat{P}_k = F_{k-1} P_{k-1} F_{k-1}^T L_{k-1} Q_{k-1} L_{k-1}^T$ IMU pose is derived from $\hat{x}_k$ (translation from $p_k$ and rotation from $q_k$).

E-2-2-4. IMU Divergence Determination

An IMU sensor, especially the accelerometer may diverge meaning that data is inaccurate for pose prediction. For example, when vision lost for a long period of time.

To best use IMU in the tracking, one needs to determine when the IMU diverges. The criteria to determine IMU divergence is defined below.

Position covariance:

$$\text{posCov} = \sqrt{\Sigma_{i,j=}^2 P_{i,j} * P_{i,j}} \quad \text{posCov} = \sqrt{\Sigma_{i,j=0}^2 P_{i,j} * P_{i,j}} \quad (6)$$

Velocity covariance: $\text{velCov} = \sqrt{\Sigma_{i,j=3}^5 P_{i,j} * P_{i,j}}$ (7)

Orientation covariance: $\text{oriCov} = \sqrt{\Sigma_{i,j=6}^9 P_{i,j} * P_{i,j}}$ (8)

where P is the state covariance matrix.

The following formula determines if accelerometer readings are abnormal:

$$|(\|\text{Accelerometer}\| - \|\text{calibrated greound truth of Accelerometer}\|)| > \text{Th}_{Acc} \quad (9)$$

If $\text{posCov} > \text{Th}_{cov}^{pos}$ or $\text{velCov} > \text{Th}_{cov}^{vel}$ or $\text{oriCov} > \text{Th}_{cov}^{ori}$ or equation (9) is fulfilled, the IMU is diverged and the state flag "PredictPose" is set to false (step S414), otherwise it is set to true (step S416). The method 400 then may proceed to step S420 discussed below for the IMU Object Tracker.

E-2-2-5. IMU Object Tracker

Figure 23:
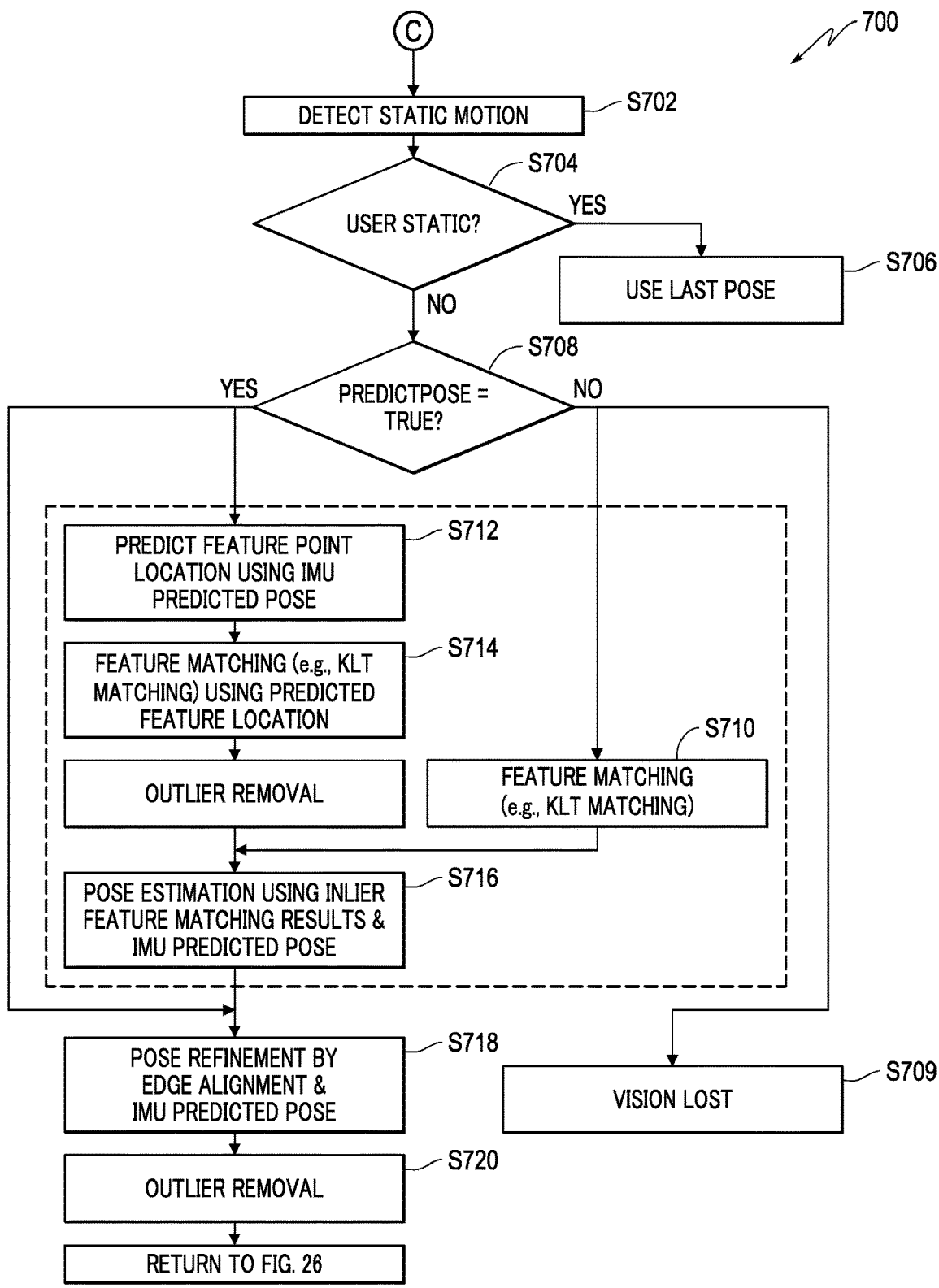
FIG. 23 is a flowchart showing inertial sensor object tracker, according to an embodiment.

An example of the tracking an object using an IMU senor is illustrated in FIG. 23 and discussed below.

E-2-2-5-1. Detect Static Motion (S702)

In steps S702 and S704, the CPU 140 executes a module to determine whether or not the user's head, and thus the inertial sensor, is held static or substantially static based on the sensor data sequence, as has been discussed above. If user or the inertial sensor is detected as being static or substantially static, no tracking may be performed. Instead, the sensor pose previously predicted by the non-linear estimation algorithm is used as the next predicted sensor pose in the case where the inertial sensor is determined to be held static or substantially static. In this regard, another pose is not predicted but a previous pose that has been stored in memory is simply retrieved from the memory and used for the next or current frame. Alternately, the object pose, or the second pose of the object, obtained previously by fusing the camera data and the sensor data may be used as the next fused object pose. That is, in some embodiments, it is not necessary to perform the vision tracking in the vision thread if user or the inertial sensor is detected as being static or substantially static.

This reduces computation time and processing power of the system since no other computations or steps need to be executed to determine the current pose. In this manner, tracking speed is improved.

However, if user is moving, the method 700 proceeds to performing the steps S708-S722.

It is noted that steps S712-S716 may be optional (and thus are shown with a dotted box around these steps) when edge alignment or other feature is used or for low-feature objects which may not have many feature matching features (e.g., not many KLT features). Accordingly, one embodiment from S708 is to proceed to S709 or directly to S718 and another embodiment is from S708 is to proceed to either S712 or S710.

E-2-2-5-2. Predict Feature Point Location using IMU Predicted Pose/KLT Matching Using Predicted Feature Location In step S708, if the IMU predicted pose state flag "PredictPose" is true (S414 from FIG. 20), the method 700 will behave very differently from its original tracker. The IMU predicted pose have multiple usage to improve the tracking performance. First, it is converted into the camera coordinate and becomes predicted object pose. Using the predicted object pose, all the feature points matched in previous frame are projected to the current frame so their locations in the current frame are predicted (step S712), provided that the object has sufficient features for feature matching (but if not the method 700 may proceed directly to S718).

Figure 27:
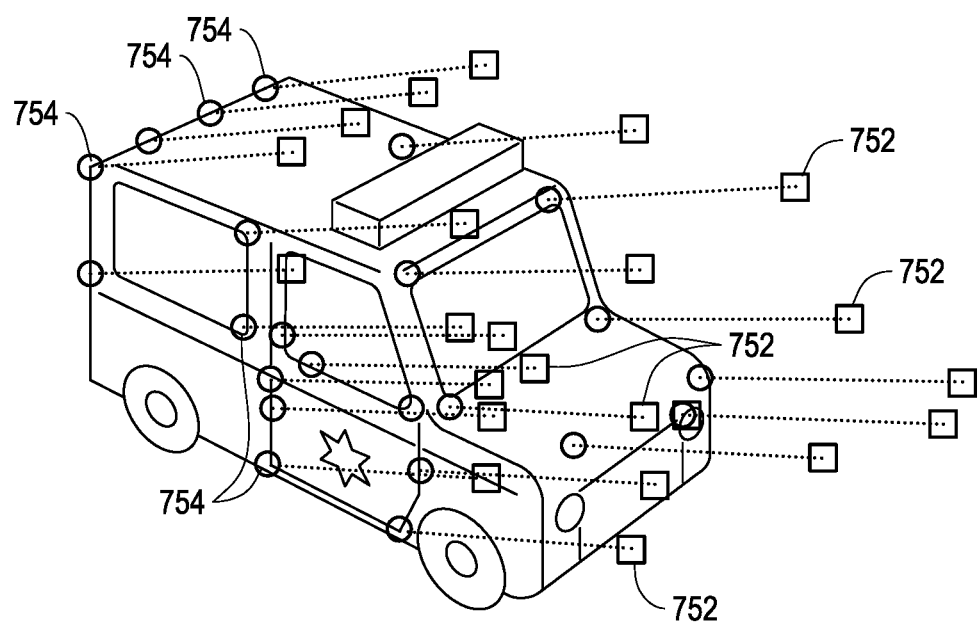
FIG. 27 is a diagram illustrating feature matching, according to an embodiment.

Then, in steps S714-S716, the CPU 140 performs feature matching using the predicted feature location. The features matching, according to embodiments, may be performed using Kanade-Lucas-Tomasi (KLT) matching (S714), removing any outliers (e.g., points with a difference greater than a predetermined threshold relative to the matching) (S715), and then estimating the pose using inlier feature matching results and the IMU predicted pose (S716). In KLT matching, with the predicted feature location, the matching becomes more accurate and faster. The reason is illustrated in FIG. 27 where points indicated by squares in FIG. 27 indicate the feature locations in the previous frame, and the points indicated by circles in FIG. 27 indicate the true/predicted locations of those features in the current frame. From the length of the dotted line between these points, the inter-frame motion is large and the KLT feature matching may fail if the IMU is not used. With IMU predication, the feature locations in the current frame are predicted close to their real locations so the feature matching will be successful and the matching will be fast and accurate since the algorithm knows where to find those features.

In this regard, there is matching, between consecutive image frames in the image data sequence: 2D feature points of the object based at least on the predicted sensor pose, the second spatial relationship and 3D points on the 3D model, whereby the 3D points corresponding to the 2D feature points.

Referring back to step S708 of FIG. 23, if the IMU predicted pose state flag "PredictPose" is false (S416 from FIG. 20), the CPU 140 feature matching is performed without using IMU data in S710 (or the method 700 may proceed to S709 where the CPU 140 determines that vision is lost). In this regard, only KLT matching, for example, may be used and then pose estimation using the feature matching results is outputted. In this regard, using step S710 instead of steps S712-S715 allows the system to avoid data from the IMU sensor because the IMU sensor has diverged and thus, such data is not useful.

E-2-2-5-3. Pose Estimation Using KLT Matching Results & IMU Predicted Pose (S716)

As mentioned above, KLT matching outputs the matched features. Using these features and their corresponding 3D coordinates, a pose can be estimated using a robust pose estimator by Gauss-Newton optimization, according to one embodiment.

The robust pose estimator using Gauss-Newton optimization requires an initial pose, and it may not converge if the initial pose is not close enough to the real pose, or it may converge to a wrong local minimum which causes the estimated pose may be inaccurate. In the original tracker, the object pose in a previous frame is the input to the robust pose estimator. If the inter-frame motion is obvious, the previous pose will not be close to the real pose of the current frame, so robust pose estimator may converge very slow, converge to a wrong minimum, or possibly not converged at all. Accordingly, in one embodiment, a predicted object pose converted from the IMU predicted pose is used as the initial pose to the robust estimator. Since the predicted pose as the initial pose is much more accurate than the object pose in the previous frame, the robust estimator converges faster and the pose converged to be more accurate. In this manner, the tracker performance is improved.

Accordingly, a second pose is derived based at least on (1) the matched 2D feature points, (2) the sensor pose or another sensor pose predicted in sequence, and (3) a second spatial relationship (i.e., the relationship between an object coordinate system defined on the object or the 3D model and a global coordinate system based at least on: (1) the first initial pose or a pose tracked from the first pose, (2) the sensor data sequence acquired from the inertial sensor, and (3) a first spatial relationship between the inertial sensor and the camera.

In some embodiments, the CPU 140, or computer processor, displays an image such as a rendered image of a 3D AR model, using the display, using the thus derived second pose of the object, so that the user is allowed to visually perceive the position and pose of the AR object is substantially align with or anchored to those of the object through the HMD 100. In this case, the processor derives the image position $x_{dis\_1}$ of each 3D point included in the 3D AR object using the following equation.

$$x_{dis\_1} = PT_{Cam2Disp}T_{Object2Cam}X$$

where P is the projection matrix and $T_{Cam2Disp}$ is the 3D transformation matrix from the camera coordinate system to the display coordinate system of the HMD 100. $T_{Object2cam}$ refers to the object pose or the second pose of the object both represented in the camera coordinate system according to the present embodiment. X represents each 3D point included in the 3D AR model expressed in the 3D model coordinate system, which is stored in the memory of the HMD 100.

E-2-2-5-4. Pose refinement by edge alignment & IMU predicted pose (S718)

According to some embodiments as shown in step S718, an edge alignment method is used to refine the pose calculated from KLT features. The initial edge points are extracted based on the pose calculated from KLT features. When a view of object has less than 5 KLT feature points detected, no pose can be estimated from KLT matching, then edge alignment method will fail. In this work, when this case is encountered, the IMU predicted object pose will be the input to the edge alignment method. Since the predicted pose is relatively accurate, edge alignment method will most probably still work.

KLT matching can be even eliminated since IMU predicted pose can be used as the initial pose for edge alignment method to work. This is most useful for a low feature object since there may not be KLT features in a low feature object.

E-2-2-5-5. Outlier Removal (S720)

General speaking, KLT features and edge features contain outliers and outlier removal is performed, as provided in step S720.

To remove outlier from KLT features, the difference between KLT matched results and IMU predicted locations will be compared. A histogram of the difference is calculated and features whose difference is bigger than a threshold will be removed as outliers.

To remove outliers edge features, besides using the histogram method as used for KLT features, an edge point that has too many possible matching points will be removed as outliers.

E-2-2-6. Reinitialize IMU Fusion

Figure 24:
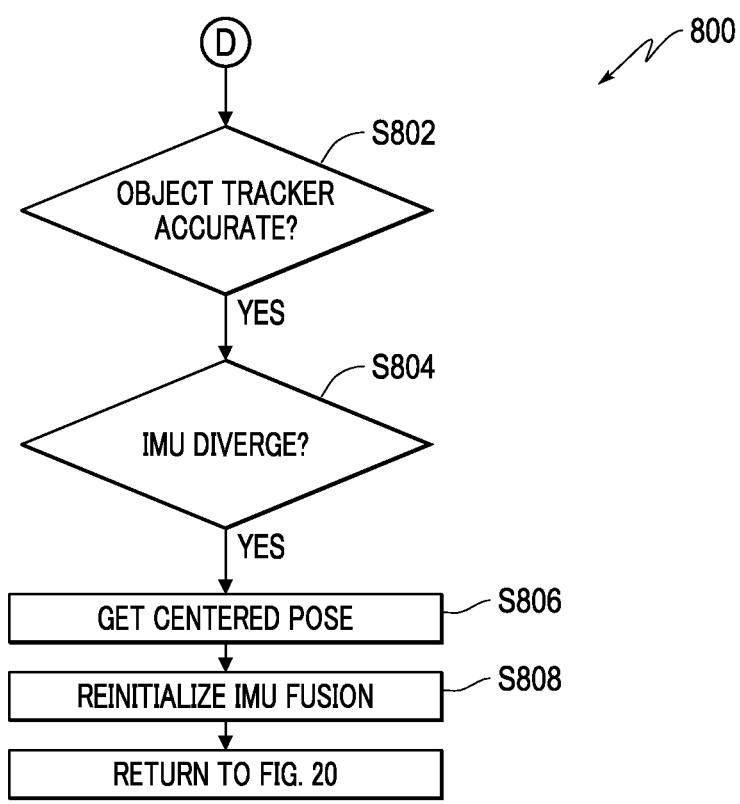
FIG. 24 is a flowchart showing reinitializing IMU fusion, according to an embodiment.

Referring back to FIG. 20, at step S420, the CPU 140 performs a "reinitialize IMU fusion" step (or module). This module checks if the pose detected from its previous step is accurate. If the pose is accurate and IMU is diverged, IMU fusion will be re-initialized. The IMU re-initialization as shown in FIG. 24 is similar as the IMU fusion initialization module, which is provided in FIG. 22 and previously discussed. The first step in method 800 is to run the 3D object tracker, and if the CPU 140 determines that the 3D object tracker is providing accurate output (S802), the CPU 140 executes instructions to determine whether the IMU has experienced a diverged condition when the user's head, for example, is determined to have moved in step S804. If so, the CPU 140 obtains a centered pose in step S806, and the CPU reinitializes the IMU fusion function and the method 800 returns back to FIG. 20.

Referring back to step S422 to FIG. 20, if the number of inliers (matched feature points left after outlier filter) is greater than a threshold, the next step will be "Fuse IMU and Vision" step S424.

E-2-2-7. Fuse IMU and Vision (S424)

In step S424, IMU readings are updated, and the 2D and 3D information of features from the object tracker are available.

First, a new state is predicted using the latest gyroscope and accelerometer readings according to equations (3) and (4).

$$y_k = z_k - h(\hat{x}_k) y_k = z_k - h(\hat{x}_k) \quad (10)$$

$$S_k = H_k \hat{P}_k H_k^T + M_k R_k M_k^T \quad (11)$$

$$K_k = P_k H_k^T S_k^{-1} \quad (12)$$

$$x_k = \hat{x}_k + K_k y_k \quad (13)$$

$$P_k = (I - K_k H_k) \hat{P}_k \quad (14)$$

Where H is the Jacobian matrix of h with respect to x, and M is the Jacobian matrix with respect to n. The measurement $z_k$ includes all the feature points matched by the vision object tracker. In order to improve the fusion speed, only d features are selected after outlier removal. For example, d<50 in one of our implementation. The IMU pose $T_{S2G}$ is derived from $x_k$ (translation from $p_k$ and rotation from $q_k$).

E-2-2-8. Handle Vision Loss

Figure 25:
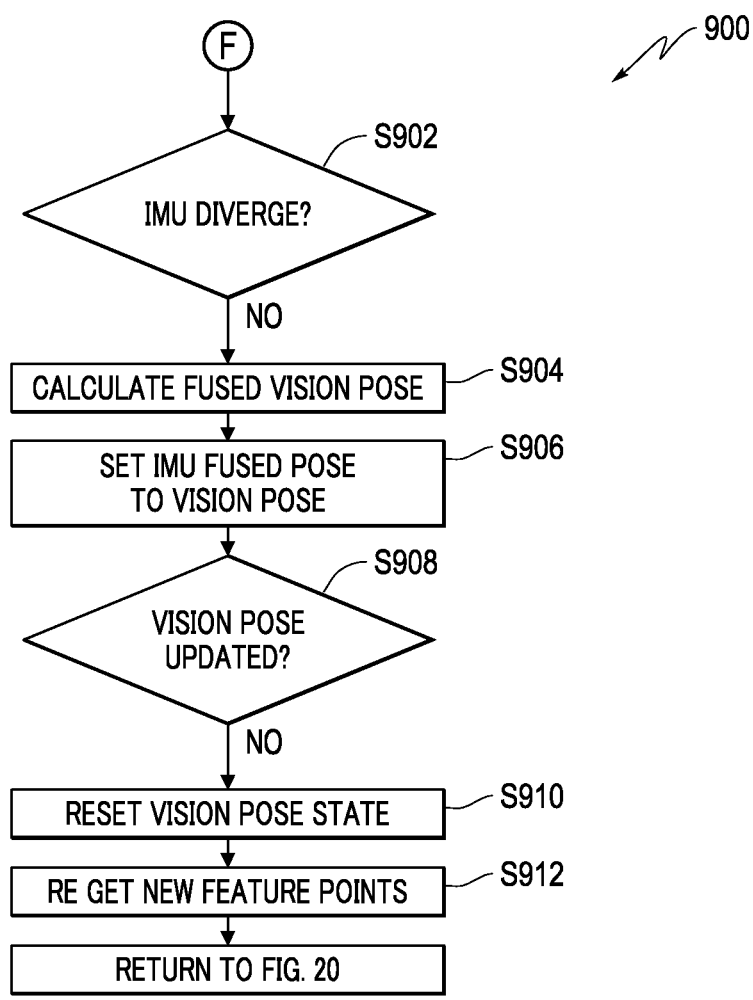
FIG. 25 is a flowchart illustrating handling vision loss, according to an embodiment.

FIG. 25 is a flowchart illustrating handling vision loss, according to an embodiment. The method 900 of FIG. 25 handles the case when vision pose is not updated due to a particular reason (e.g., the pose estimation does not converge, etc.), but the IMU pose is fused correctly.

For example, if the IMU does not diverge (S902), the fused vision pose is calculated in step S904, and the IMU fused pose is then set to the vision pose in step S906, as discussed below.

The IMU pose $T_{S2G}$ is converted to the pose in object coordinate $T_{O2C}$ according the equation (15).

$$T_{O2C} = T_{S2C} * \text{inv}(T_{S2G}) * T_{O2G} \quad (15)$$

The pose in the object tracker is then updated to $T_{O2C}$. This module reduces tracking loss using IMU pose when vision tracker fails.

E-2-3. Get Jitter Reduced IMU Pose

Figure 26:
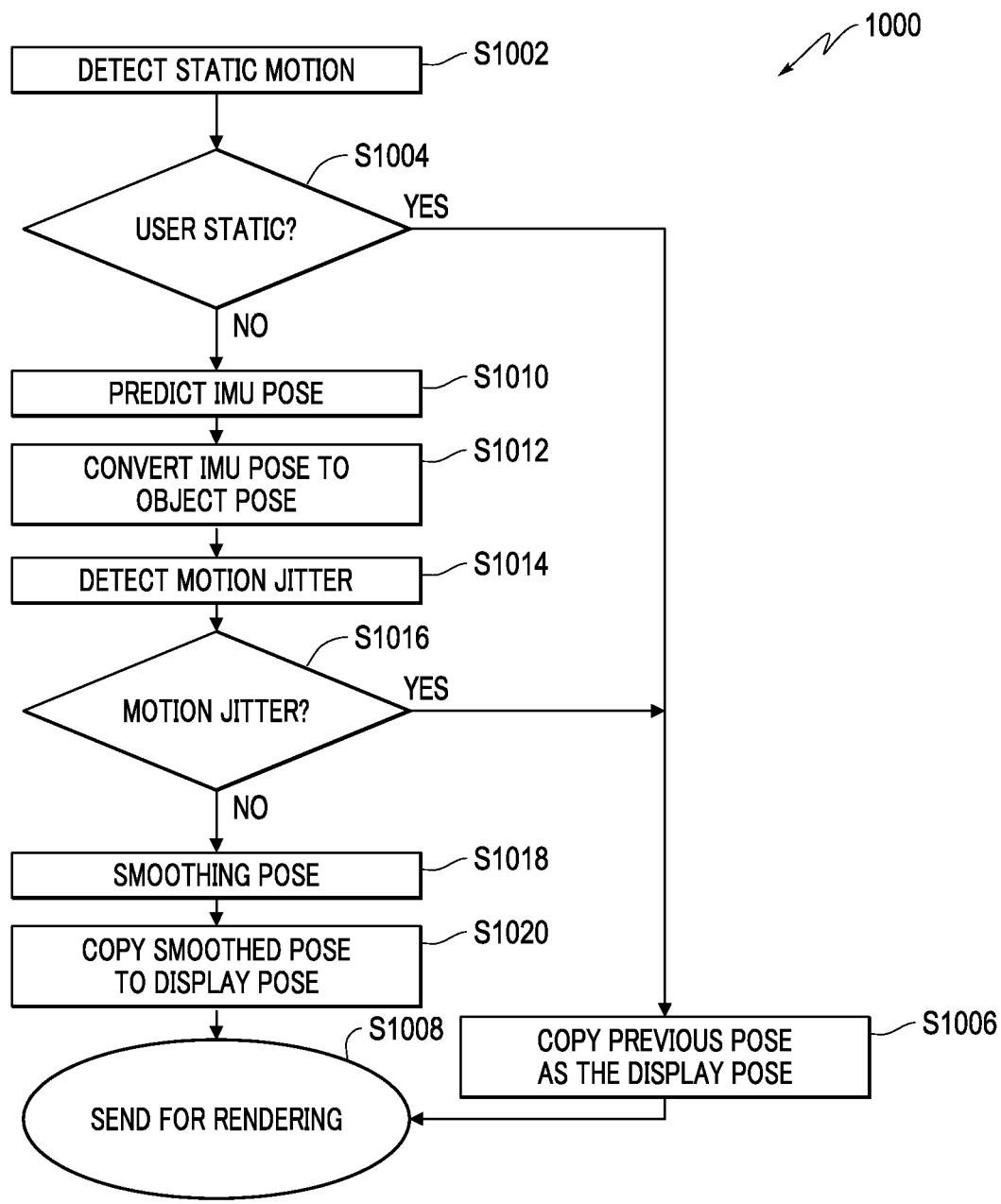
FIG. 26 is a flowchart illustrating jitter reduction for a generated pose, according to an embodiment.

FIG. 26 is for obtaining a pose with jitter reduction and runs throughout all steps of the IMU methods discussed above.

On HMD 100 or 100', for optical see-through applications, IMU predicted pose is output for display. One problem observed on device is that user feels much more jittery with IMU fusion than the original tracker. Therefore, introduced is static jitter detection and motion jitter detection methods to detect jitter and apply corresponding jitter reduction methods to ensure user has good experience.

Pose smoothing is a traditional way to reduce pose jitter, but its drawback is it adds latency as well which makes the latency improvement less obvious than before. Therefore, we proposed the following new methods to reduce jitter without affecting latency improvement so much. In addition, any complicated calculation will increase latency, so we apply methods as fast and simple as possible.

E-2-3-1. Detect Static Motion (S1002)

When a user is static, jitter is most obvious. Thus, static jitter is removed first.

If user is detected as being static (S1002), the previous IMU pose is copied as the current IMU pose (S1006). The current IMU pose will then be converted to pose in object coordinate using equation (15) for display (S1008).

Using this function, static jitter is completely reduced.

Except for static jitter, many people observed jitter during moving, we call it motion jitter. The next few modules are for reducing the motion jitter.

On the other hand, if the user is not static, the IMU pose is then predicted (S1010) and the IMU pose is then converted to an object pose (S1012), as discussed herein. The method 1000 then may proceed to step S1014, discussed below.

E-2-3-2. Detect Motion Jitter (S1014)

In step S1014, motion jitter is detected when the pose difference between the current IMU pose and the previous IMU pose is small (e.g., less than or equal to a predefine threshold).

When motion jitter is identified, it is processed in a similar way to when static motion is identified, i.e., copy the previous pose into the current pose (S1006). If both static jitter and motion jitter are not detected, the CPU 140 can apply exponential smoothing (S1018) to reduce the jitter and the smoothing factor can be set based on the pose difference. The simplest form of exponential smoothing is given by the formula, $$s_t + \alpha \cdot x_t + (1-\alpha) \cdot s_{t-1} \quad (16)$$

Where $\alpha$ is the smoothing factor, and $0<\alpha<1$.

The smoothed pose is then copied as the display pose under step S1020.

E-3. Experiment Results

The proposed IMU and 3D object tracking fusion method discussed above reduces the latency perceived by a user, allows for faster user head motion without compromising perception of the pose relative to the object, and handles vision loss. It improves the overall tracking performance and users' experience. Some experimental results are shown in sections below.

E-3-1. Latency Improvement

Significant latency reduction is observed using the proposed method and the latency measurement results are given in table 1. The latency is about 32 ms with IMU, compared latency of (128 ms~140 ms) with the original tracker without using IMU.

TABLE 1

Latency of 3D object tracking with/without IMU

| Latency | Motion Speed (mm/s) | | | |
|---|---|---|---|---|
| (ms) | 350 | 250 | 150 | 100 |
| No IMU | 140 ms | 139.2 ms | 135.4 ms | 128.7 ms |
| With IMU | 32.5 ms | 31.9 ms | 32.7 ms | 32.8 ms |

The latency improvement is observed obviously with the HMD with IMU. Devices prior to the present invention could get no lower than 100 ms, but the latency of an embodiment of the present disclosure is able to be around 32 ms.

E-3-2. Reduce Tracking Drift

With IMU fusion, no drift tracking is achieved. This is true for tracking with IMU for a rich feature object and for a low feature object. For both objects, the addition of the IMU, as discussed herein, improves tracking performance.

E-3-3. Tolerate Faster user Motion

As mentioned above, the IMU predicted pose is used to predict the feature location in the current frame before feature matching, which leads to faster and more accurate feature matching, and tolerate big inter-frame motion.

Also, as mentioned above, the IMU predicted pose is used as the initial pose for robust pose estimator, which leads to faster convergence and more accurate pose estimated.

Accordingly, the proposed method tolerates faster user motion.

E-3-3 Summary

The following features make the proposed approach unique and perform better than the prior 3D object tracking technology for AR applications on wearable devices.

The IMU and 3D object tracking fusion framework to fuse IMU sensor and our 3D object tracking technology is designed to maximize the 3D object tracking performance.

Two threads of IMU thread and vision thread runs on the HMD device, and the pose is updated at IMU output frequency, which reduces the optical see-through latency.

The IMU predicted pose is used as an initial pose for robust pose estimator, which improves the pose accuracy and pose estimation speed.

The IMU predicted pose is used as the input object pose for edge refinement module in case the previous pose estimation from feature matching fails, which improves the pose accuracy, pose estimation speed, and reduces the rich feature requirement so less feature of objects/views can be tracked.

The IMU pose is used to update vision tracker pose when tracker fails and IMU is not diverged, which reduces the tracking loss.

An automatic method to detect static motion and initialize the IMU fusion is disclosed.

A two step of jitter reduction method (static jitter reduction+motion jitter reduction) is disclosed to not only reduce jitter but also maintain the latency improvement.

The tracking speed is improved because when user is detected as static tracker just uses the pose from last frame without actually tracking the current frame.

With IMU prediction, less features can be used during tracking, the tracking speed is improved.

With IMU prediction, other complicated features can be considered since feature matching becomes faster and more accurate.

These features make the proposed technology improve the 3D object tracking speed, accuracy and latency, reduce tracking loss, reduce the limitation for user moving speed, and improve users' experience for AR applications on wearable devices.

E-3-4 Spatial Relationships in Multiple Devices

In the above described embodiment, the IMU fusion initialization in step S612 (FIG. 22) provides data representing the spatial relationship of the object with respect to the scene. In another embodiment, such spatial relationships may be stored and used by multiple devices. According to such embodiment, the CPU 140 in different HMDs 100' can obtain the position and pose of an object with respect to the same scene, even if the object is outside the field of view of the camera 60. Then the CPU 140 displays to its user visual information on the position and/or pose of the object using the different HMD 100's position and pose in the global coordinate system, provided that the global coordinate system is set common to these HMDs 100'. For that purpose, it is preferable that each of the HMD 100' (e.g., first device) and different HMD 100' (e.g., second device) includes a GPS (global positioning system) sensor and/or IMU 71 to define and share the global coordinate system with each other. If the IMU 71 includes a magnetic sensor in addition to the accelerometer and gyroscope, the CPU 140 can also define such global coordinate system common to the multiple devices without the GPS sensor, using, for example, the NED (North-East-Down) coordinate system. In this manner, the calculation power of the different HMD 100' to obtain the object pose in the scene, or the global coordinate system, is saved.

For example, a camera acquires an image data sequence and an inertial sensor acquires a sensor data sequence. As discussed above, the inertial sensor is fixed or adjustably fixed in a first spatial relationship with respect to the camera.

The CPU 140 of a first device such as HMD 100' derives a first pose, or a vision object pose, for each of the objects based at least on one of: image frames in the image data sequence and template data created based on 3D models corresponding respectively to the objects. The CPU 140 of the first device also derives respective second spatial relationships between object coordinate systems defined respectively on the objects or the 3D models and a global coordinate system based at least on the first poses or poses tracked from the first poses, the sensor data sequence and the first spatial relationship.

The second spatial relationships is stored in a storage medium so that the second spatial relationships are available to devices (i.e., devices, such as the second device, other than the first device) accessing a computer capable of communicating with the storage medium. For example, the second spatial relationships may be stored in a server which is accessible by all of the devices over a network. In this regard, the poses and spatial relationships can be used by these other devices to determine a spatial relationship to the other devices.

F. IMU GUIDED 360 DEGREE OBJECT DETECTION AND POSE ESTIMATION

F-1-1 Brief Overview

As discussed above, IMU fusion is used to assist both ODPE and tracking. With the help of the IMU, 360 degree re-initialization is possible when the object tracker gets "lost" because the IMU predicated pose can be used for determining view range. This improves the user experience greatly for augmented reality applications on wearable HMD devices (and other applications). In addition, training data in 360 degree can be done automatically offline (e.g., prior to losing the pose) from simulated images. This improves user experience as well. With 360 degree training images at hand, feature selection based on multiple views is possible so that distinguishing features will be created for each training image in training stage, which will improve the online ODPE performance. In this manner, the overall augmented reality 3D object tracking performance and user experience will be enhanced. Below is a more detailed explanation of some embodiments.

It should be noted that FIGS. 28-34 relate to IMU Guided 360 Degree Object Detection and Pose Estimation. Also, the system for IMU Guided 360 Degree Object Detection and Pose Estimation uses the same system as shown in FIG. 17. As such, the system will not be further described herein and any elements referred to in the below sections refer back to FIG. 17.

F-1-2 Introduction/Background

Figure 28B:
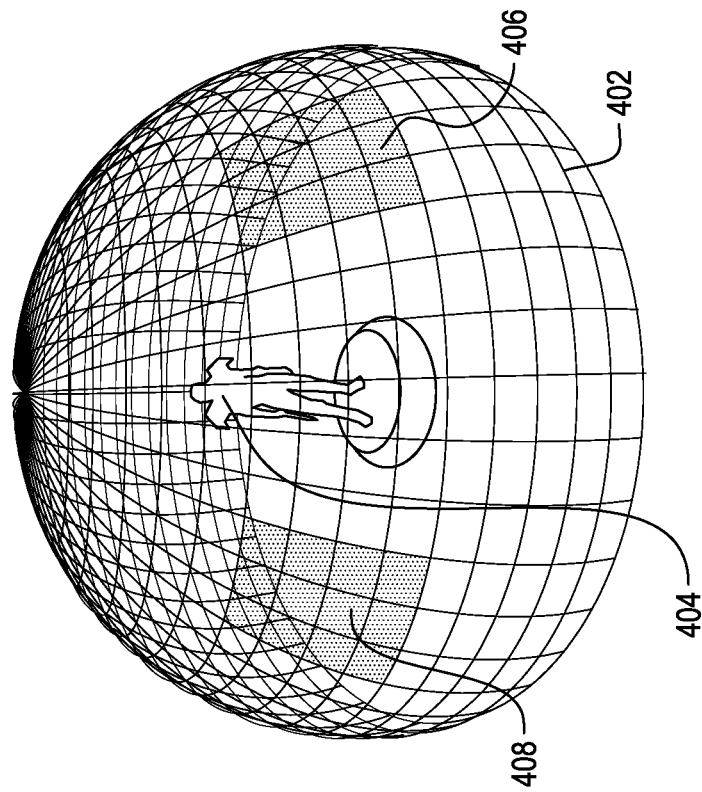
FIG. 28B is a diagram illustrating the user is viewing the object at a certain view when the user lost view of the pose (which is relative to where the user started viewing the object), according to an embodiment.
Figure 28A:
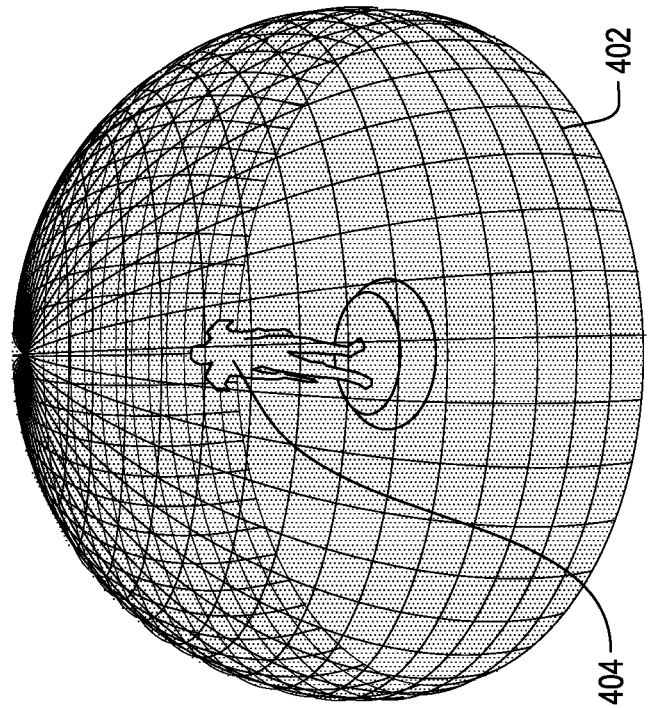
FIG. 28A is a diagram illustrating the user is viewing an object in 360 degrees, according to an embodiment.

As mentioned above, sometimes, while tracking an object at a different poses and views, the object can become "lost" to the camera. This is shown in FIGS. 28A and 28B where the tracking of an object 404 occurs in all views 402 around the object but is lost at a particular view 406, each view being a two dimensional view of the object 404.

Tracking may be determined to be "lost" based on a cost (or error) function $f$ is greater than a predefined threshold T ($f>T$ (or $f<T$)), where $f$ is tracking algorithm dependent. For example, $f$ may be $f=\Sigma_{i=1}^{N}\rho(\Pi(Pose\cdot P_i)-p_i)$ as being the sum of the robust reprojection errors for all feature correspondences, where Pose is the first pose, $P_i$ and $p_i$ are 3D and 2D coordinates of a feature matched between the current frame and its previous frame, respectively.

In other words, the tracking may be determined to be "lost" if the tracking error is determined to be greater than a predetermined threshold. The tracking error may be the above equation for $f$ or may be any error which determines the difference between the predicted features and actual features during tracking of the object.

In this situation where the user is viewing around the object (from an initial view where the object is detected) and the view then becomes lost (for whatever reason, e.g., the user has looked away), the system would then need to reinitialize object detection so that tracking of the object can continue. However, it may take considerable processing time for current systems to initialize/re-initialize the object detection especially when the tracking gets lost in other views, since the systems need to search for the closest limited views 408 from among all views of the trained data. This is not convenient to the user, and it degrades the user experience.

As such, embodiments of the present application disclose re-initializing the object in any view when tracking fails by a combination of an inertial sensor (IMU) and object detection and pose estimation (ODPE) vision module.

F-1-3 Overview of Method

Figure 29:
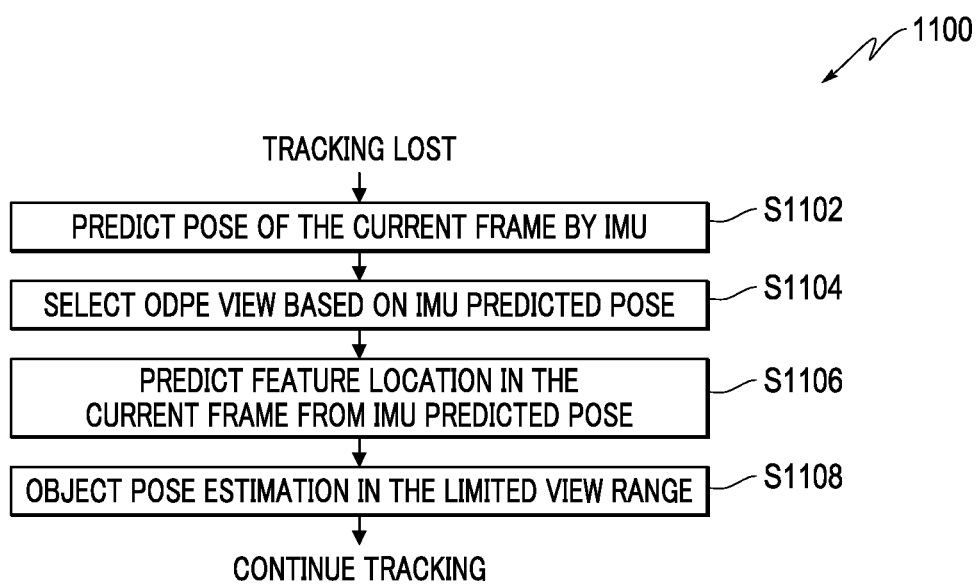
FIG. 29 is a flowchart illustrating a process of estimating a pose of a target object after the view has been lost, according to an embodiment.

This is shown generally at method 1100 of FIG. 29. First, in step S1102, the pose (or view) of the current frame of view of the user is predicted by the IMU. This is done using, for example, an accelerometer and gyroscope to determine the location of the view where tracking got lost relative to the initial pose/view of the user. In this regard, the IMU (not the camera) is used to determine the view of the user when tracking is lost.

Next, in step S1104, the system selects the ODPE view based on the IMU predicted pose, and in step S1106, the feature location in the current frame from the IMU predicted pose is then predicted.

At step S1108, the system estimates the object pose at the limited view range (e.g., the view where the user lost tracking) including or close to the ODPE view. That is, the limited view range is determined on the basis of the ODPE view or the IMU predicted pose. The coordinate system for representing the IMU predicted pose may be transformed into the camera coordinate system in accordance with expression (15). The view(s) in the limited view range is only a partial view(s) and is not full 360 degree views. By only having a limited view range, the system processing speed is greatly increased relative to processing for the whole 360 degree views of the object.

After the object pose is estimated in the limited view range, tracking may then continue and the user does not perceive significant lagging or drop off of performance due to a lost view.

Thus, FIG. 29 illustrates that, once tracking gets lost, views used for OPDE will be determined using the IMU predicted pose. The features on the current frame then can be estimated using IMU predicted pose to improve the feature matching performance.

The method 1100 of FIG. 29 is discussed in more detail below with regard to FIGS. 30-34.

Figure 30:
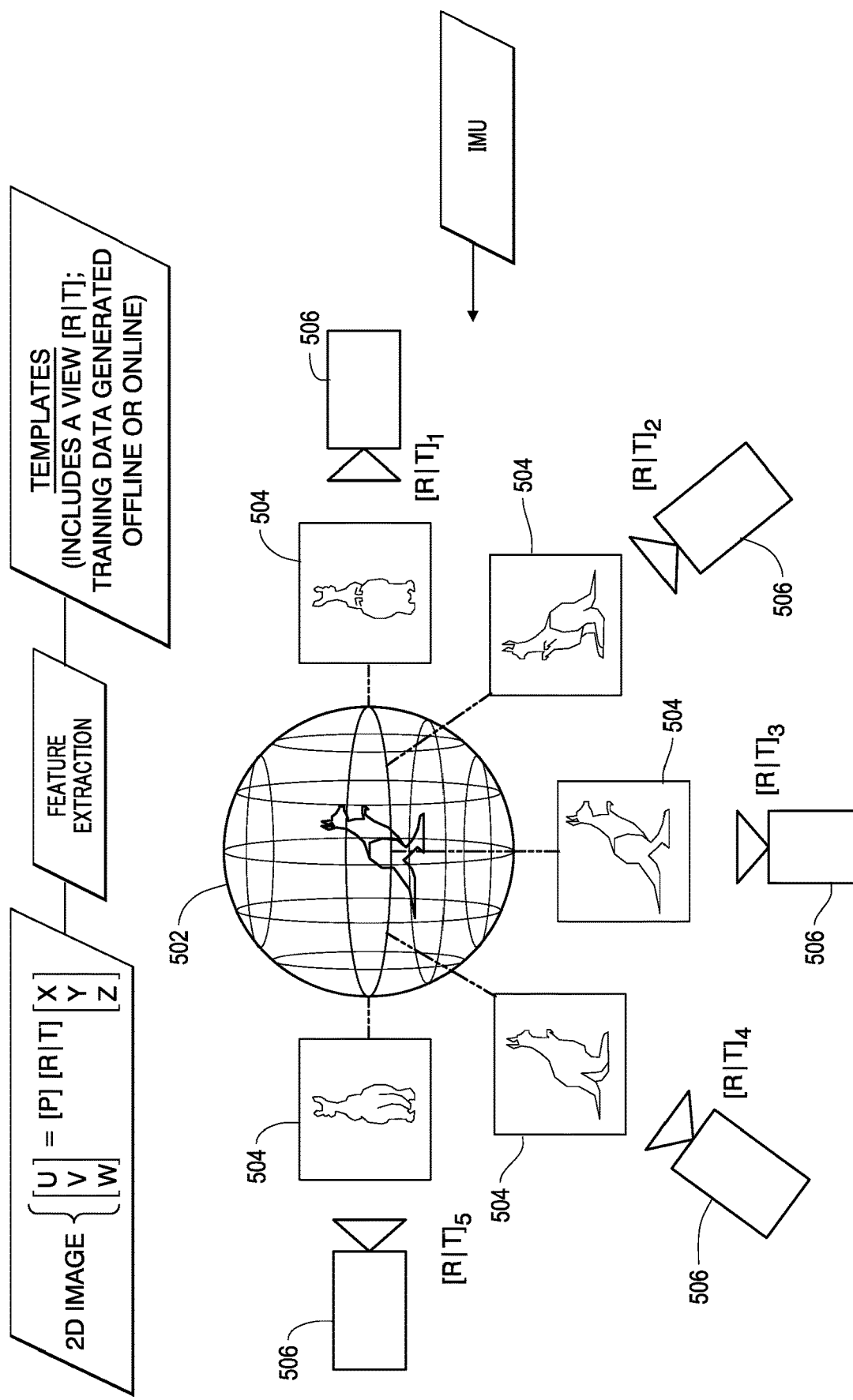
FIG. 30 is a diagram illustrating a schematic configuration of a system showing different positions of view of an object in order to allow for continuous viewing of the object when the view is lost, according to an embodiment.

FIG. 30 illustrates a schematic configuration of a system 500 showing different positions of views of an object 502 as a camera 506 rotates around the object 502 in order to allow for continuous viewing of the object 502 when a particular view of the object (view 406 from FIG. 28B, for example) is lost, according to an embodiment.

As illustrated in FIG. 30, the object 502 is a 3D object that can be viewed 360 degrees around the object 502, but the camera 506 at each particular view of the object 502 captures a 2D image of the object 502. Thus, for each view of the object 502, there may be real time (or online) training or offline training of the system. In other words, the training data is generated offline or online and one or more training templates are created based on the training data generated online or offline. The generation of offline training data of the pose of the object is discussed later with regard to FIGS. 32 and 33.

Referring back to FIG. 30, using the system shown, simulated training images are generated using a sample simulator, as disclosed in U.S. Patent Application Publication No. 2014/0079314 A1, which is herein incorporated by reference herein. The simulated training images are then used to generate the training template, as discussed below for FIGS. 31A-D.

F-1-4 Template Generation from Simulated Image

FIG. 31A-D illustrates a sequence of generating a training template and feature generation using a simulated training image, according to an embodiment. First, in FIG. 31A, a simulated training image 600 is obtained as disclosed in U.S. Patent Application Publication No. 2014/0079314 A1.

Figure 31D:
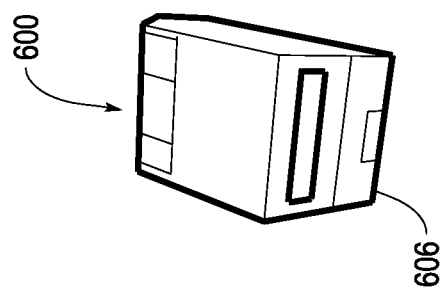
FIGS. 31A-D are diagrams illustrating a sequence of detecting keypoints (or edge template) from a simulated training image, according to an embodiment.
Figure 31C:
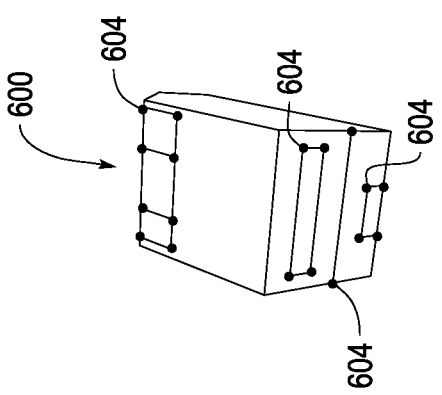
Figure 31B:
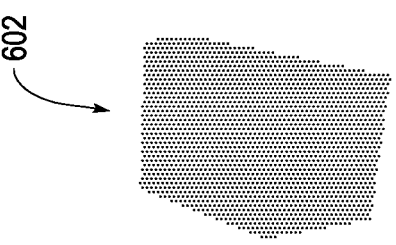
Figure 31A:
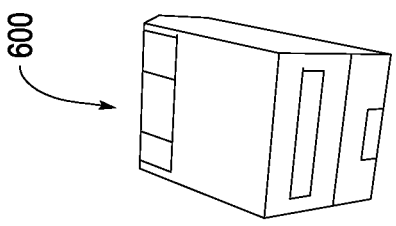

FIG. 31B shows the mask 602 of the object by using the known object pose, camera intrinsic parameters, and a CAD model of the object. The camera intrinsic relates to internal parameters (e.g., focal length, image sensor format, principal point, etc.) specific to each camera.

Once the simulated training image 600 and the mask 602 are determined, keypoints 604 (e.g., ORB keypoints) are detected on the object using the simulated image 600, as shown in FIG. 31C (this process is discussed above herein).

The training template 606 (or edge template) of the object is then generated based on the determined keypoints or features 604 of the object based on the selected view of the object (e.g., the view of the object at or after the time the pose of the object in a particular view is lost). This training template along with the determined keypoints or features 604 may then be used for re-initialization of object detection and feature tracking after the pose of the object in a particular view is lost. This template may be also stored in memory for future use. This process is discussed more below with regard to FIGS. 32-34.

F-2 Offline Training

Figure 32:
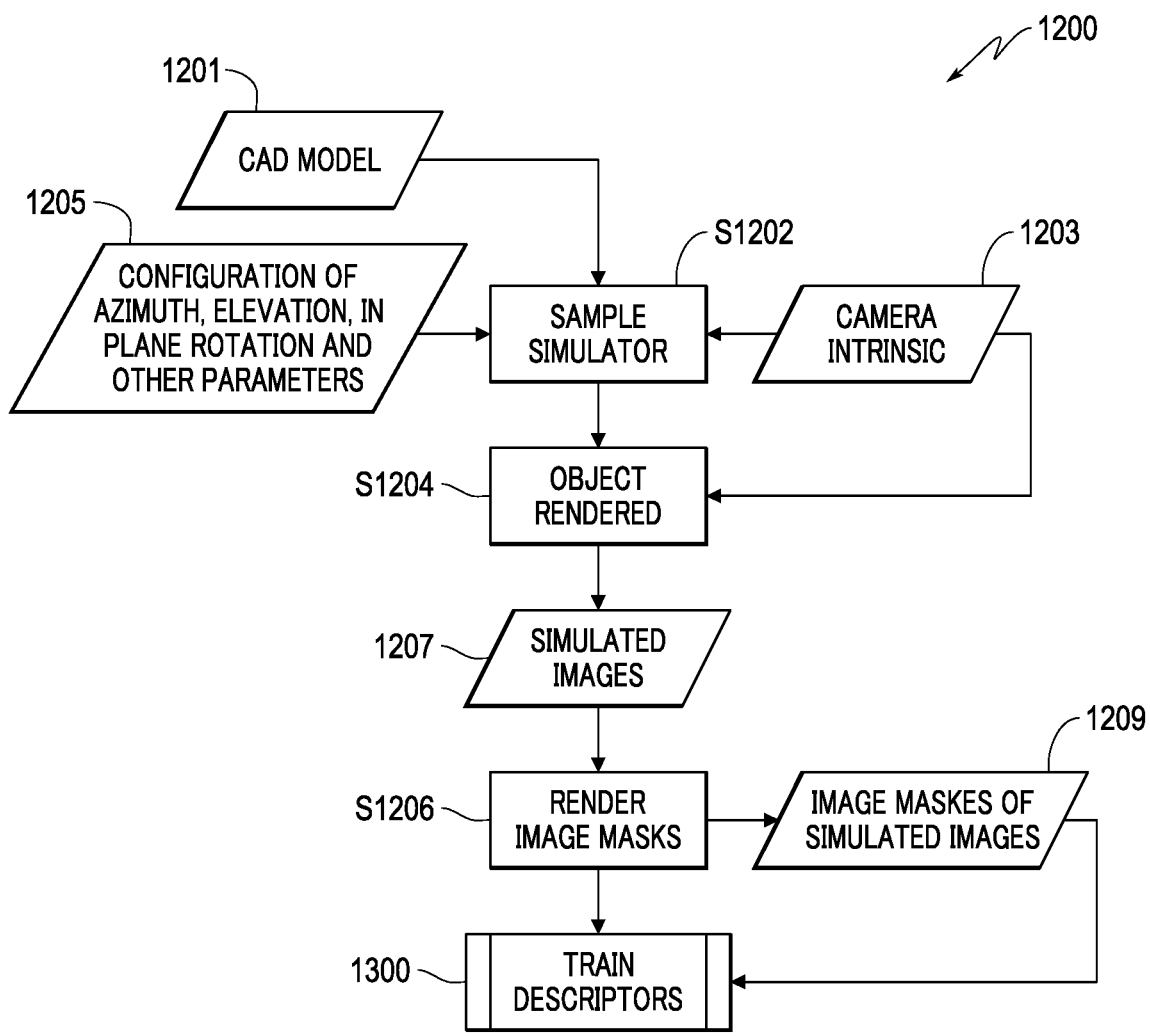
FIGS. 32 and 33 shows flowcharts illustrating a process of feature based offline training data generation, according to an embodiment.
Figure 33:
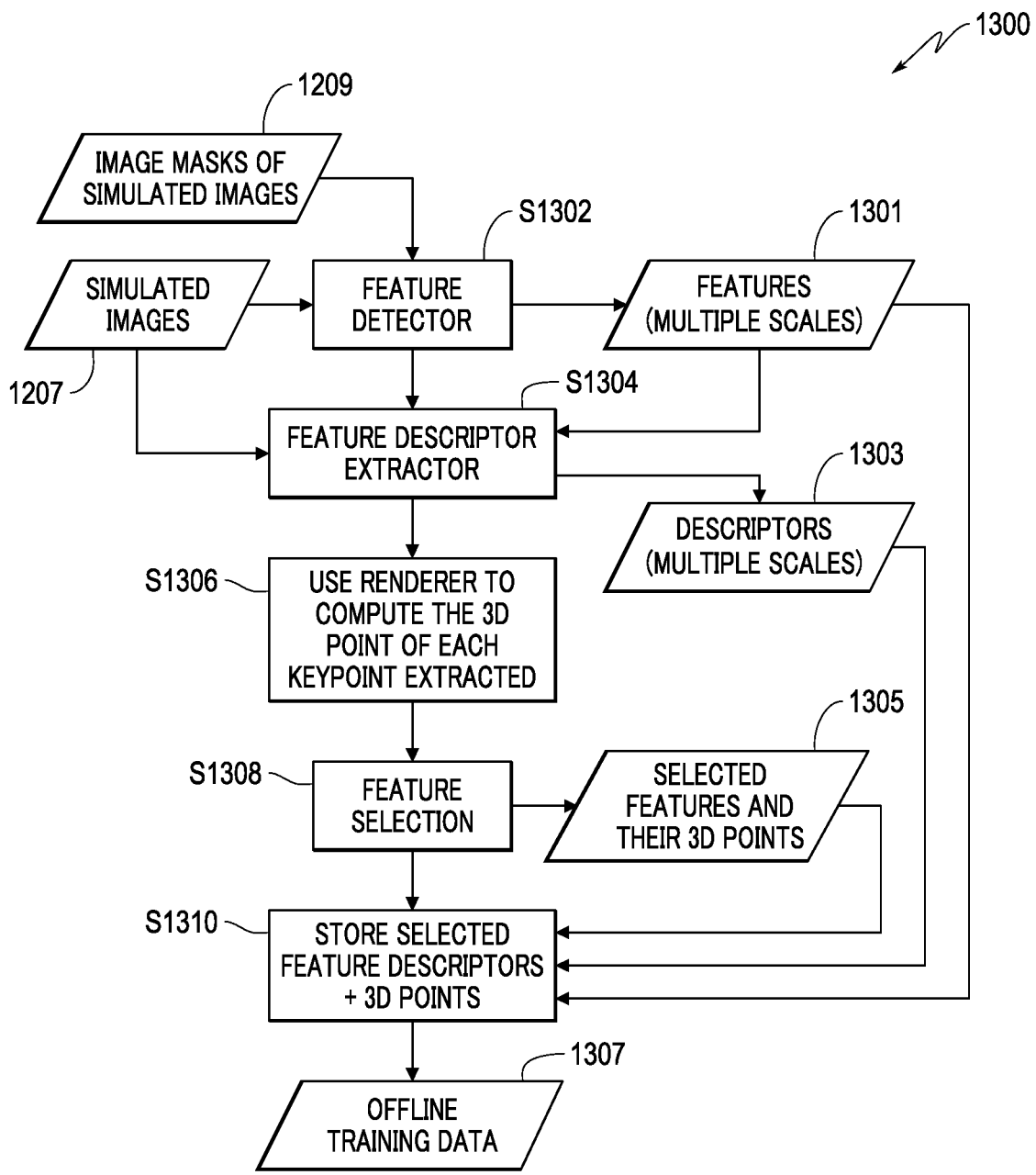
Figure 34:
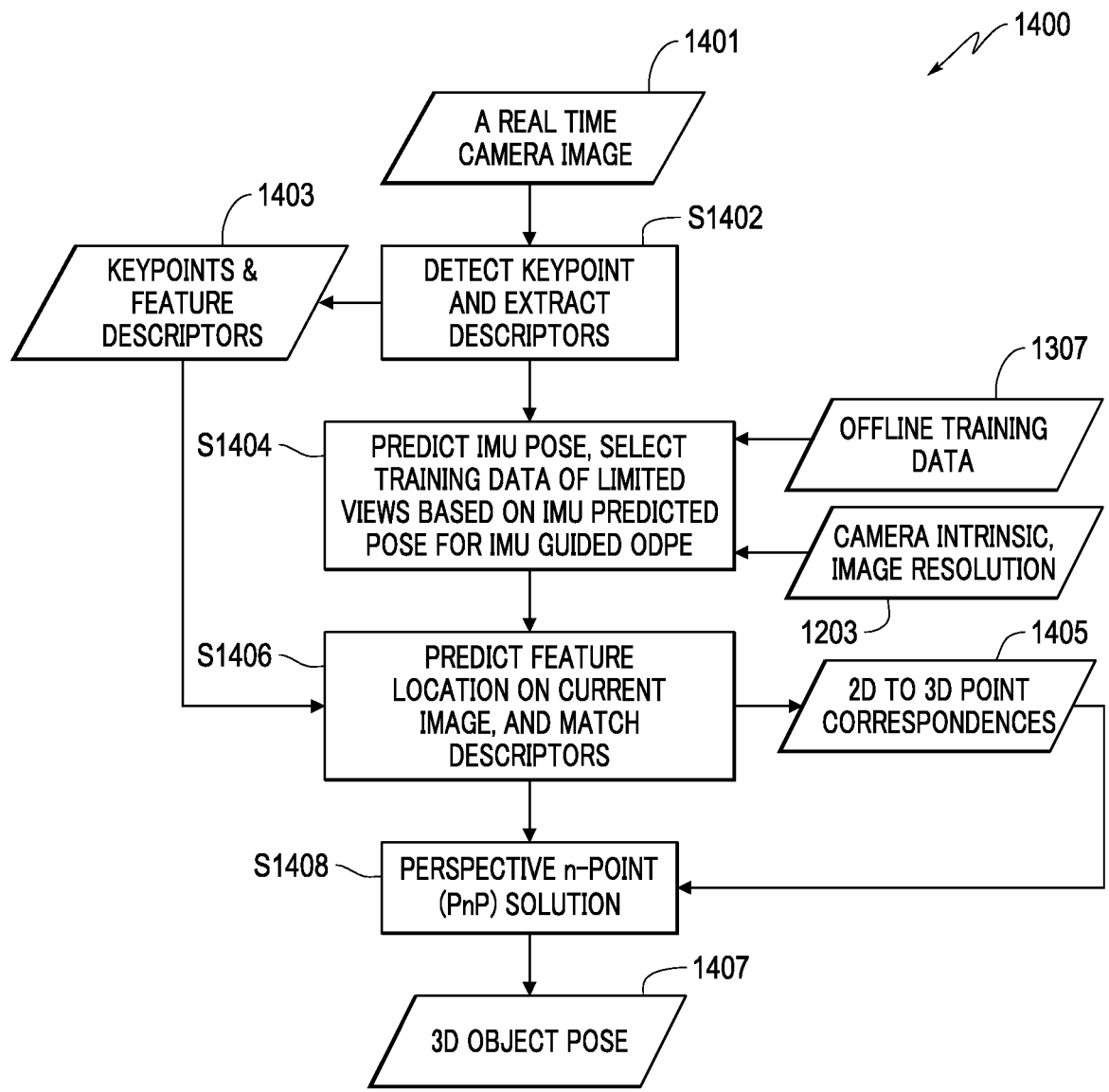
FIG. 34 is a flowchart illustrating a process of feature based online object detection and pose estimation, according to an embodiment.

FIGS. 32-33 show a process for generating offline images which may be used for training in FIG. 34. Also, FIG. 34 is a flowchart which is an alternate embodiment to method 900 of FIG. 25. In other words, step S1202 (instead of step S902) may flow from step S426 of FIG. 20 (and reference circle "E") to handle vision loss.

Referring first to FIGS. 32 and 33, these figures shows flowcharts illustrating a process 1200 of feature based offline training data generation, according to an embodiment. First, in steps S1202 and S1204, a sample simulator generates simulated training images 1207 using camera intrinsic parameters 1203, a CAD model of the object 1201, and configuration of inertial parameters (including azimuth, elevation, in plane rotation, and other parameters). As mentioned above, the generation of simulated images is performed using a sample simulator provided in U.S. Patent Application Publication No. 2014/0079314 A1.

At step S1206, the image masks of the simulated images 1209 are rendered and stored. The rendering of a mask of the simulated image is discussed above relative to FIG. 31B. At steps S1206 and S1208, the image masks of the simulated images 1209 are rendered and stored and the descriptors or feature keypoints are then trained at 1300 (as discussed in FIG. 33).

FIG. 33 is a description of 1300 of FIG. 32 to train the descriptors and generate a template (e.g. offline training data). In one embodiment, this process is described above in FIG. 2 and Sections A-2, A-2-1, A-2-2, A-2-3, and A-2-4. However, below is a brief summary of the steps of FIG. 33. In step S1302, a feature detector uses the simulated images 1207 and image masks 1209 of the simulated masks to output the features 1301 (or feature keypoints), as discussed above.

At step S1304, the feature descriptor extractor uses the simulated images 1207 and the features 1301 generated by the feature detector to output the descriptors 1303 (the descriptors relating to the contour feature or the edge feature of the feature point).

It is noted that the features at 1301 are detected and the descriptors at 1303 are extracted at multiple scales, e.g., at multiple distances from the object. This way, there are varying locations where the features and descriptors are determined relative to the object.

At steps S1306 and S1308, a renderer computes 3D points of each extracted 2D keypoint (i.e., 2D to 3D) using depth data obtained from the CAD model (or other technique), and features are selected and the selected features and their corresponding 3D points are stored in a memory. Then, at step S1310, all of the selected features, their corresponding descriptors, and 3D points are stored into a template as offline training data 1307 in a memory. For example, in some embodiments, each template includes 2D feature points (including the point itself [U, V] and an orientation of the 2D feature points (which is encoded by the descriptor)), 3D points and the particular view the template is associated with. As mentioned above, detailed explanations of steps S1302-S1310 are described above herein and are not further discussed in this section.

Nonetheless, generally, FIGS. 32-33 illustrate generating templates offline, meaning prior to the user losing the pose during tracking, such as prior to the start of any object detection/tracking. In this regard, when the pose is lost by the user, the offline template for the particular view where the user lost the pose can be used for re-initialization of object detection at that particular view, thereby allowing the object tracking to continue where the pose was lost (instead of having to go back to the original starting view where the user began object tracking). This can be done because there are templates which have been trained prior to the user losing the pose and/or prior to object tracking. As such, the system can re-start object tracking (as discussed herein) at the point where the user lost the pose using the offline training templates.

F-3 Object Detection and Pose Estimation

FIG. 34 illustrates a feature based object detection and pose estimation method 1400 in one embodiment. As a first step, a real-time camera image 1401 is received from the camera 60. In step S1402, keypoints are detected and descriptors are extracted from the real-time camera image 1401 and are stored in a memory (at 1403).

Steps S1404 and S1406 are the steps discussed above in FIGS. 20-23. For example, at step S1404, the IMU pose is predicted using the step S408 of FIG. 20 and the system selects training data of limited view based on the IMU predicted pose. Then, step S1406, the feature location on the current image is predicted and the descriptors are matched using keypoints and feature descriptors 1403 to get 2D to 3D point correspondences 1405, as described above with regard to FIG. 23. A pose estimation method then determines the 3D object pose 1407 at S1408 using the 2D to 3D point correspondences, as is discussed in FIG. 7. Any method of pose estimation may be used, such as a Perspective n-Point (PnP) method.

After the 3D object pose (the "second pose") is determined, re-initialization of the object detection at the particular view (the "first pose" where the user lost the view) is performed and tracking then continues at the same point where tracking was lost. This provides seamless user experience because tracking can continue without the user having to have to go back to the initial point where tracking began.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a non-transitory computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a non-transitory computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and block diagrams of methods, apparatuses (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "has," "have," "having," "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The explicit description of the present invention has been presented for purposes of illustration and description, but is not intended to be exhaustive or limited to embodiments of the invention in the form explicitly disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

What is claimed is:

1. A non-transitory computer readable medium that embodies instructions that cause one or more processors to perform a method comprising:
    (A) acquiring, from a camera, an image frame;
    (B) acquiring, from an inertial sensor, a sensor data sequence;
    (C) tracking a first pose of an object in a real scene based at least on the image frame;
    (D) deriving a sensor pose of the object, using the inertial sensor, based on the sensor data sequence, where the sensor pose is a separate pose from the first pose;
    (E) determining whether the first pose is lost such that the first pose is no longer located;
    (F) retrieving from one or more memories, or generating from a 3D model stored in one or more memories, a training template corresponding to a view that is based on the sensor pose obtained on or after the first pose is lost such that the view is a view of the object just before the object pose is no longer tracked; and
    (G) deriving a second pose of the object using the training template.

2. The non-transitory computer readable medium according to claim 1,
    wherein (D) includes
        predicting the sensor pose of the inertial sensor based on the sensor data sequence using a non-linear filter algorithm.

3. The non-transitory computer readable medium according to claim 2,
    wherein the method further comprises:
        obtaining feature positions of the object for the image frame,
    wherein (F) includes
        retrieving, from one or more memories, the training template containing information of (i) a view, (ii) template features obtained from an image of a 3D model rendered from the view and/or an image of a reference object captured from the view, and (iii) 3D points corresponding to the template features, where the 3D model and the reference object correspond to the object, and the view is based on the sensor pose obtained on or after the first pose is lost, and
    wherein (G) includes
        deriving the second pose of the object using the feature positions and the training template.

4. The non-transitory computer readable medium according to claim 3,
    wherein obtaining the 3D points in the image frame includes obtaining the feature positions of the object based on the sensor pose.

5. The non-transitory computer readable medium according to claim 3,
    wherein the method further comprises:
        retrieving, from one or more memories, a spatial relationship between the camera and the inertial sensor; and
    wherein the view is based on (i) the sensor pose obtained on or after the first pose is lost and (ii) the spatial relationship.

6. The non-transitory computer readable medium according to claim 1, wherein
    one or more training templates are stored in the one or more memories; and
    each of the one or more training templates includes feature keypoints trained prior to a user having lost the first pose.

7. The non-transitory computer readable medium according to claim 1, wherein
    a template generated from the 3D model is trained with feature keypoints in real-time after continuous tracking of the first pose stops.

8. The non-transitory computer readable medium according to claim 1, further comprising:
    tracking the object based at least on the second pose after the first pose is lost.

9. The non-transitory computer readable medium according to claim 1, wherein:
    continuous tracking is determined to not be maintained based on an error function $f$ being greater than a first predefined threshold T ($f$>T (or $f$<T)).

10. The non-transitory computer readable medium according to claim 1, wherein:
    the view that is based on the sensor pose obtained on or after the first pose is lost is a first view;
    a second view is a view at where tracking of the object started, which is located at a different location from the first view; and
    the second pose of the object is at the second view.

11. A method comprising:
    (A) acquiring, from a camera, an image frame;
    (B) acquiring, from an inertial sensor, a sensor data sequence;
    (C) tracking a first pose of an object in a real scene based at least on the image frame;
    (D) deriving a sensor pose of the object, using the inertial sensor based on the sensor data sequence, where the sensor pose is a separate pose from the first pose;
    (E) determining whether the first pose is lost such that the first pose is no longer located;
    (F) retrieving from one or more memories, or generating from a 3D model stored in one or more memories, a training template corresponding to a view that is based on the sensor pose obtained on or after the first pose is lost such that the view is a view of the object just before the object pose is no longer tracked; and
    (G) deriving a second pose of the object using the training template.

12. The method according to claim 11,
    wherein (D) includes
        predicting the sensor pose of the inertial sensor based on the sensor data sequence using a non-linear filter algorithm.

13. The method according to claim 12,
wherein the method further comprises:
  obtaining feature positions of the object for the image frame,
wherein (F) includes
  retrieving, from one or more memories, the training template containing information of (i) a view, (ii) template features obtained from an image of a 3D model rendered from the view and/or an image of a reference object captured from the view, and (iii) 3D points corresponding to the template features, where the 3D model and the reference object correspond to the object, and the view is based on the sensor pose obtained on or after the first pose is lost, and
wherein (G) includes
deriving the second pose of the object using the feature positions and the training template.

14. The method according to claim 13,
wherein obtaining the 3D points in the image frame includes obtaining the feature positions of the object based on the sensor pose.

15. The method according to claim 13,
wherein the method further comprises:
  retrieving, from one or more memories, a spatial relationship between the camera and the inertial sensor; and
wherein the view is based on (i) the sensor pose obtained on or after the first pose is lost and (ii) the spatial relationship.

16. A head-mounted display device comprising:
a camera;
an inertial sensor fixed or adjustably fixed with respect to the camera with a spatial relationship; and
a processor configured for:
  (A) acquiring, from the camera, an image frame;
  (B) acquiring, from the inertial sensor, a sensor data sequence;
  (C) tracking a first pose of an object in a real scene based at least on the image frame;
  (D) deriving a sensor pose of the object, using the inertial sensor based on the sensor data sequence, where the sensor pose is a separate pose from the first pose;
  (E) determining whether the first pose is lost such that the first pose is no longer located;
  (F) retrieving from one or more memories, or generating from a 3D model stored in one or more memories, a training template corresponding to a view that is based on the sensor pose obtained on or after the first pose is lost such that the view is a view of the object just before the object pose is no longer tracked; and
  (G) deriving a second pose of the object using the training template.

17. The head-mounted display device according to claim 16,
wherein (D) includes
  predicting the sensor pose of the inertial sensor based on the sensor data sequence using a non-linear filter algorithm.

18. The head-mounted display device according to claim 17,
wherein the method further comprises:
  obtaining feature positions of the object for the image frame,
wherein (F) includes
  retrieving, from one or more memories, the training template containing information of (i) a view, (ii) template features obtained from an image of a 3D model rendered from the view and/or an image of a reference object captured from the view, and (iii) 3D points corresponding to the template features, where the 3D model and the reference object correspond to the object, and the view is based on the sensor pose obtained on or after the first pose is lost, and
wherein (G) includes
deriving the second pose of the object using the feature positions and the training template.

19. The head-mounted display device according to claim 18,
wherein obtaining the 3D points in the image frame includes obtaining the feature positions of the object based on the sensor pose.

20. The head-mounted display device according to claim 18,
wherein the method further comprises:
  retrieving, from one or more memories, a spatial relationship between the camera and the inertial sensor; and
wherein the view is based on (i) the sensor pose obtained on or after the first pose is lost and (ii) the spatial relationship.

* * * * *